(12) United States Patent
Lute et al.

(10) Patent No.: US 8,998,078 B2
(45) Date of Patent: *Apr. 7, 2015

(54) AUTOMATED BANKING MACHINE WITH SLIDE MOUNTED DEVICES

(71) Applicant: Diebold Self-Service Systems, division of Diebold, Incorporated, North Canton, OH (US)

(72) Inventors: Richard C. Lute, Mogadore, OH (US); Mark A. Douglass, North Canton, OH (US); Roy Mleziva, Canton, OH (US); Shawn Griggy, North Canton, OH (US)

(73) Assignee: Diebold Self-Service Systems, division of Diebold, Incorporated, North Canton, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/072,257

(22) Filed: Nov. 5, 2013

(65) Prior Publication Data

US 2014/0063749 A1    Mar. 6, 2014

Related U.S. Application Data

(63) Continuation of application No. 13/419,932, filed on Mar. 14, 2012, now Pat. No. 8,573,482.

(60) Provisional application No. 61/456,240, filed on Mar. 16, 2011.

(51) Int. Cl.
*G07F 19/00* (2006.01)
*H05K 7/14* (2006.01)

(52) U.S. Cl.
CPC ................ *H05K 7/14* (2013.01); *G07F 19/205* (2013.01); *Y10S 902/08* (2013.01); *Y10S 902/09* (2013.01); *Y10S 902/10* (2013.01); *Y10S 902/11* (2013.01); *Y10S 902/12* (2013.01); *Y10S 902/13* (2013.01); *Y10S 902/14* (2013.01); *Y10S 902/15* (2013.01)

(58) Field of Classification Search
USPC .................................. 235/379, 486
See application file for complete search history.

(56) References Cited

U.S. PATENT DOCUMENTS

| | | | | |
|---|---|---|---|---|
| 6,082,616 | A * | 7/2000 | Lewis et al. ................... | 235/379 |
| 6,953,150 | B2 * | 10/2005 | Shepley et al. ............... | 235/379 |
| 8,573,482 | B1 * | 11/2013 | Lute et al. ..................... | 235/379 |

* cited by examiner

*Primary Examiner* — Kristy A Haupt
(74) *Attorney, Agent, or Firm* — Diebold, Incorporated

(57) ABSTRACT

An apparatus including an automated banking machine is operative to cause financial transfers responsive at least in part to data read from data bearing records. The machine includes a card reader that is operative to read card data usable to identify at least one of a user of the machine and a financial account. A computer associated with the machine is operative to cause card data to be read through operation of the card reader, and to cause a determination to be made that read card data corresponds to a financial account authorized to conduct a transaction through the machine. The computer is operative responsive at least in part to the determination to cause the financial account to be at least one of assessed and credited with a value associated with a financial transaction. Transaction function devices of the machine are supported through slides that can be configured in different ways to facilitate mounting of devices within the machine.

17 Claims, 42 Drawing Sheets

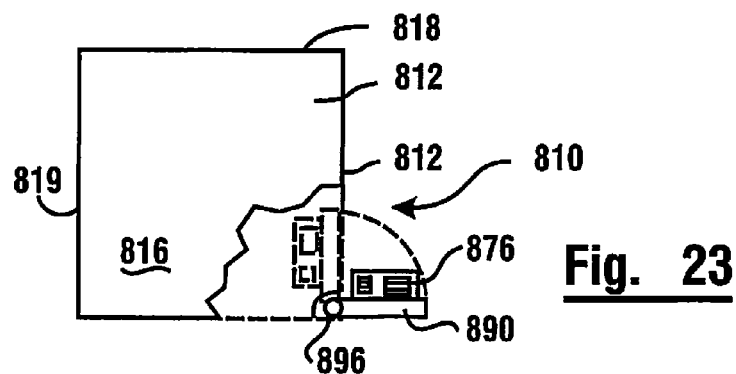
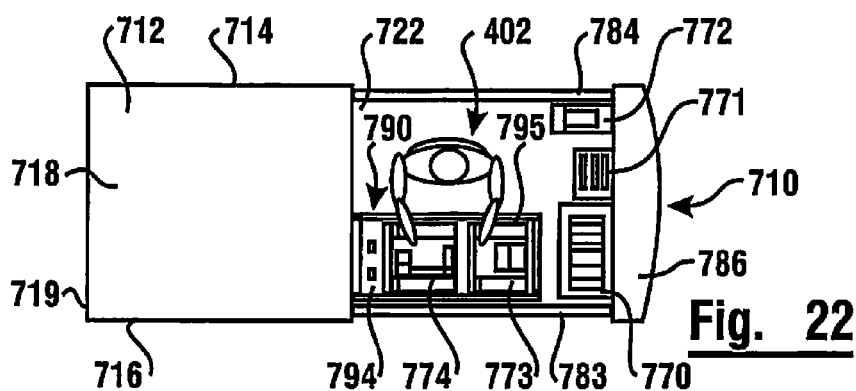
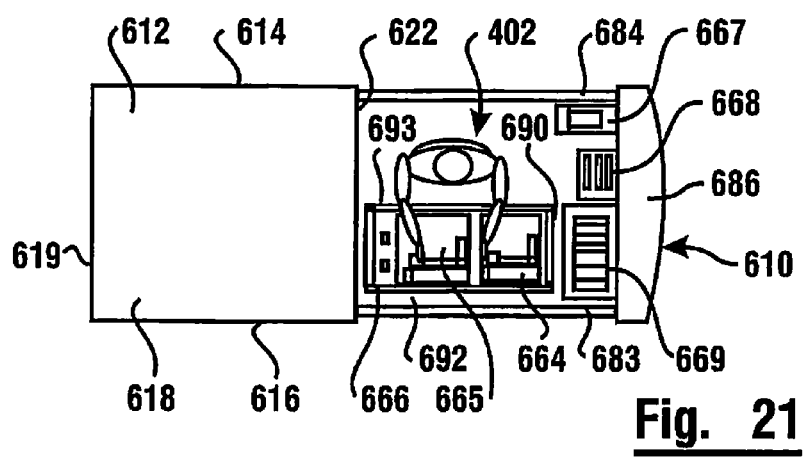

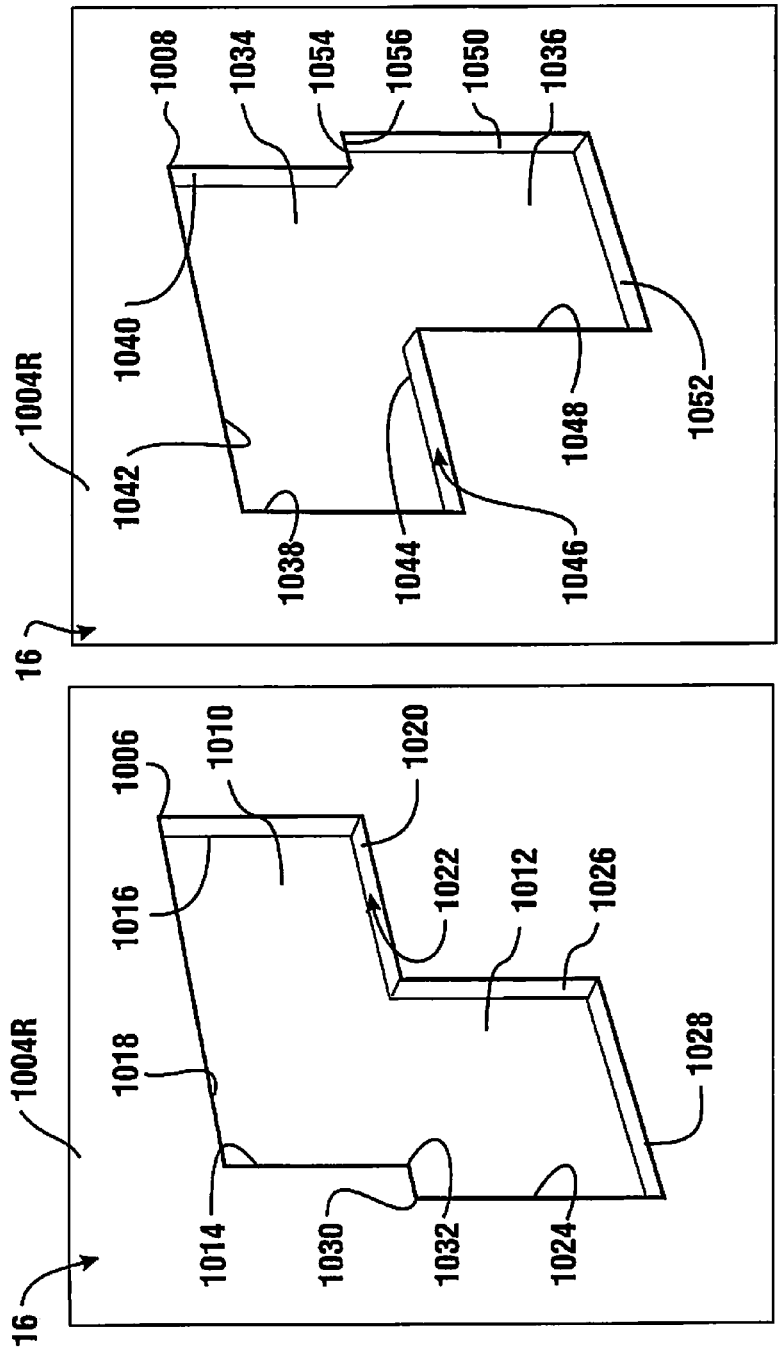

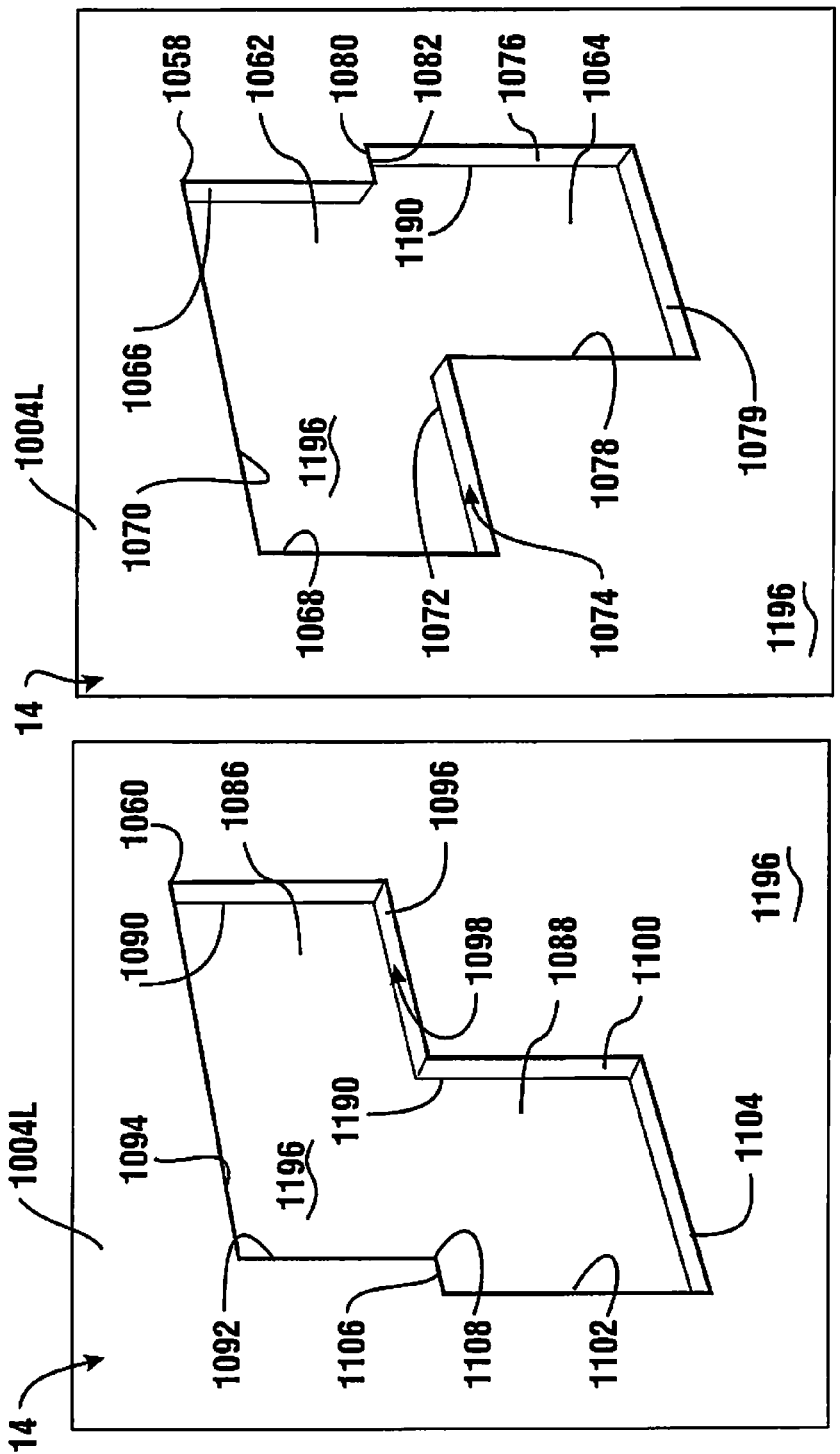

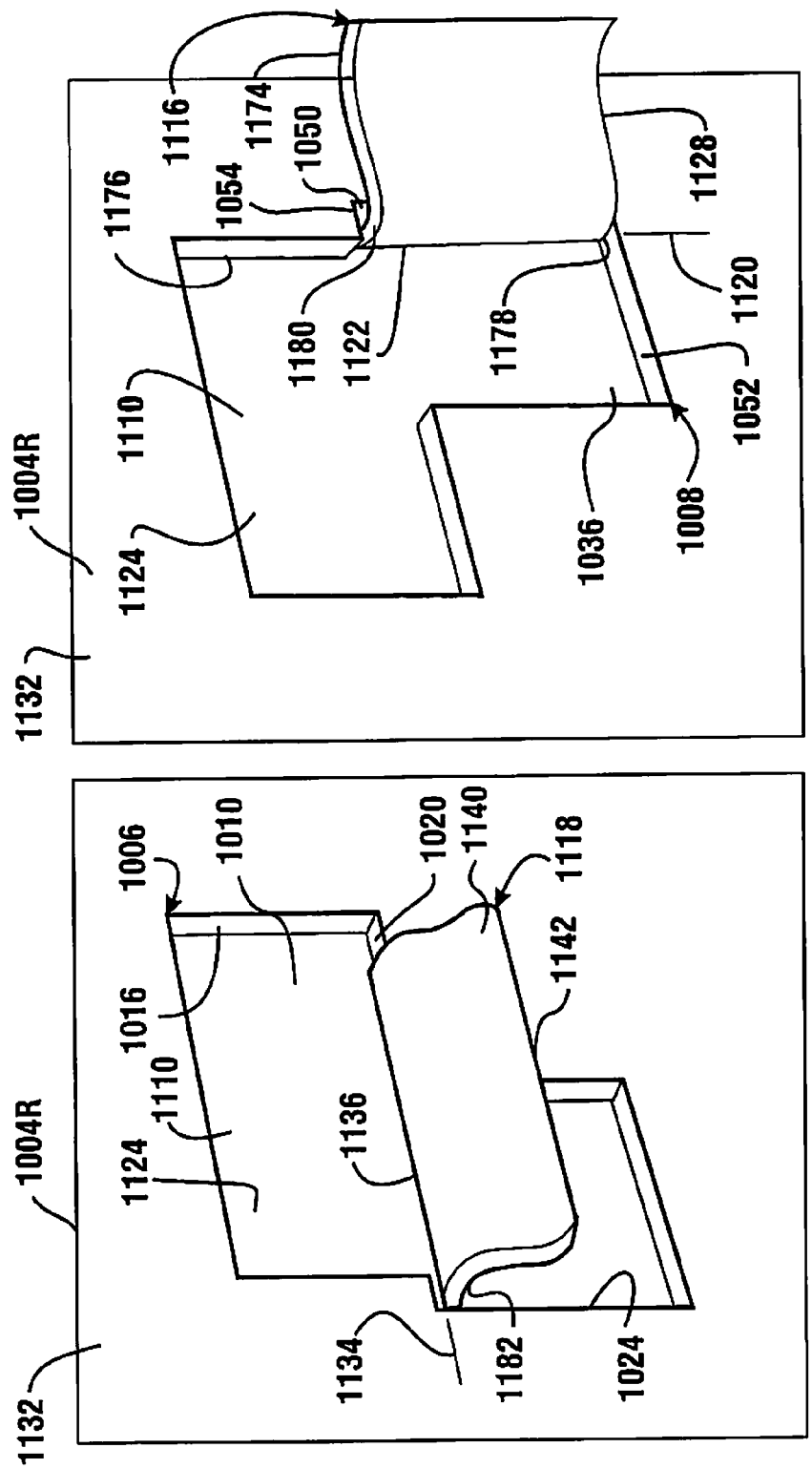

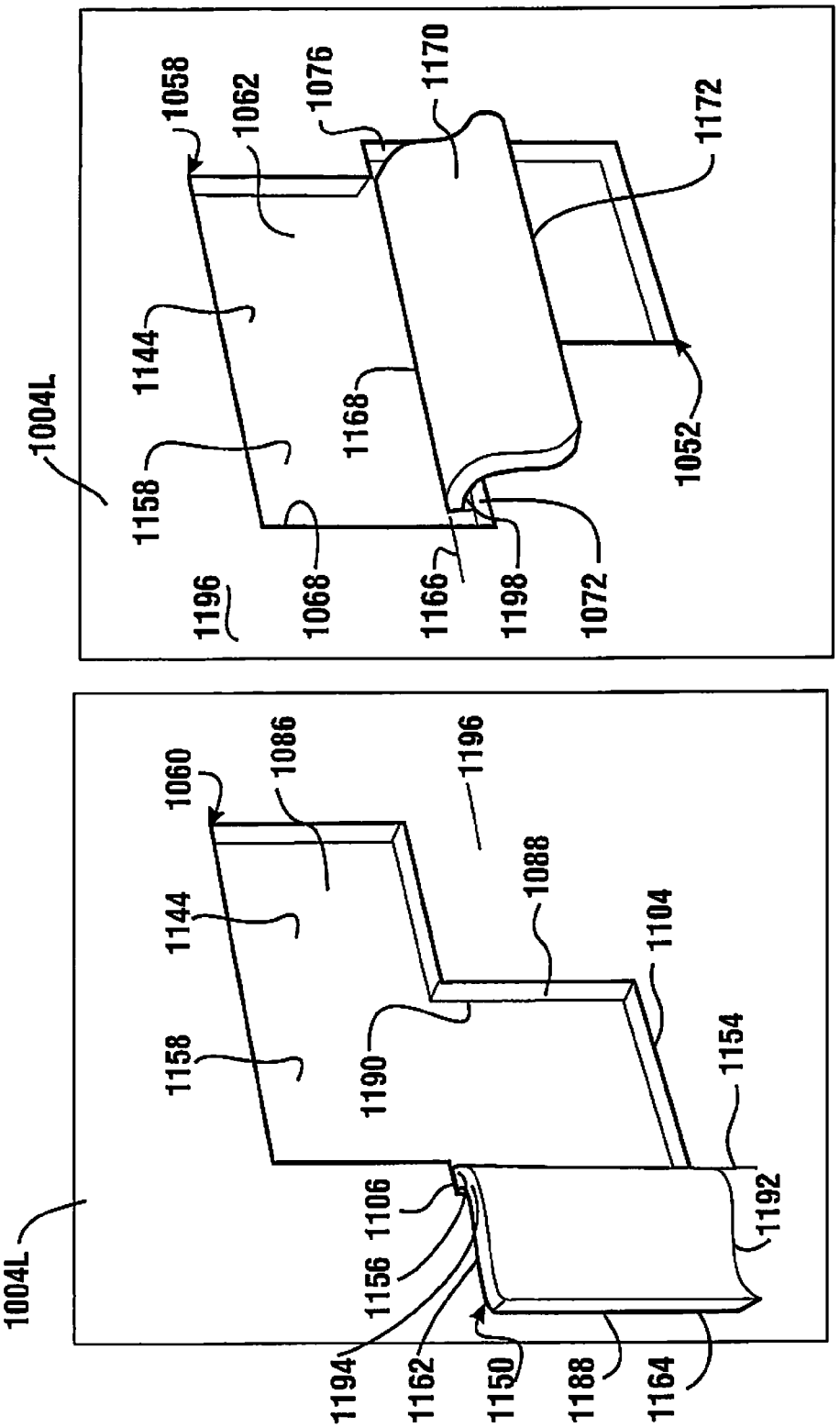

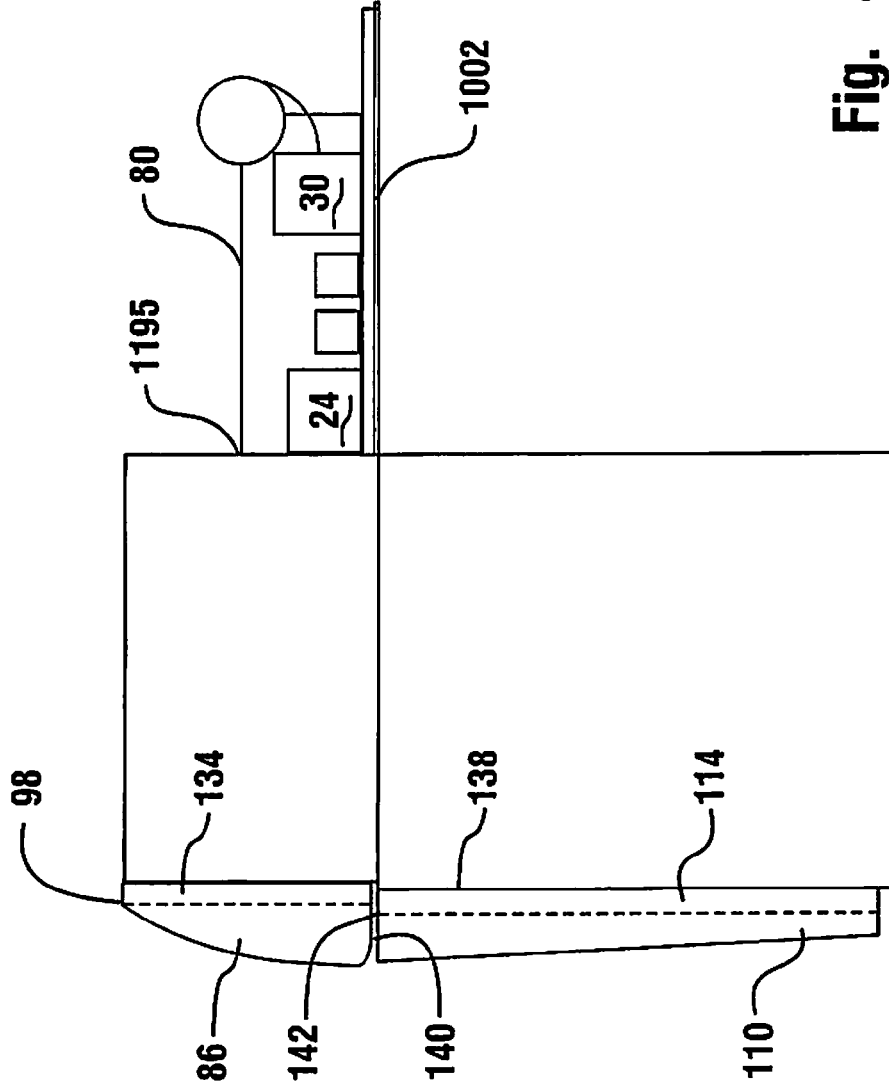

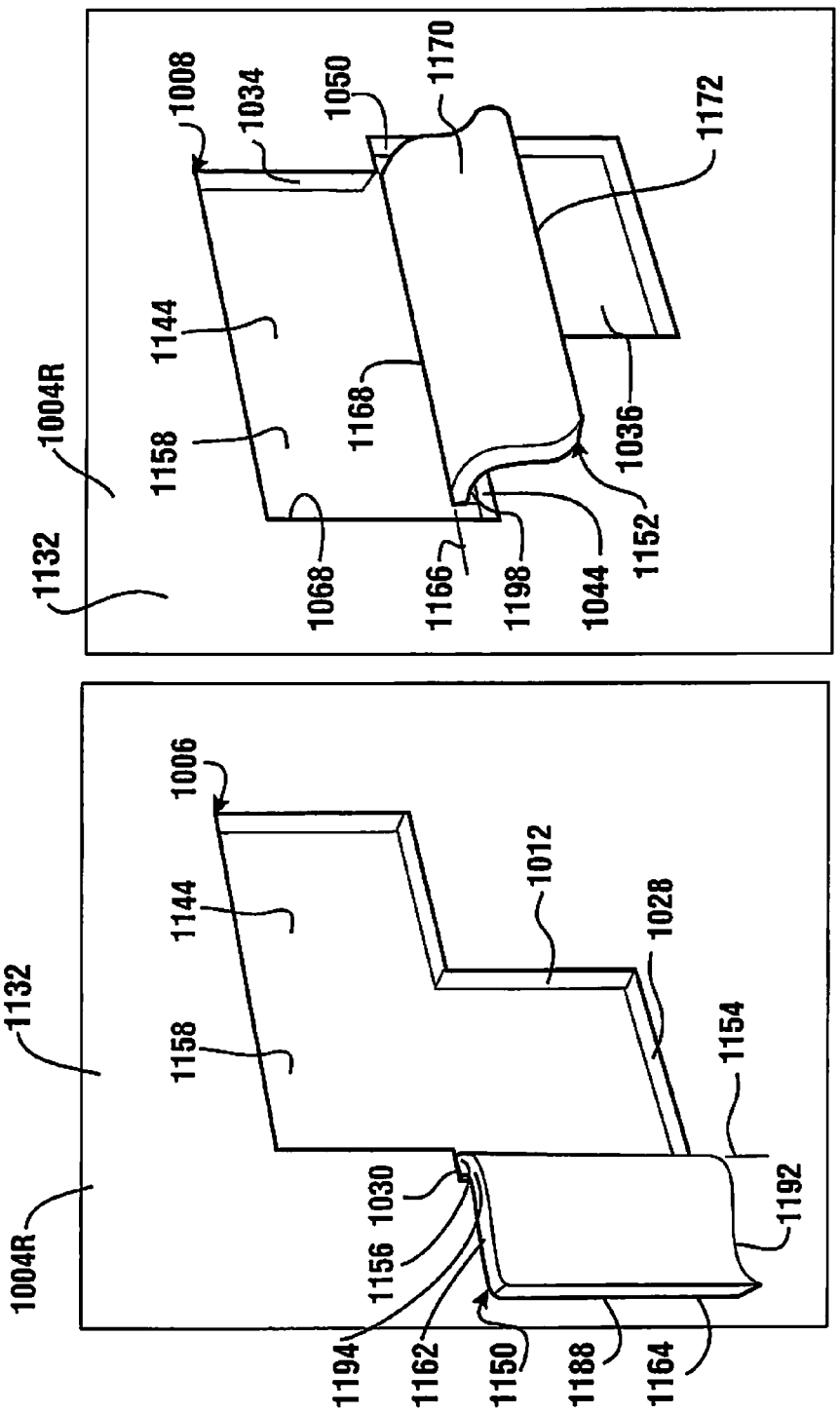

AUTOMATED BANKING MACHINE WITH SLIDE MOUNTED DEVICES

This application is a continuation of U.S. patent application Ser. No. 13/419,932 filed Mar. 14, 2012, and claims benefit pursuant to 35 U.S.C. §119(e) of Provisional Application 61/456,240 filed Mar. 16, 2011, the disclosure of each is incorporated herein by reference in its entirety.

TECHNICAL FIELD

This invention relates to automated banking machines that operate responsive to data read from user cards and which may be classified in U.S. Class 235, Subclass 379.

BACKGROUND OF THE INVENTION

Automated banking machines may include a card reader that operates to read data from a bearer record such as a user card. Automated banking machines may operate to cause the data read from the card to be compared with other computer stored data related to the bearer or their financial accounts. The machine operates at least in part in response to the comparison determining that the bearer record corresponds to an authorized user and/or an authorized financial account, to carry out at least one transaction which may be operative to transfer value to or from at least one financial account. A record of the transaction is often printed through operation of the automated banking machine and provided to the user. Automated banking machines may be used to carry out transactions such as dispensing cash, the making of deposits, the transfer of funds between accounts and account balance inquiries. The types of banking transactions that may be carried out are determined by the capabilities of the particular banking machine and system, as well as the programming of the institution operating the machine.

Other types of automated banking machines may be operated by merchants to carry out commercial transactions. These transactions may include, for example, the acceptance of deposit bags, the receipt of checks or other financial instruments, the dispensing of rolled coin, or other transactions required by merchants. Still other types of automated banking machines may be used by service providers in a transaction environment such as at a bank to carry out financial transactions. Such transactions may include for example, the counting and storage of currency notes or other financial instrument sheets, and other types of transactions. For purposes of this disclosure an automated banking machine, automated transaction machine or an automated teller machine (ATM) shall be deemed to include any machine that may be used to automatically carry out transactions involving transfers of value.

Automated banking machines may benefit from improvements.

OBJECTS OF EXEMPLARY EMBODIMENTS

It is an object of an exemplary embodiment to provide a banking system apparatus that is operated responsive to data bearing records.

It is an object of an exemplary embodiment to provide an automated banking machine.

It is a further object of an exemplary embodiment to provide an automated banking machine that has an attractive appearance.

It is a further object of an exemplary embodiment to provide an automated banking machine which is more readily serviced.

It is a further object of an exemplary embodiment to provide an automated banking machine which is more readily manufactured.

It is a further object of an exemplary embodiment to provide a method for more efficiently manufacturing an automated banking machine.

It is a further object of an exemplary embodiment to provide a method for servicing an automated banking machine which requires less space for servicing.

It is a further object of an exemplary embodiment to provide a method for servicing an automated banking machine which provides improved access for servicing of internal components.

It is a further object of an exemplary embodiment to provide a method for servicing an automated banking machine which provides more efficient servicing of internal components.

Further objects of exemplary embodiments will be made apparent in the following Detailed Description of Exemplary Embodiments and the appended claims.

The foregoing objects are accomplished in an exemplary embodiment by an automated banking machine which includes a top housing bounding an interior area. The top housing defines a front opening to the interior area and may define a rear opening into the interior area. The top housing is mounted above a secure enclosure which is alternatively referred to herein as a chest portion or safe. The top housing may further include at least one wall, the at least one wall formed to include one or more housing vents operative to enable air to pass therethrough. Such housing vents enable the movement of air, for example, to assist in removing heat generated by components within the housing.

The top housing houses upper banking machine components which may include, for example, all or portions of a display, the card reader, a receipt printer, a keypad, a camera, controllers, processors, including computer processors, actuators, sensors, and other devices. As used herein "keypad" means input keys whether arranged in a keypad arrangement, keyboard arrangement, or otherwise, and the designations are interchangeable unless expressly identified as being used in a restricted manner. The banking machine components may be further enclosed within a case. The case may be formed to include one or more component case vents operative to enable air to pass therethrough. The processor, for example, may be further enclosed in a processor case with processor case vents. Such processor case vents enable the movement of air, for example, to assist in removing heat generated by processor components. The chest houses lower banking machine components which may include, for example, all or portions of a currency dispenser mechanism, a currency recycler, a secure deposit holding container and other devices.

In an example embodiment, an apparatus is provided that includes an automated banking machine that is operative to cause financial transfers responsive at least in part to date read from data bearing records. The automated banking machine includes a card reader that is operative to read card data usable to identify at least one of a user of the machine and a financial account. The machine also includes a housing bounding an interior area. At least one computer including at least one processor is associated with the machine. The computer is in operative connection with the card reader. The computer is operative to cause card data to be read through operation of the card reader and to cause a determination to be made that the card data corresponds to an authorized financial account. Responsive at least in part to the determinations, the at least one computer causes the account to be assessed a value associated with a financial transaction. The machine further includes a device support in operatively supported connection with the housing and moveable between a first position wherein the device support is substantially within the interior area of the housing and a second position wherein at least a portion of the device support extends outside of the housing. The machine also includes at least one slide in operative connection with the device support and the housing. The at least one slide is operative to enable the device support to move between the first position and the second position. One of the housing and the at least one slide includes a first tab and the other one of the housing and the at least one slide includes a first slot. The first tab and the first slot are configured to releasably engage each other. The at least one slide and the housing are configured such that each slide may be mounted to the housing in a first configuration and a second configuration. The first configuration enables the device support to be moved between the first and second positions through an opening at a first side of the housing. The second configuration enables the support to be moved between the first and second position through an opening at a second side of the housing opposed of the first side.

In an example embodiment, the first tab includes a proximal portion and a distal portion. The proximal portion is configured to extend through the first slot and the distal portion is configured to extend in a first direction when the slide is mounted to the housing. The first direction is the direction of movement of the device support from the second position toward the first position.

In a further exemplary embodiment, a method performed in connection with an automated banking machine includes moving a device support in operatively supported connection with a housing of an automated banking machine from a first position wherein the device support substantially within an interior of the housing of the machine to a second position wherein at least a portion of the device support extends through a housing opening. The exemplary method further includes disengaging at least one slide from operative engagement with the housing by moving the slide relative to the housing in a first direction to cause the first tab and the first slot to be disengaged from holding engagement.

Exemplary embodiments may allow ready access to the banking machine components for servicing, as well as simplifying the manufacturing and/or assembly process. The principles described may be applied to numerous automated banking machine configurations.

BRIEF DESCRIPTION OF DRAWINGS

FIG. 21 is a plan view of an automated banking machine of an exemplary embodiment.

FIG. 22 is a plan view of an automated banking machine of an exemplary embodiment.

FIG. 23 is an elevation view, partly in phantom, of a portion of an automated banking machine of an exemplary embodiment.

FIG. 38 is an enlarged front and right side isometric view of the portion of the right bracket as indicated in FIG. 37.

FIG. 39 is an enlarged front and right side isometric view of the portion of the right bracket as indicated in FIG. 37.

FIGS. 40 and 41 are rear and left side isometric views of portions of the left bracket of the exemplary automated banking machine of FIG. 35.

FIG. 42 is an enlarged front and right side isometric view of the portion of the exemplary automated banking machine as indicated in FIG. 36.

FIG. 43 is an enlarged front and right side isometric view of the portion of the exemplary automated banking machine as indicated in FIG. 36.

FIGS. 44 and 45 are rear and left side isometric views of portions of the left bracket with the second slide mounted thereto of the exemplary automated banking machine of FIG. 35.

FIG. 46 is a side schematic view of the exemplary automated banking machine illustrating the rollout tray in the extended position of a rear-loaded configuration.

FIG. 49 is an enlarged front and right side isometric view of the portion of the right bracket as indicated in FIG. 47.

FIG. 50 is an enlarged front and right side isometric view of the portion of the right bracket as indicated in FIG. 47.

DETAILED DESCRIPTION OF EXEMPLARY EMBODIMENTS

Figure 1:
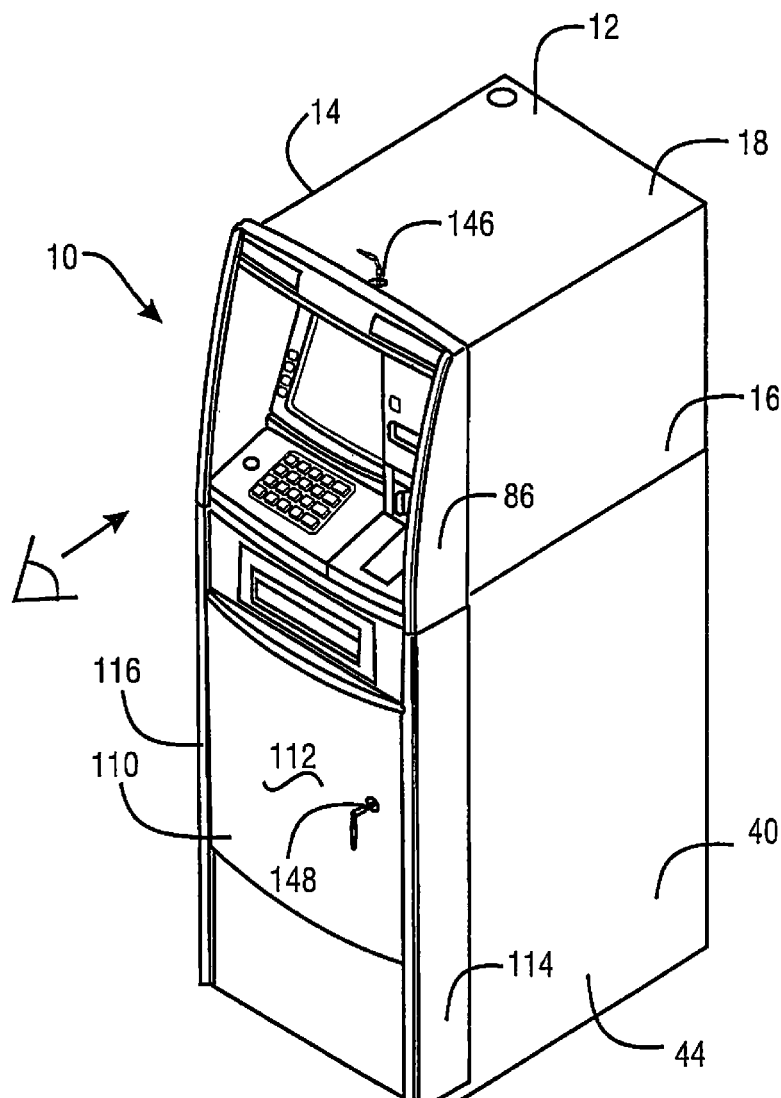
FIG. 1 is an isometric view of an automated banking machine of an exemplary embodiment.
Figure 2:
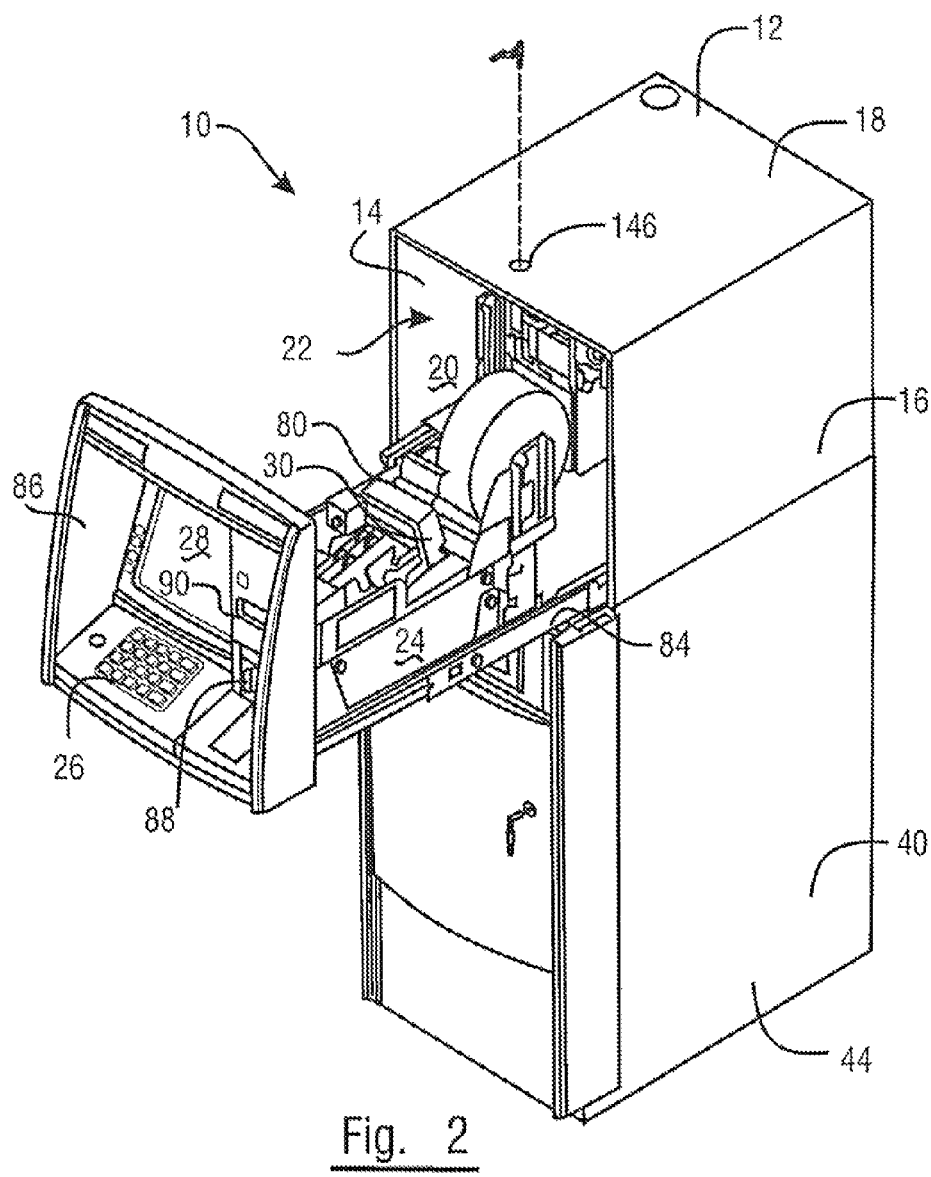
FIG. 2 is an isometric view of the automated banking machine of FIG. 1 with a rollout tray extended.

Referring now to the drawings, and particularly to FIGS. 1-2, there is shown therein an automated banking machine of a first exemplary embodiment, generally indicated 10. In this exemplary embodiment, automated banking machine 10 is an automated teller machine (ATM). Machine 10 includes a top housing 12 having side walls 14 and 16, and top wall 18. Housing 12 encloses an interior area indicated 20. Housing 12 has a front opening 22. In this exemplary embodiment, the rear of housing 12 is closed by a rear wall 19, shown in FIG. 7. However, in other embodiments, the rear of housing 12 may be accessible through an access door or similar device. Top housing 12 is used to house certain banking machine components such as input and output devices.

Figure 3:
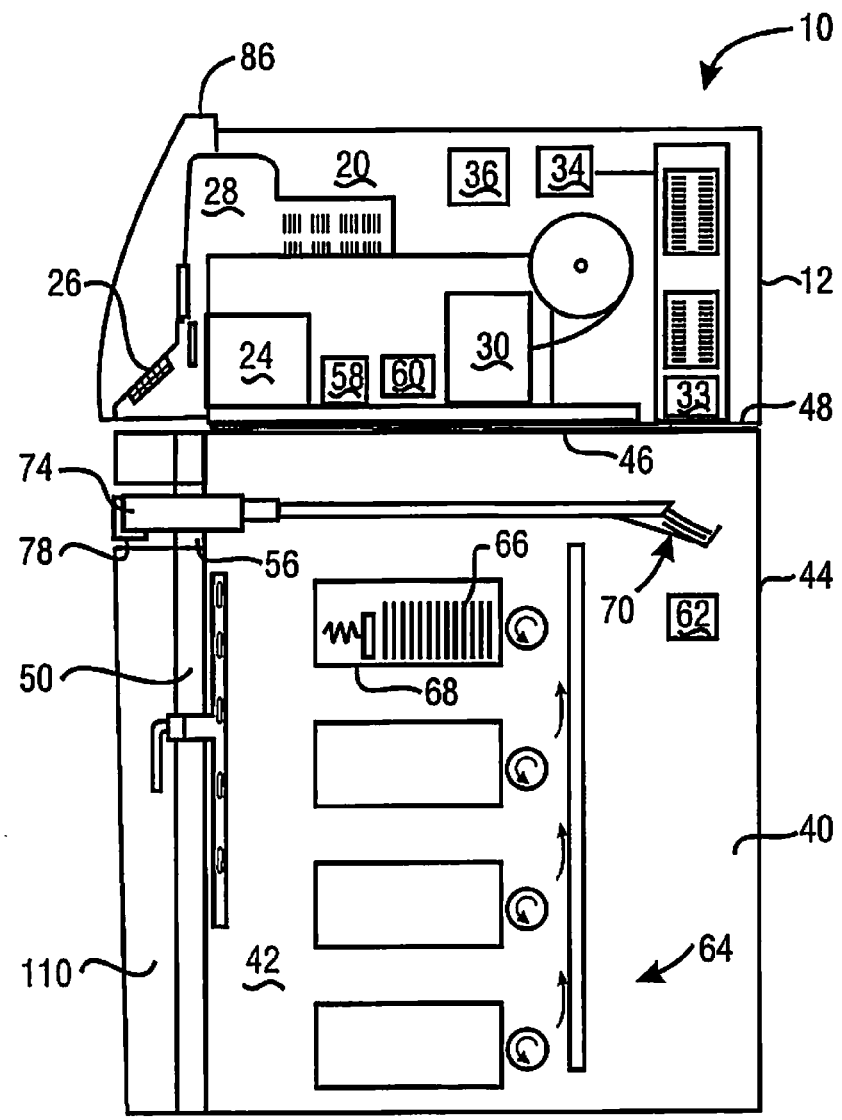
FIG. 3 is a side schematic view of an automated banking machine illustrating various banking machine components.

With reference to FIG. 3, in this exemplary embodiment the input devices include a card reader schematically indicated 24. Card reader 24 is operative to read a customer's card which includes indicia thereon. The indicia may correspond to information about the customer and/or information about a customer's financial account, such as the customer's account number. In some embodiments the card reader 24 may be a card reader adapted for reading magnetic stripe cards and/or so called "smart cards" which include a programmable memory. Other embodiments may read data from cards wirelessly such as radio frequency identification (RFID) cards. Exemplary embodiments may include features of the type discussed in U.S. Pat. No. 7,118,031 the disclosure of which is incorporated herein by reference in its entirety. Another input device in the exemplary embodiment includes input keys 26. Input keys 26 may in some embodiments, be arranged in a keypad or keyboard. Input keys 26 may alternately or in addition include function keys or other types of devices for receiving manual inputs. It should be understood that in various embodiments other types of input devices may be used such as biometric readers, speech or voice recognition devices, inductance type readers, infrared (IR) type readers, and other devices capable of communicating with a person, article or computing device, radio frequency type readers and other types of devices which are capable of receiving information that identifies a customer and/or their account.

The exemplary embodiment of machine 10 also includes output devices providing outputs to the customer. In the exemplary embodiment machine 10 includes a display 28. Display 28 may include an LCD, CRT or other type display that is capable of providing visible indicia to a customer. In other embodiments output devices may include devices such as audio speakers, radio frequency (RF) transmitters, IR transmitters or other types of devices that are capable of providing outputs which may be perceived by a user either directly or through use of a computing device, article or machine. It should be understood that embodiments may also include combined input and output devices such as a touch screen display which is capable of providing outputs to a user as well as receiving inputs.

The exemplary embodiment of the automated banking machine 10 also includes a receipt printer schematically indicated 30. The receipt printer is operative to print receipts for users reflecting transactions conducted at the machine. Embodiments may also include other types of printing mechanisms such as statement printer mechanisms, ticket printing mechanisms, check printing mechanisms and other devices that operate to apply indicia to media in the course of performing transactions carried out with the machine.

Automated banking machine 10 further includes one or more processors schematically indicated 33. Processor 33, alternately referred to as a computer or a controller, is in operative connection with at least one memory or data store which is schematically indicated 34. The processor 33 is operative to carry out programmed instructions to achieve operation of the machine in accomplishing transactions. The processor 33 is in operative connection with a plurality of the transaction function devices included in the machine.

The exemplary embodiment includes at least one communications device 36. The communications device 36 may be one or more of a plurality of types of devices that enable the machine to communicate with other systems and devices for purposes of carrying out transactions. For example, communications device 36 may include a modem for communicating messages over a data line or wireless network, with one or more other computers that operate to transfer data representative of the transfer of funds in response to transactions conducted at the machine. Alternately the communications device 36 may include various types of network interfaces, line drivers or other devices suitable to enable communication between the machine 10 and other computers and systems. Exemplary embodiments may include features like those disclosed in U.S. Pat. No. 7,266,526 the disclosure of which is incorporated herein by reference in its entirety.

Machine 10 further includes a safe or chest 40 enclosing a secure area 42. Secure area 42 is used in the exemplary embodiment to house critical components and valuable documents. Specifically in the exemplary embodiment secure area 42 is used for housing currency, currency dispensers, currency stackers, and other banking machine components. For purposes of this disclosure a cash dispenser or a currency dispenser shall include any mechanism that makes currency stored within the machine accessible from outside the machine. Cash dispensers may include features of the type disclosed in U.S. Pat. Nos. 7,261,236; 7,240,829; 7,114,006; 7,140,607 and 6,945,526 the disclosures of each of which are incorporated herein by reference in their entirety. Chest 40 includes a chest housing 44 including a top wall 46 having an upper surface 48 outside of the secure area 42. Top housing 12 is supported on the chest 40 such that the secure area 42 is generally below the interior area 20.

Chest 40 also includes a chest door 50 that is moveably mounted in supporting connection with the housing. Chest door 50, shown in the closed position in FIG. 4 and in an open condition in FIG. 5, is generally closed to secure the contents of the chest 40. In this exemplary embodiment, the chest door 50 is used to close a first opening 52 at a first end 54 of the chest housing 44. In other embodiments the chest opening and door may have other configurations. In the exemplary embodiment, chest door 50 includes a first device opening 56 therethrough and cooperates with mechanisms inside and outside the chest for passing currency or other items between a customer and devices located inside the chest 40.

Referring again to FIG. 3, machine 10 also includes a plurality of sensing devices for sensing various conditions in the machine. These various sensing devices are represented schematically by component 58 for simplicity and to facilitate understanding. It should be understood that a plurality of sensing devices is provided in the machine for sensing and indicating to the processor 33 the status of devices within the machine.

Exemplary automated banking machine 10 further includes a plurality of actuators schematically indicated 60 and 62. The actuators may comprise a plurality of devices such as motors, solenoids, cylinders, rotary actuators and other types of devices that are operated responsive to the processor 33. It should be understood that numerous components within the automated banking machine are operated by actuators positioned in operative connection therewith. Actuators 60 and 62 are shown to schematically represent such actuators in the machine and to facilitate understanding.

Machine 10 further comprises at least one currency dispenser mechanism 64 housed in secure area 42. The currency dispensing mechanism 64 is operative responsive to the processor 33 to pick currency sheets from a stack of sheets 66 housed in one or more canisters 68. The picked currency sheets may be arranged by a currency stacker mechanism 70 for presentation through a delivery mechanism 74 which operates to present a stack of note or other documents to a customer.

When chest door 50 is in the closed position, at least an end portion of a sheet delivery mechanism 74 extends through first opening 56 in the chest door 50. In response to operation of the processor 33, when a desired number of currency sheets have been collected in a stack, the stack is moved through delivery mechanism 74.

As the sheets are moved through delivery mechanism 74 toward the first opening 56, the controller 32 operates a suitable actuating device to operate a gate 78 so as to enable the stack of sheets to pass outward through the opening. As a result the user is enabled to receive the sheets from the machine. After a user is sensed as having removed the stack from the opening, the controller may operate to close the gate 78 so as to minimize the risk of tampering with the machine.

With reference to FIG. 2, in this exemplary embodiment, machine 10 further includes a rollout tray 80. Rollout tray 80 is moveably mounted in supporting connection with slides 84. The slides 84 enable movement of the rollout tray 80 between the extended position shown in FIG. 2 and a retracted position within the interior area 20 of the top housing 12. Rollout tray 80 in the exemplary embodiment may be similar to that shown in U.S. Pat. No. 6,082,616, the disclosure of which is incorporated by reference as if fully rewritten herein.

Rollout tray 80 may have several upper banking machine components supported thereon including card reader 24, input keys 26, display 28, receipt printer 30, and other components as appropriate for the particular machine 10.

This exemplary embodiment further includes an upper fascia 86 in supporting connection with rollout tray 80. The upper fascia 86 may include user interface openings such as a card opening 88 through which a customer operating the machine 10 may insert a credit, debit or other card, or a receipt delivery slot 90 through which printed transactions receipts may be delivered to the customer. Rollout tray 80 moveably supports upper fascia 86 relative to the top housing 12 so that upper fascia 86 is movable between a first position covering the front opening and a second position in which the upper fascia is disposed from the front opening 22.

As illustrated in FIG. 1, in the operative condition of machine 10, the rollout tray 80 is retracted into the interior area 20 of the housing 12. Upper fascia 86 operates to close front opening 22 and provide an attractive appearance for machine 10, while allowing a customer to input information and receive outputs from machine 10.

Figure 6:
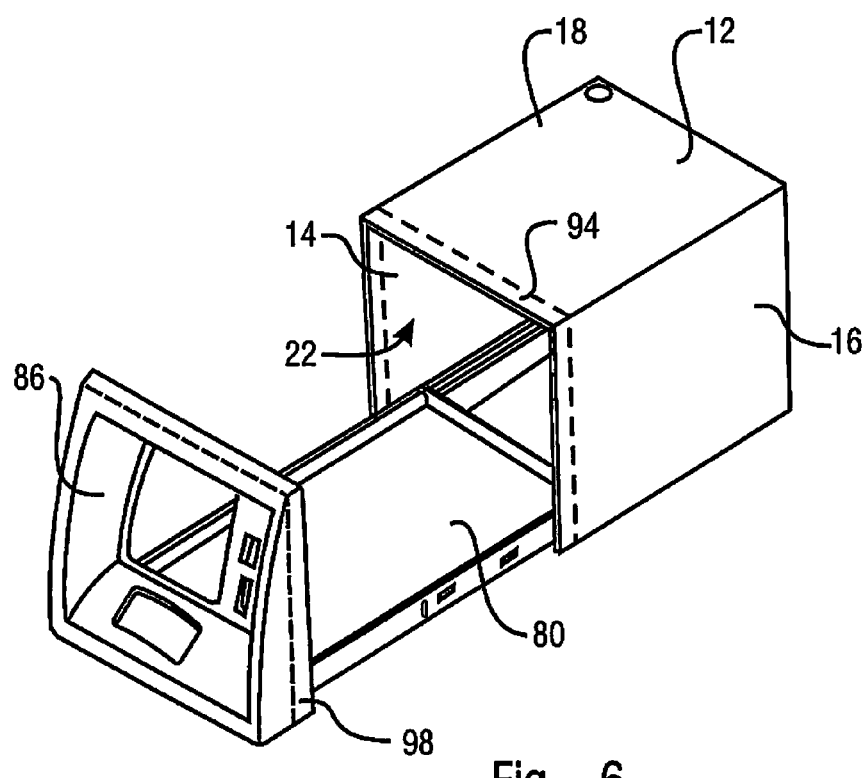
FIG. 6 is an isometric view of a top housing for an automated banking machine supporting a rollout tray in an extended position.

With reference to FIG. 6, in this exemplary embodiment, the forward-most parts of side walls 14 and 16 and top wall 18 of housing 12 define a forward region 94, shown in dashed lines, bounding the front opening 22. In this exemplary embodiment, upper fascia 86 includes a rearwardly extending portion 98, also shown in dashed lines. Rearwardly extending portion 98 is dimensioned to overlie in generally surrounding relation, the forward region 94 when rollout tray 80 is retracted and upper fascia 86 is in the first position. In some embodiments the rearwardly extending portion may be contoured or tapered so as to extend further inwardly with increasing proximity to the front of the fascia. Such tapered control may engage and help to close and/or align the fascia and the top housing 12.

Figure 7:
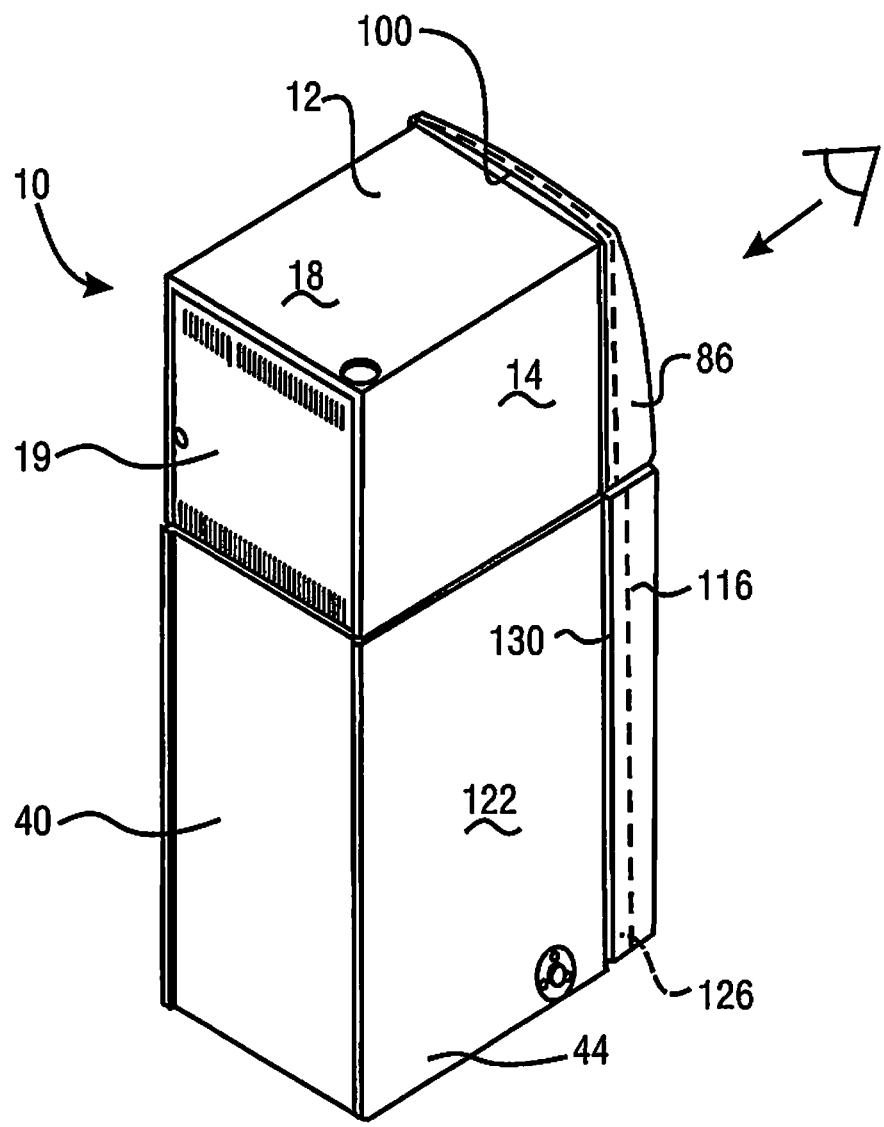
FIG. 7 is an isometric rear view of the automated banking machine of FIG. 1.

With reference to FIG. 7, when machine 10 is viewed from the rear, there may be a first gap 100 separating the rearwardly extending portion 98 of upper fascia 86 from the top housing 12. In some embodiments it may be desirable that first gap 100 be minimal to prevent unauthorized access to interior area 20. First gap 100 in the exemplary embodiment is not visible when machine 10 is viewed from the front.

In this exemplary embodiment, the upper fascia 86 is formed of a plastic material and the top housing 12 is formed of sheet metal. Alternately, the extending portion 98 or forward portion 94 shown in FIG. 6, or both, may include resilient materials to provide for engagement and sealing of the housing and the fascia in the closed position. However, other materials may be chosen, and these approaches are exemplary.

Figure 4:
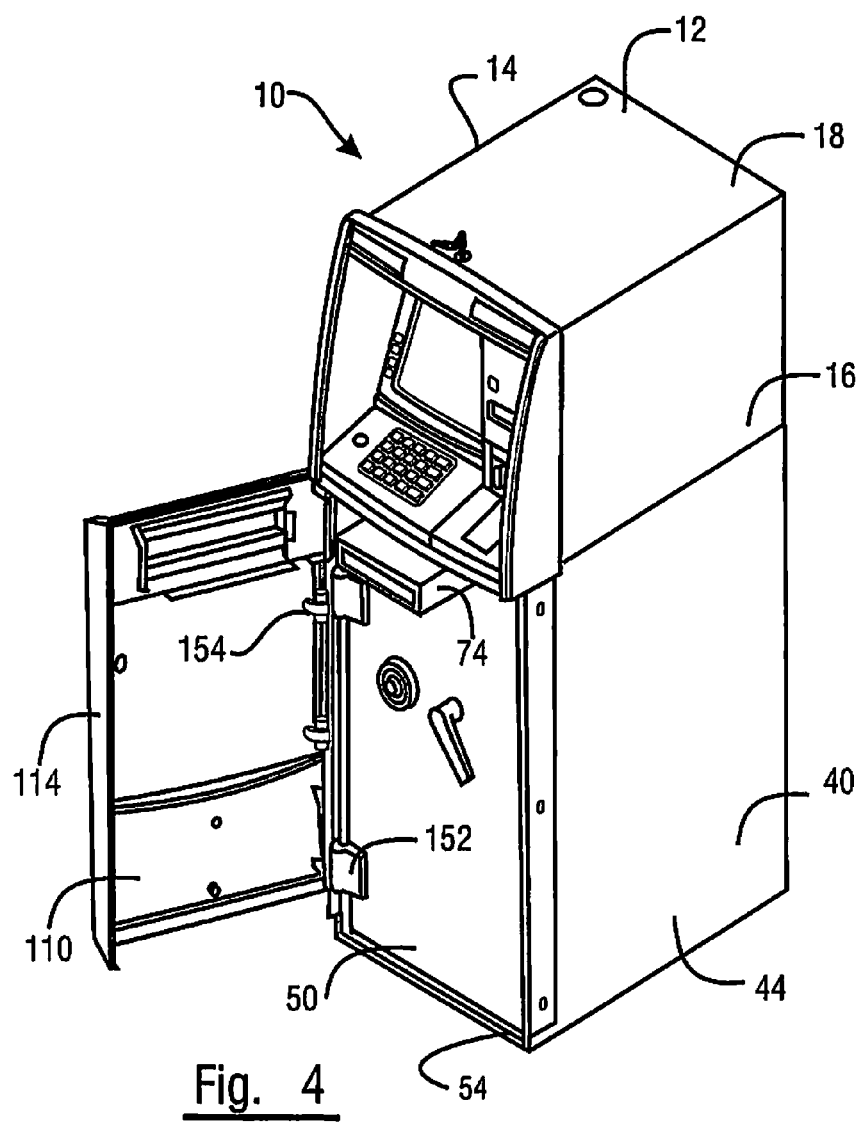
FIG. 4 is an isometric view of the automated banking machine of FIG. 1 with a lower fascia in an accessible position.
Figure 5:
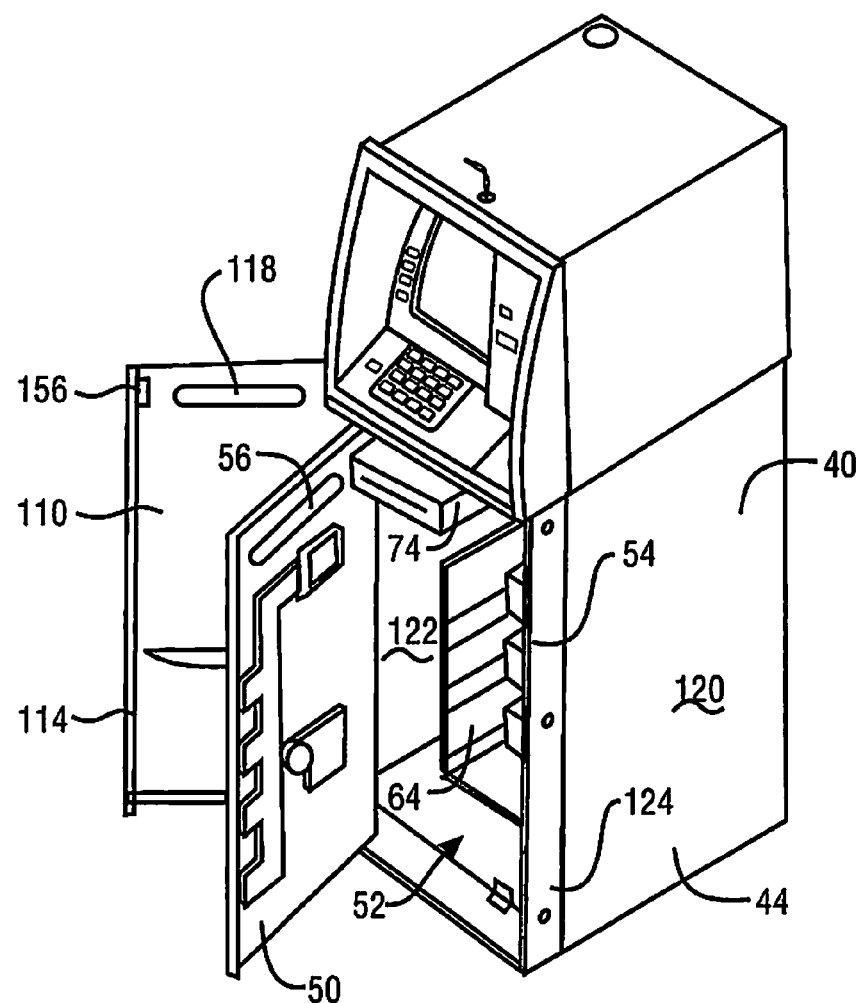
FIG. 5 is an isometric view of the automated banking machine of FIG. 1 with a lower fascia in an accessible position and a chest door in an open position.

With reference to FIGS. 1, 4 and 5, the exemplary embodiment further includes a lower fascia 110 moveably mounted on the chest housing 44. In this exemplary embodiment, lower fascia 110 is operable to move between a covering position as illustrated in FIG. 1, and an accessible position as illustrated in FIGS. 4-5. In other applications, it may be preferable to provide a selectively removable lower fascia, or other approaches to supporting the lower fascia on the chest portion.

The exemplary lower fascia 110 operates to cover the chest 40 to thereby provide a more attractive appearance to machine 10. In the exemplary embodiment, lower fascia 110 includes a front face 112 and first and second side extensions 114, 116, respectively.

In the exemplary embodiment, illustrated in FIGS. 5 and 7, chest housing 44 includes first and second side walls 120, 122, respectively. First side wall 120 includes a forward portion 124 and second side wall includes a forward portion 126 (shown in phantom in FIG. 7). When the chest door 50 is in the closed position and the lower fascia 110 is in the covering position, the first and second side extensions 114, 116, respectively, overlie forward portions 124, 126.

Thus, when machine 10 is viewed from the front (see FIG. 1), the lower fascia 110 covers the chest 40 from side to side. When machine 10 is viewed from the rear (see FIG. 7), a lower gap (not shown) between the first side extension 114 and the first side wall 120 of the chest housing 44 and a lower gap 130 between the second side extension and 116 the second side wall 122 may be visible, although such lower gaps are not viewable from the front of machine 10. In some applications, it may be desirable to minimize the lower gaps 130.

Figure 8:
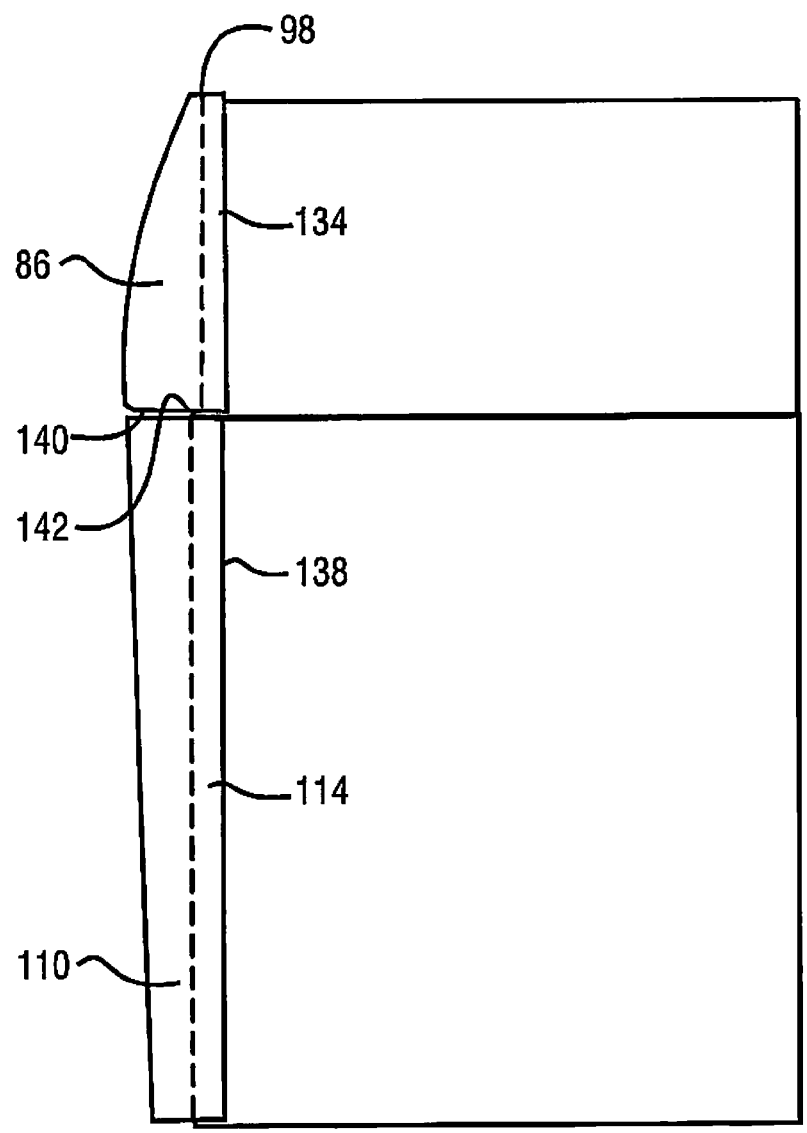
FIG. 8 is a side schematic view of an exemplary embodiment of an automated banking machine illustrating the alignment of an upper fascia and a lower fascia.

As best illustrated in FIG. 8, in the exemplary embodiment, the rearwardly extending portion 98 of upper fascia 86 includes a rearward facing end edge 134. Also, in the exemplary embodiment, first side extension 114 of lower fascia 110 includes rearward facing end edge 138. When viewed from the first side of machine 10, in the exemplary embodiment, end edge 134 of upper fascia 86 and end edge 138 of lower fascia 110 are substantially vertically aligned along a first side of machine 10 when the upper fascia 86 is in the first position and the lower fascia 110 is in the covering position.

With continued reference to FIG. 8, in the exemplary embodiment, upper fascia 86 is bounded by a lower surface 140. Lower fascia 110 is bounded by an upper surface 142. In the exemplary embodiment, lower surface 140 is adapted for substantial parallel horizontal alignment with upper surface 142 when the upper fascia 86 is in the first position and the lower fascia 110 is in the covering position. The alignment of the fascia surfaces presents an attractive appearance to machine 10.

In this exemplary embodiment, the rearwardly extending portion 98 further operates to simplify the manufacture and assembly of the machine 10. In some previous machines, it was necessary to more precisely control the alignment of the walls of the upper fascia 86 with the perimeter of the front opening. However, in this disclosed exemplary embodiment, because the rearwardly extending portion 98 overlies the forward region 94, the required precision is lessened. Further, in those embodiments which include a tapered engagement, alignment of the top housing 12 and upper fascia 86 is facilitated.

With particular reference to FIG. 5, lower fascia 110 may include an access opening 118 therein. In this exemplary embodiment, access opening 118 in the lower fascia 110 is adapted to be substantially aligned with first device opening 56 in chest door 50 when chest door is closed and lower fascia 110 is in the covering position. In this exemplary embodiment, when the chest door 50 is closed and lower fascia 110 is in the covering position, at least an end portion of sheet delivery mechanism 74 extends in the first device opening 56 in chest door 50 and access opening 118 in lower fascia 110.

As illustrated in FIGS. 1 and 2, in this exemplary embodiment, machine 10 includes a first locking mechanism 146 for selectively retaining the rollout tray 80 in the retracted position when upper fascia 86 covers the front opening 22. The first locking mechanism may be of the type described in U.S. Pat. No. 6,082,616 the disclosure of which is incorporated herein by reference in its entirety.

In the exemplary embodiment, machine 10 also includes a second locking mechanism 148 for selectively securing lower fascia 110 in the covering position.

Figure 9:
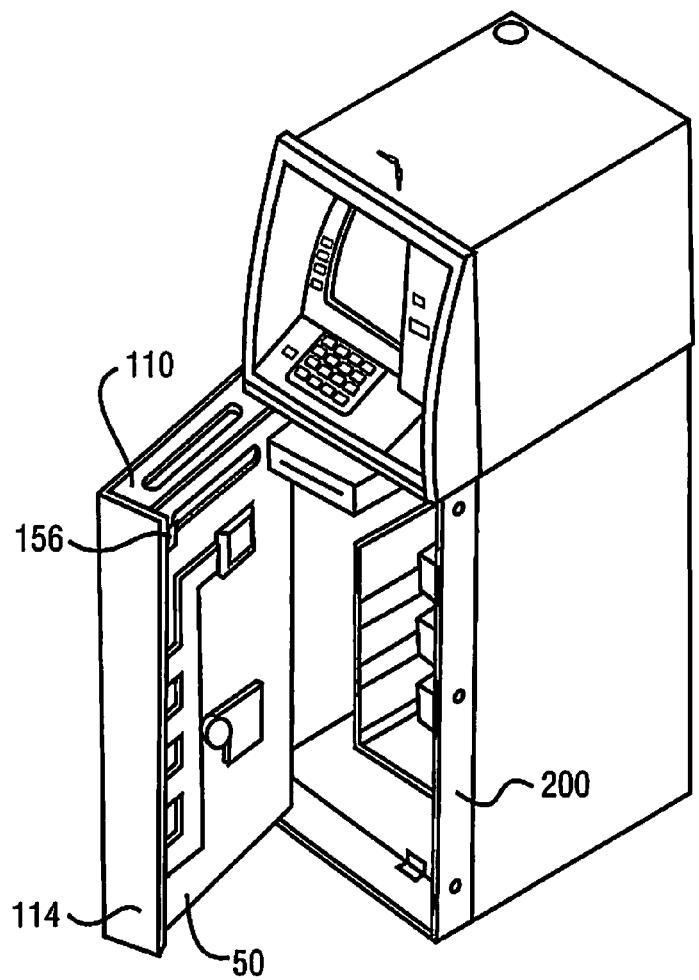
FIG. 9 is an isometric view of an automated banking machine similar to FIG. 5 showing the chest door selectively engaged with the lower fascia.

With particular reference to FIGS. 4, 5 and 9, in another exemplary embodiment machine 10 may include a top housing 12 as previously described. Machine 10 further includes chest 40 having chest door 50 mounted to the housing 44 by one or more chest door hinge assemblies 152. Lower fascia 110 is moveably mounted to chest housing 44 by one or more fascia hinges 154. In this exemplary embodiment, fascia hinge 154 and chest door hinge assembly 152 are situated on the same side of the chest housing 44 so that lower fascia 110 and chest door 50 pivot generally in the same direction relative to the chest.

From time to time, the banking machine components enclosed within secure enclosure 42 must be accessed for replenishment or other servicing activity. Thus, lower fascia 110 may be selectively moved from a covering position into an accessible position to allow access to chest door 50. Chest door 50 may then be selectively opened.

In this exemplary embodiment, as best seen in FIG. 9, lower fascia 110 is operable to engage the open chest door 50 to prevent its movement back to a closed position. In this exemplary embodiment, lower fascia 110 includes an inwardly directed flange 156 carried on an inner surface at a side opposite the fascia hinge 154. Inwardly directed flange 156 is dimensioned to engage at least a portion of chest door 50 when the lower fascia 110 is in the accessible position and the chest door 50 is in the open position. In the exemplary embodiment, lower fascia 110 is adapted to pivot away from the chest door 50 to at least an extent where the chest door may be disengaged from inwardly directed flange 156. Exemplary embodiments may include features of the type discussed in U.S. Pat. Nos. 7,159,767; 7,152,784; 7,000,830; and 6,871,602 the disclosures of each of which are incorporated herein by reference in their entirety.

An exemplary embodiment includes a method for accessing the contents of the secure area for servicing components housed therein or to replenish currency sheets. The method includes placing the lower fascia into an accessible position from a covering position to uncover the chest door; opening the chest door to provide access to the secure area through an opening in the chest housing; and engaging the chest door and the lower fascia to hold the chest door in an open condition. Thus a currency dispenser mechanism or other components may be accessed. Servicing the currency dispenser may include adding or removing currency sheets from operative engagement with the currency dispenser mechanism.

The method may further include engaging the chest door with an inwardly directed flange that is mounted in supporting connection with the lower fascia.

To return the machine to an operational condition, the method includes moving the lower fascia outwardly relative to the engaged chest door to disengage the chest door; closing the chest door; and repositioning the lower fascia into the covering position.

Repositioning the lower fascia into the covering position includes overlying a first forward portion of the chest housing with a first side extension of the lower fascia and overlying a second forward portion of the chest housing with a second side extension of the lower fascia.

Prior to placing the lower fascia into the accessible position, the method includes unlocking a first locking mechanism operable to selectively retain the lower fascia in a covering position.

Figure 10:
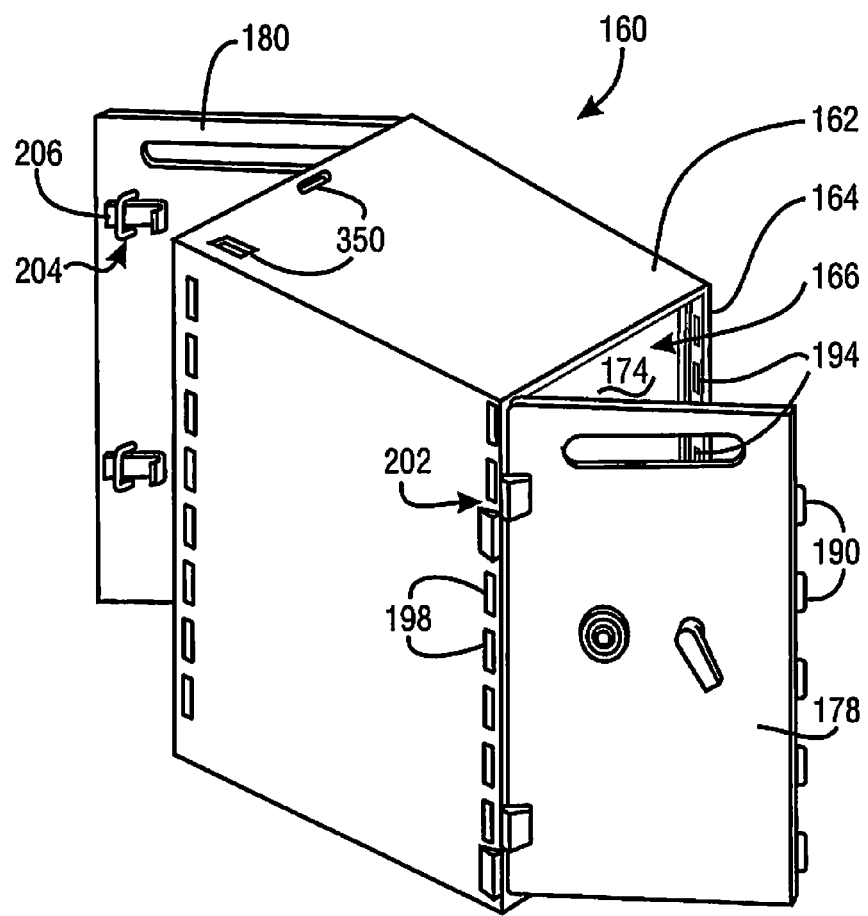
FIG. 10 is a schematic view of an alternate embodiment of a chest for an automated banking machine, as viewed from the front.
Figure 11:
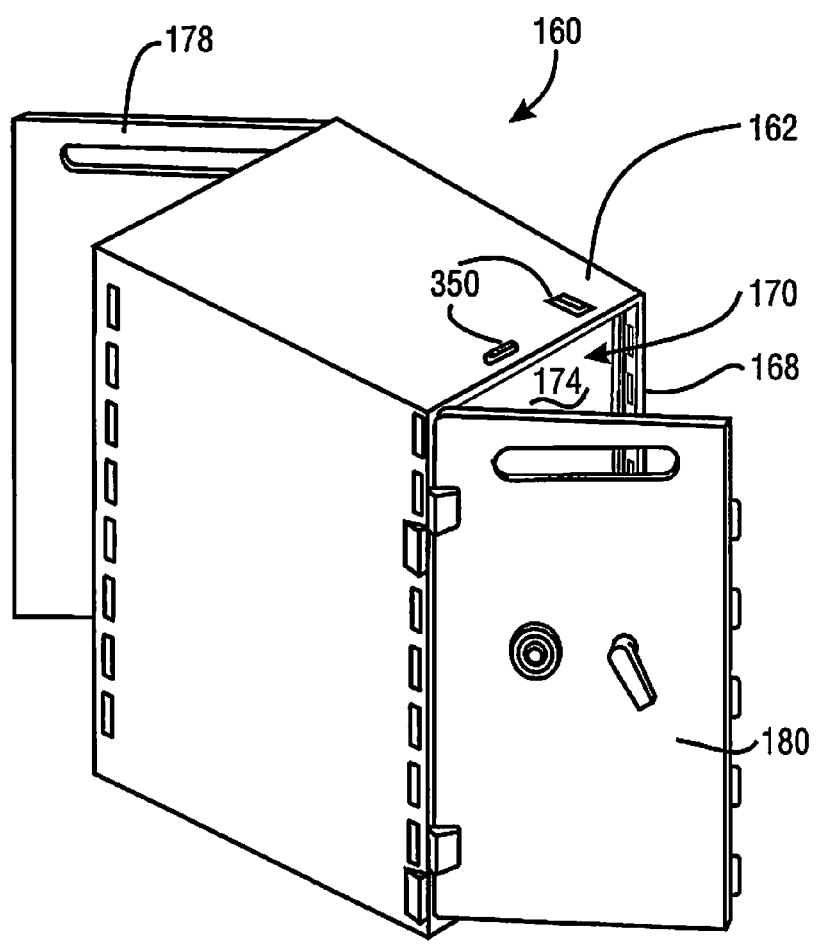
FIG. 11 is a schematic view of the alternate embodiment of the chest shown in FIG. 10, as viewed from the rear.

Some machines may be equipped with another exemplary embodiment of a chest or safe 160, as best seen in FIGS. 10-11. Chest 160 includes a chest housing 162 having a first end 164 defining a first opening 166 therein and a second end 168 defining a second opening 170 therein. The chest of this exemplary embodiment is particularly adapted for applications wherein a common chest housing can be utilized in either "front-load" machines or "rear-load" machines. By "front-load" machine it is meant that access to a secure area 174 in an operable machine may be selectively attained from the front of the machine, which is the same side that customers use to provide input to the machine. By "rear-load" machine it is meant that access to the secure area 174 in an operable machine may be selectively attained from the rear of the machine, while customer inputs are provided at the front of the machine.

In this exemplary embodiment, chest 160 includes a first chest door 178 moveably mounted adjacent a first end 164 of chest housing 162 to selectively close the first opening 166. Chest 160 further includes a second chest door 180 moveably mounted adjacent the second end 168 to selectively close the second opening 170.

In the exemplary embodiment illustrated in FIG. 10, chest 160 is adapted for use in a front load machine wherein under usual operating conditions, first chest door 178 is selectively movable to open or close first opening 166 to allow access to secure area 174. In this exemplary embodiment, second chest door 180 is adapted to remain closed during usual operation of the machine, including those times when access to secure area 174 is desired. For purposes of this disclosure, the term "semi-permanently" closed is used to describe a condition of a chest door that closes an opening in the chest housing in a manner that does not readily permit access to the secure area. In this way, a "semi-permanently" closed chest door is not used as the primary means for accessing the chest interior. However, under appropriate conditions the semi-permanently closed chest door can be opened.

In this exemplary embodiment, first chest door 178 is the operable door and second chest door 180 is adapted to be semi-permanently closed. In other embodiments, for instance in rear-load machines, it may be desirable to utilize chest 160 as illustrated in FIG. 11 where the second chest door 180 is the operable door while first chest door 178 is adapted to be semi-permanently closed.

Figure 12:
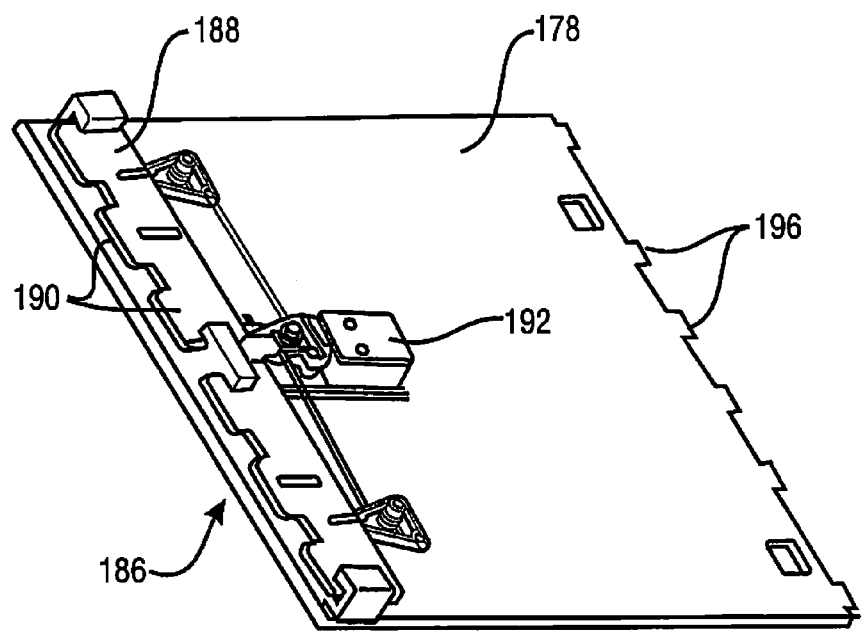
FIG. 12 is an isometric view of a chest door illustrating a locking bolt mechanism.

With particular reference to FIGS. 10 and 12, in the exemplary embodiment, the first chest door 178 is equipped with a suitable locking bolt mechanism generally denoted 186. Locking bolt mechanism 186 is operative to selectively enable securing first chest door 178 in a locked condition. Locking bolt mechanism 186 may be of the type described in U.S. Pat. No. 6,089,168 which is incorporated by reference in its entirety as if fully rewritten herein. Of course, other suitable bolt works can be utilized to accomplish the objectives.

Locking bolt mechanism 186 of the exemplary embodiment includes a locking bolt 188 which includes a plurality of locking bolt projections 190. Locking bolt 188 is mounted in operatively supported connection with an interior surface of first chest door 178 so as to be slideably movable between an extended position and a retracted position.

First chest door 178 also has a lock 192 mounted thereto. Lock 192 cooperates with locking bolt mechanism 186 so that first chest door 178 is enabled to be changed from a locked condition to an unlocked condition. As shown in FIG. 10, the chest housing 162 includes a plurality of vertically spaced locking bolt apertures 194 which are sized and positioned for accepting the locking bolt projections 190.

It will be appreciated by those skilled in the art that the locking bolt mechanism because it provides multiple places for engagement with the chest housing, achieves more secure locking of the door in the closed position than a locking bolt mechanism providing a single place for engagement with the chest housing.

In the exemplary embodiment, first chest door 178 includes a plurality of dead bolt projections 196 extending on a hinge side of the door. These dead bolt projections 196 are preferably positioned and sized to be accepted in the dead bolt apertures 198 in housing 162. As will be appreciated, the acceptance of the dead bolt projections 196 into the dead bolt apertures 198 provides enhanced security. In an exemplary embodiment, the dead bolt apertures and the locking bolt apertures are covered by trim pieces 200 (shown in FIG. 9) that extend on the outside of the housing.

With reference to FIG. 10, in the exemplary embodiment, the first chest door 178 is operably connected to the chest housing via one or more first chest hinge assemblies 202. The exemplary chest hinge assembly 202 may be of the type described in U.S. Pat. Nos. 6,089,168 and/or 7,156,297, the disclosures of which are incorporated herein in their entirety. It will be readily understood that other hinge constructions may be used in other embodiments.

In the exemplary embodiment, the second chest door 180 may be secured in a closed position by a securing mechanism that generally mirrors the locking bolt mechanism 186 and lock 192. Alternately, as illustrated in FIG. 10, second chest door 180 may be "semi-permanently" secured by an alternate securing mechanism 204. The alternate securing mechanism 204 may include a bolt member 206 or other mechanism that is less complex than the locking bolt mechanism and lock previously described. In this exemplary embodiment, routine access to the secure area 174 via second chest door 180 is not necessary during normal operation of the machine. Thus, the alternate securing mechanism 204 is operable to "semi-permanently" engage the chest door 180. This may be done, for example, by securing the bolt with fasteners or other devices that are only accessible from within the interior of the chest portion. Of course, in some alternative embodiments both chest doors may be equipped with operational locking bolt mechanisms and locks.

The manufacture of an exemplary machine may be simplified by use of chest 160. A common chest housing may be utilized in applications requiring a front-load machine or a rear-load machine. After the housing has been assembled, the positioning of a locking bolt mechanism may be chosen according to the configuration of the chest. Additionally, at a subsequent time, the operational features may be changed so that the initial operational chest door becomes the non-operational door and vice versa. Thus, the manufacturing process is simplified by the versatility of the chest housing.

Of course it will be readily appreciated that machines incorporating this exemplary embodiment of chest 160 may include any of the other features described elsewhere.

An exemplary embodiment includes a method for utilizing a machine that is equipped with a chest having two opposed openings. The chest housing includes a first opening at a first end thereof and a second opening at a second opposed end. The first door is moveably mounted in supporting connection with the chest housing so that the first chest door is operative to selectively close the first opening. A second chest door is moveably mounted in supporting connection with the chest housing so that the second door is operative to semi-permanently close the second opening. At least one lower banking machine component is mounted in supporting connection with the chest housing in the secure area.

In the exemplary method, a first locking bolt mechanism in supporting connection with the first chest door is operated to selectively securely engage the first chest door with the chest housing. A first securing mechanism in supporting connection with the second chest door is operated to semi-permanently securely engage the second chest door with the chest housing.

The method includes accessing at least one lower banking machine component of an machine through a first opening in a chest housing bounding a secure area; and preventing access to the at least one lower banking machine component through the second opening.

The method further includes replacing the first locking bolt mechanism with a second securing mechanism in supporting connection with the first chest door, wherein the second securing mechanism is operative to semi-permanently securely engage the first chest door with the chest housing; and replacing the first securing mechanism with a second locking bolt mechanism in supporting connection with the second chest door, wherein the second locking bolt mechanism is operative to selectively securely engage the second chest door with the chest housing. Thus, the door chosen as the operative door can be selected and changed.

The exemplary machine may include a lower fascia that is mounted in supporting connection with the chest housing, wherein the lower fascia is selectively movable between a covering position and an accessible position. The exemplary method may include moving the lower fascia from the covering position to the accessible position prior to accessing the lower banking machine component. Further, the method may include engaging the first chest door with the lower fascia to hold the first door in the open condition.

The at least one lower banking machine component may comprise a currency dispenser mechanism. The exemplary method includes servicing the currency dispenser mechanism after the at least one lower banking machine component is accessed. This may include for example features included in U.S. Pat. Nos. 7,195,237 and/or 7,111,776 the disclosures of each of which are incorporated herein by reference in their entirety.

The at least one lower banking machine component may comprise a currency stacker. The exemplary method includes servicing the currency stacker.

Figure 13:
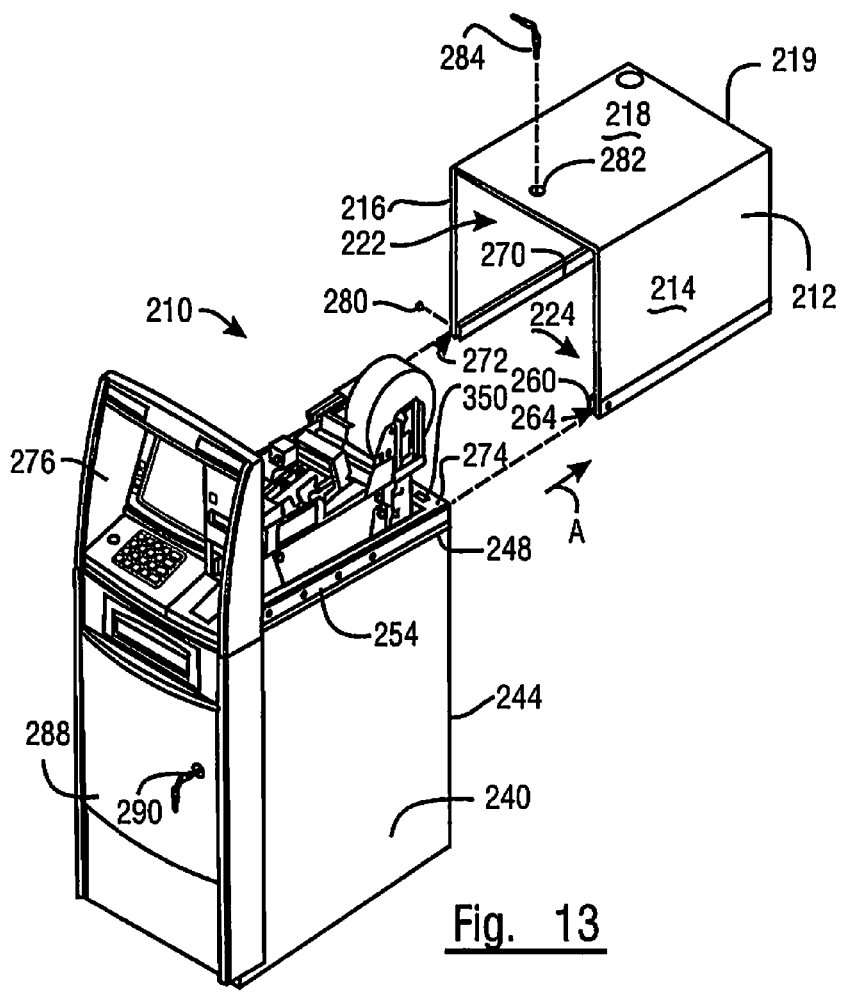
FIG. 13 is an isometric exploded view of an alternate embodiment of an automated banking machine.
Figure 14:
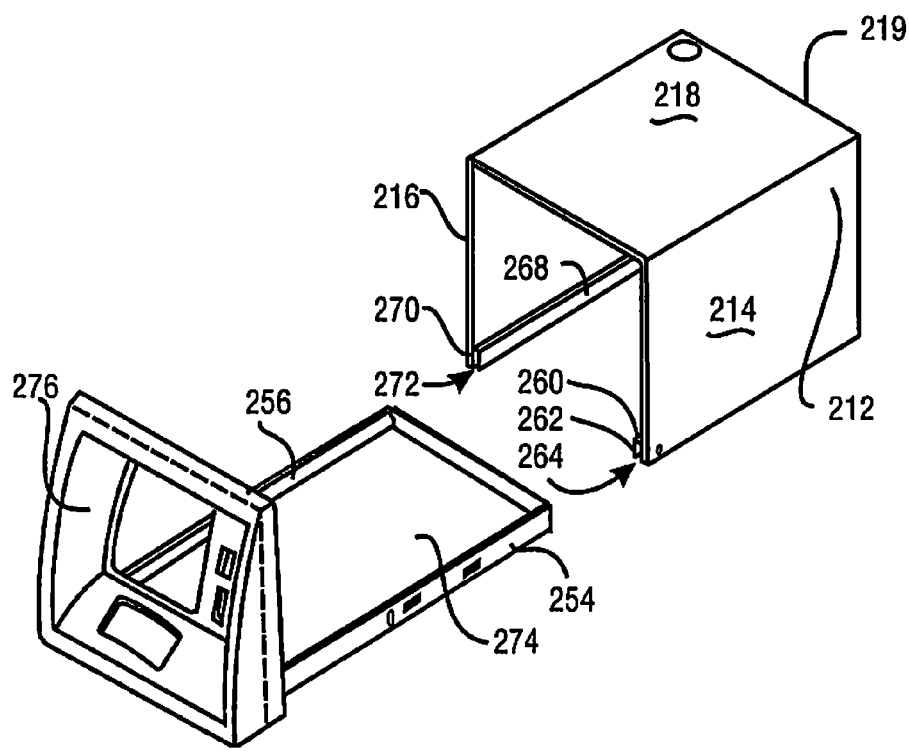
FIG. 14 is an isometric view of a top housing cover, a mounting tray and an upper fascia of an automated banking machine.
Figure 15:
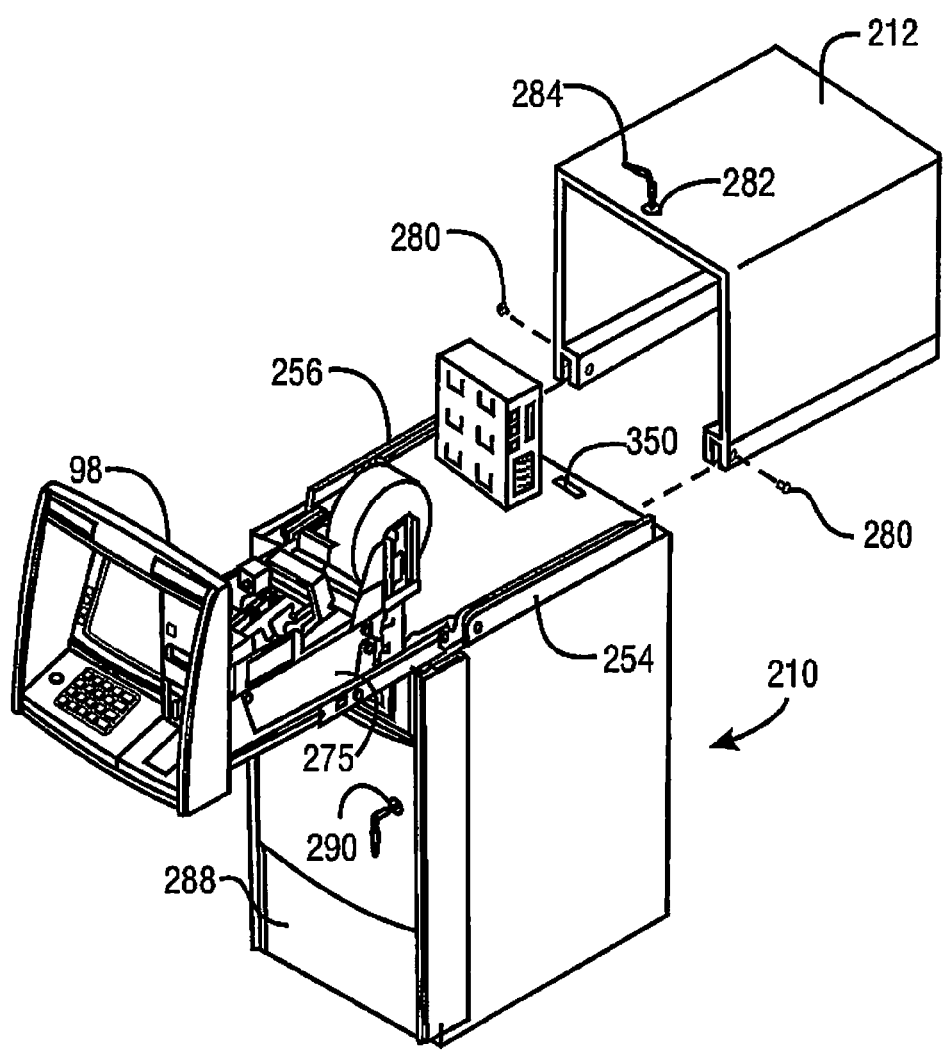
FIG. 15 is an isometric view of an alternate embodiment of an automated banking machine.

Yet another exemplary embodiment of a machine 210 is illustrated in FIGS. 13-15. Machine 210 includes a top housing cover 212 including first and second side walls 214, 216, top wall 218, and rear wall 219. Top housing cover 212 defines a front opening 222 and a bottom opening 224. In a first (operable) position, top housing cover 212 covers an interior area in which various upper banking machine components such as a display, a receipt printer, a card reader, input keys, a controller, communication device, and others may be disposed.

In this exemplary embodiment, machine 210 further includes a chest 240 bounding a secure area in a manner similar to that previously described. Chest 240 includes a housing 244 having a top wall 248. Top housing cover 212 is adapted for rearward slidable movement relative to top wall 248 to a second position for service.

In this exemplary embodiment, a first upwardly extending flange member 254 is mounted in supporting connection with top wall 248 along a first side thereof. A second upwardly extending flange member 256 (not shown in this view) is mounted in supporting connection with top wall 248 along a second side thereof.

Supported on the first side wall 214 of top housing cover 212 is a first cooperating channel member 260 having a pair of spaced downwardly extending projections 262 defining a first channel 264 therebetween. Likewise, on the second side wall 216 of top housing cover 212 there is supported a second cooperating channel member 268 having a pair of spaced downwardly extending projections 270 defining a second channel 272 therebetween.

Top housing cover 212 is adapted for slidable movement relative to the top wall 248 by the slidable engagement of the first flange member 254 within first channel 264 and the slidable engagement of the second flange member 256 within second channel 272.

In this exemplary embodiment, machine 210 includes an upper fascia 276 operable to selectively cover the front opening 222. The top housing cover 212 is adapted for rearward movement relative to the top wall 248 in the direction of arrow A such that rearward displacement of the top housing cover 212 allows access to the upper banking machine components in the interior area, for example, for servicing.

It is contemplated that in exemplary embodiments the positioning of the flange members 254, 256 and the channels 264, 272 be reversed. For example, the top housing cover 212 may support flange members and the mounting tray may support cooperating channel members to accomplish a similar slidable relationship therebetween.

FIG. 14 illustrates an exemplary embodiment wherein the flange members 254, 256 are incorporated into a mounting tray 274 which is operable to receive and support one or more upper banking machine components, which for ease of illustration are not shown in this view. This embodiment allows for ease of assembly of the exemplary machine 210. The applicable upper banking machine components can be readily mounted onto mounting tray 274, which is mounted in supporting connection with top wall 248 of chest housing 244. Top housing cover 212 may thereafter be positioned by slidable movement of flange members 254, 256 in respective channels 264, 272.

In an alternate exemplary embodiment, illustrated in FIG. 15, machine 210 may include a rollout tray 275 similar to rollout tray 80 as previously described. Flange members 254, 256 may be mounted in supporting connection with rollout tray 275. Thus, upper banking machine components may be accessed by rearwardly sliding the top housing cover 212, extending the rollout tray 275, or a combination of both.

Machine 210 may further include at least one removable fastener 280 for selectively engaging the top housing cover 212 with at least one flange member 254, 256 to prevent relative slidable movement therebetween. In the exemplary embodiment, first and second fasteners 280 are used to secure the top housing cover 212.

Machine 210 may further include a first locking mechanism 282 to secure the top housing cover to upper fascia 276. In this exemplary embodiment, the locking mechanism is operable in response to a key 284. In the exemplary embodiment illustrated in FIG. 15 it is contemplated that fasteners 280 are covered by a rearwardly extending portion of upper fascia similar to portion 98 shown in FIG. 6. Thus, fasteners 280 are not accessible from outside the machine until first locking mechanism 282 has been operated to release upper fascia 276 so that the upper fascia 276 can be moved away from top housing cover 212.

In the exemplary embodiment, machine 210 may include a lower fascia 288 with features similar to a lower fascia previously described. Lower fascia 288 may be secured in the covering position by a second locking mechanism 290.

This exemplary embodiment provides ready access to the upper banking machine components, for example, for servicing or replacing. To access the upper banking machine components, fasteners 280 are removed. It is contemplated that in an exemplary embodiment, the fasteners may not be accessible until after the first locking mechanism 282 is unlocked and the upper fascia is displaced slightly to uncover fasteners 280. In other embodiments, the fasteners may be directly accessed.

The top housing cover 212 may then be moved rearwardly, away from upper fascia 276 so that the interior area is accessible. During servicing, the top housing cover 212 may be selectively positioned so that some portion or none of the upwardly extending flanges 254, 256 remain engaged with the channel members 260, 268, respectively.

In one exemplary embodiment, a method is provided for accessing banking machine components. The exemplary method includes supporting the top housing cover in a slidable relationship with the top wall of the chest housing, wherein the top housing cover includes a front opening; selectively rearwardly sliding the top housing cover away from a first position in which an upper fascia covers the front opening; and accessing at least one upper banking machine component that is mounted in supporting connection with the top wall of the chest housing.

The exemplary method further includes removing fasteners that may be used to selectively secure the top housing cover in the first position.

The exemplary method further includes operating a locking mechanism to release the top housing cover and the upper fascia.

The exemplary method further includes accessing an upper banking machine component for servicing. The at least one upper banking machine component may be a display that is accessed for servicing.

In one embodiment the machine includes side flange members mounted in supporting connection with a top wall of a chest housing and cooperative channel members mounted in supporting connection with the top housing cover. In this exemplary embodiment, the method further includes slideably engaging a first flange member with a first channel of a first channel member.

Figure 16:
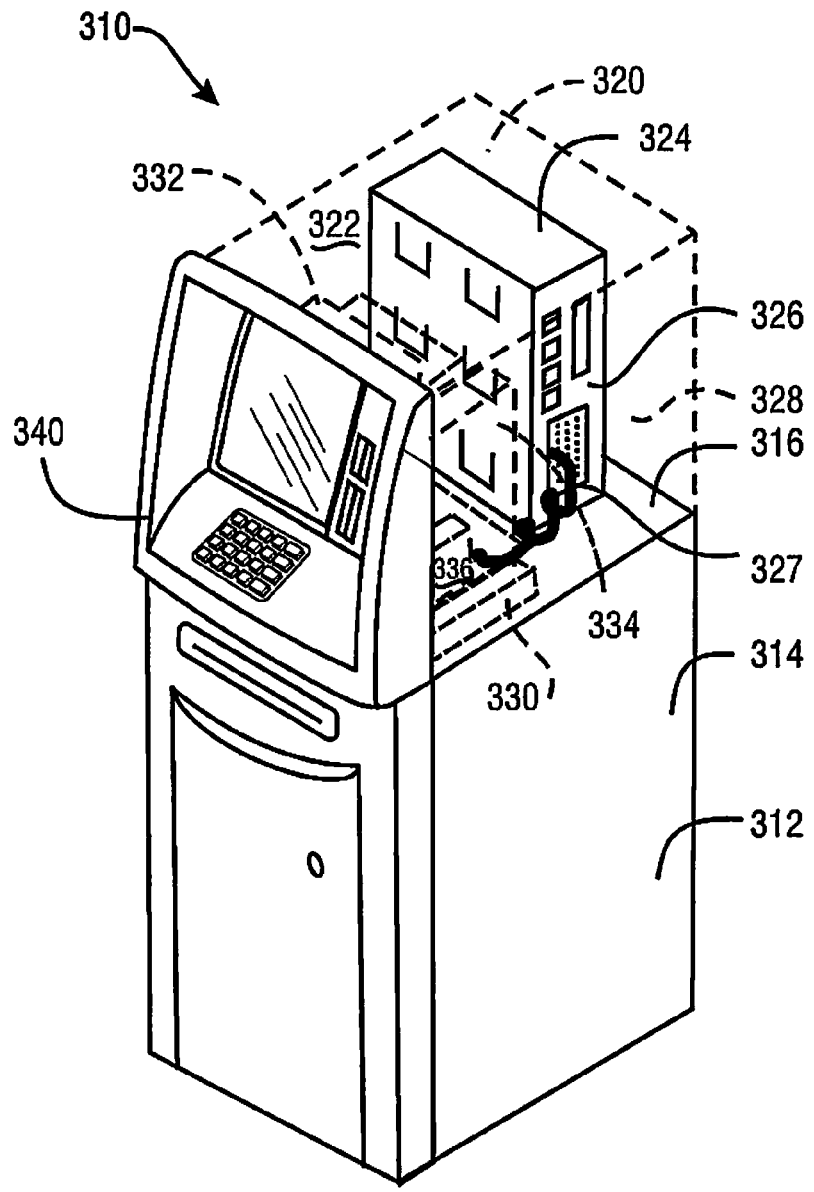
FIG. 16 is an isometric view, partly in phantom, of an alternate exemplary embodiment of an automated banking machine in an operational condition.
Figure 17:
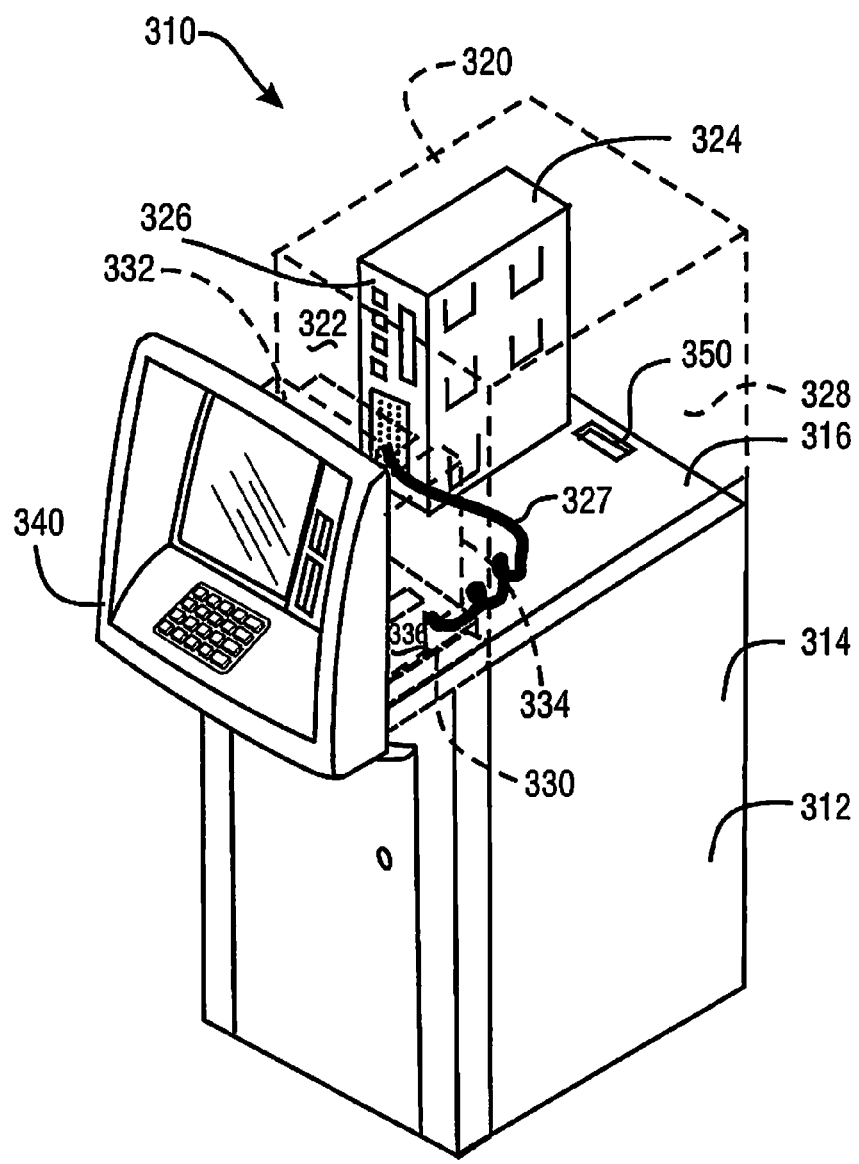
FIG. 17 is an isometric view, partly in phantom, of the automated banking machine of FIG. 16, in a serviceable condition.

In another exemplary embodiment, illustrated in FIGS. 16 and 17, machine 310 may include a chest 312 having a chest housing 314 including top wall 316. As in previously described embodiments, chest housing 314 bounds a secure area which holds lower banking machine components including a currency dispenser mechanism which may be similar to mechanism 64 shown in FIG. 3. Machine 310 further includes a top housing 320 (shown in phantom) bounding an interior area 322.

In this exemplary embodiment, machine 310 includes a processor case 324 that houses the primary machine processor or processors. The processor may be an Intel Pentium or Celeron processor. Of course, in some embodiments the case may house multiple processors or no processors at all. The processor causes operation of the various devices and mechanisms in the machine.

In this exemplary embodiment, processor case 324 is in supporting connection with top wall 316 of chest housing 314. Processor case 324 includes a first functional side 326 that is operable to establish connections, such as through cable 327, from the various banking machine components. Other processor components, including but not limited to circuit cards having various functions, additional processors, drives (CD, DVD, floppy), power supplies, memory, or encryption cards, may be carried on or within processor case 324. Such components may also be accessed, removed and/or replaced and routine maintenance performed through access to the functional side of the processor case.

In order to minimize the space occupied by machine 310, it is advantageous to orient processor case 324 of the exemplary embodiment so that the first functional side 326 is substantially parallel to a first side wall 328 (shown in phantom) of top housing 320. However, in order to easily access first functional side 326 for servicing or connecting cables, it is advantageous to orient processor case 324 so that the first functional side 326 is substantially perpendicular to the first side wall 328, facing the front opening of the machine. In order to accomplish both these purposes, the processor case 324 of the exemplary embodiment is rotationally supported in connection with the top wall 316 of the chest housing 314. The processor case 324 is selectively rotationally movable between an operational position, shown in FIG. 17, wherein the first functional side 326 is substantially parallel to the first side wall 328, and a service position, shown in FIG. 16, wherein the first functional side 326 is substantially perpendicular to the first side wall 328.

In this exemplary embodiment, a rollout tray 330 is supported on the top wall 316 of the chest housing 314. As in earlier described exemplary embodiments, the rollout tray 330 is selectively movable between a retracted position wherein the rollout tray 330 is within the interior area 322, and an extended position wherein the rollout tray 330 extends outwardly from the interior area through a front opening in the top housing 320. In the exemplary embodiment, various upper banking machine components such as display 332, receipt printer 334, and card reader 336 are supported on rollout tray 330. Also, an upper fascia 340 may be mounted in supporting connection with rollout tray 330. As in other described embodiments, when the rollout tray is in the retracted position, the upper fascia 340 covers the front opening in the top housing.

In the exemplary embodiment, when rollout tray 330 is in the retracted position, as illustrated in FIG. 16, the processor case 324 is prevented from rotating from the operational position to the service position. When the rollout tray 330 is in the extended position, as illustrated in FIG. 17, there is enough clearance in the interior area 322 to permit the processor case 324 to be rotated into the service position. Thus, when the rollout tray 330 is in the extended position, the upper banking machine components supported thereon are readily accessible for service. Likewise, the cable connections and any processor components carried on the processor case are accessible for service.

In a method for servicing banking machine components of a machine, a rollout tray 80 mounted in supporting connection with a top housing 320 is extended from a retracted position so that the rollout tray extends through a front opening in the top housing 320. The method includes disengaging any locking mechanisms that operate to retain the rollout tray 80 in the retracted position.

A processor case 324 disposed in an interior area 322 bounded by the top housing 320 may be rotated from an operational position to a service position. At least one processor component mounted in supporting connection with the processor case 324 may be accessed for servicing. After servicing of the processor component is complete, the processor case 324 may be rotationally returned to the operational position from the service position. Thereafter, the rollout tray 80 may be repositioned into the retracted position.

The step of servicing the processor component may include connecting or disconnecting cables or connections, adding or replacing components such as circuit cards, performing diagnostic tests and other functions to facilitate operation of the machine.

Prior to repositioning the rollout tray 80, other banking machine components may be serviced while the rollout tray is extended. For example, a display, card reader, and receipt printer assembly are readily accessible for service. The service can include routine maintenance, replacement of non-working components, addition of other banking machine components, and the like. Connections with the processor can be readily made while the rollout tray is in the extended position and the processor case is in the service position.

The machine may include a slidable top housing cover 212 as earlier described. The service method includes the step of rearwardly sliding the top housing cover 212. After the servicing of banking machine components is completed, the method includes returning the top housing cover 212 to an operational position.

During servicing of the machine, the lower banking machine components may also be accessed for servicing. The service method includes disengaging any locking mechanisms that retain the lower fascia in a covering position. The lower fascia may thereafter be moved into the accessible position. The locking bolt mechanism that securely engages the chest door with the chest housing may be disengaged so that the chest door may be placed in the open position.

An exemplary method further includes the step of engaging the chest door with the lower fascia when the chest door is in the open position and the lower fascia is in the accessible position in order to retain the door in the open position.

The lower banking machine components, such as currency stacker, currency dispenser mechanism, and currency delivery mechanism (as shown in FIG. 3). An exemplary service method includes performing routine maintenance, replenishing currency, removing sheets, disengaging sheets from the currency dispenser mechanism, replacing components and the like.

The machine can include connections and/or cables that extend between the processor case and lower banking machine components that are generally housed within the secure chest. The chest housing may include various openings 350 through the walls to accommodate the connections and/or cables (FIGS. 10-11 and 17). When the processor case is in the service position, the connections can be readily established, maintained and/or changed.

An exemplary method of constructing a machine apparatus is described. The exemplary method includes mounting a top housing in supporting connection with a chest adapted for use in an automated banking machine apparatus. A first chest door is operable to selectively close a first opening in the chest housing.

The method further includes mounting an upper fascia in supporting connection with the top housing and mounting a lower fascia in movable supporting connection with the chest housing.

The upper fascia and the top housing are selectively positioned relative each other so that a front opening in the top housing is selectively covered by the upper fascia, and wherein a rearwardly extending portion of the upper fascia overlies a forward region of the top housing.

The lower fascia is selectively positioned in a covering position relative a chest door wherein a first side extension of the lower fascia overlies a first forward portion of the chest housing and wherein a second side extension of the lower fascia overlies a second forward portion of the chest housing.

In an exemplary method, a lower edge surface of the upper fascia is placed in substantially parallel alignment with an upper edge surface of the lower fascia and an end edge of a rearwardly extending portion of the upper fascia is substantially vertically aligned with an end edge of a first side extension of the lower fascia at a first side of the machine.

In an exemplary method, a second chest door is moveably mounted in supporting connection with the chest housing to operably close a second opening in the chest housing. A first locking bolt mechanism may be mounted to the first chest door and an alternate securing mechanism may be mounted to the second chest door.

In an exemplary method, a processor case is mounted in supporting rotational connection with a top wall of the chest housing wherein the processor case is selectively movable between an operational position and a service position, and wherein the processor case houses at least one processor.

In an exemplary method, at least one upper banking machine component is mounted in supporting connection with a rollout tray which is mounted in movable supporting connection with the chest housing, wherein the rollout tray is selectively movable between a retracted position wherein the rollout tray is within an interior area, and an extended position wherein the rollout tray extends outwardly from the interior area through the front opening in the top housing.

The exemplary method includes selectively placing the rollout tray in the extended position, selectively rotating the processor case into the service position, and establishing an operable connection between the at least one upper banking machine component and the at least one processor.

In an exemplary method, the lower fascia is equipped with an inwardly extending flange operative to selectively engage the chest door when the lower fascia is in the accessible position and the chest door is in the open position.

Figure 18:
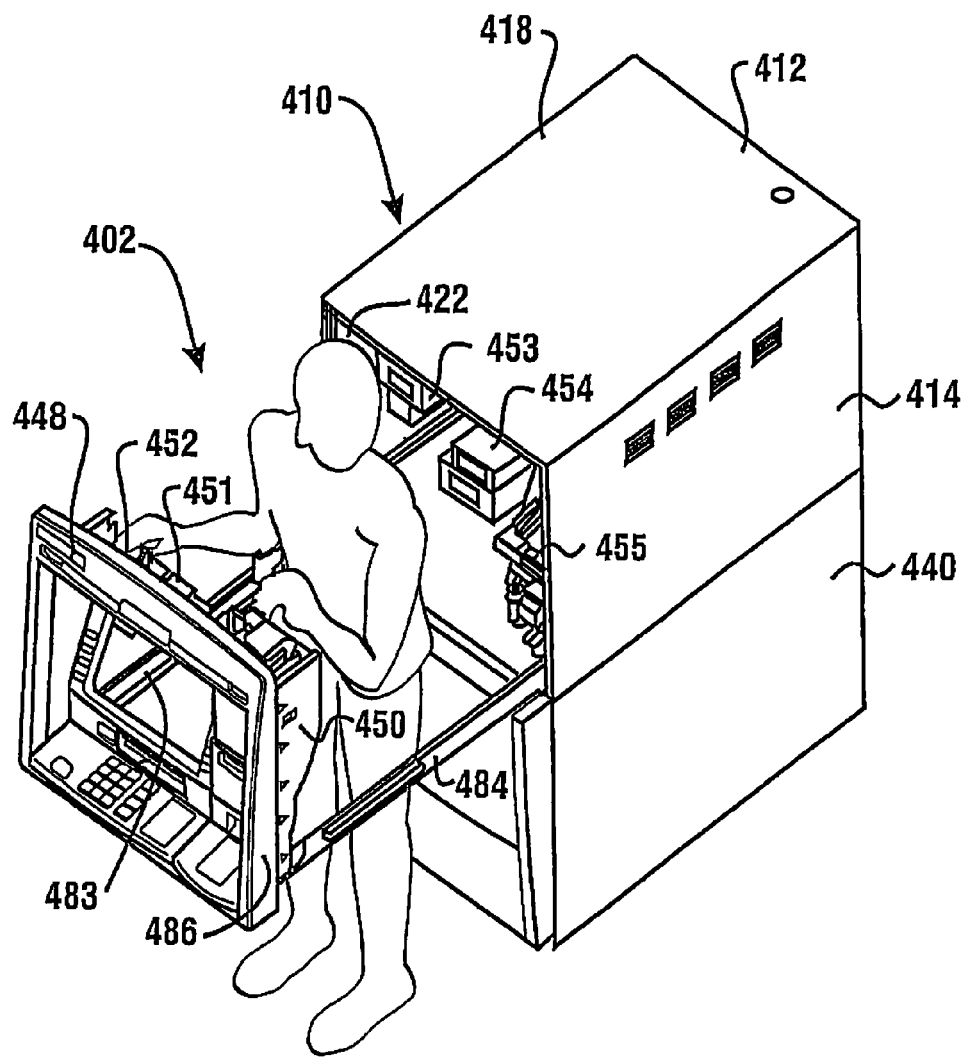
FIG. 18 is an isometric view of an automated banking machine of an exemplary embodiment.

With reference to FIG. 18, in this exemplary embodiment there is shown therein an automated banking machine, generally indicated as 410. In this exemplary embodiment, the automated banking machine 410 is an automated teller machine. The machine 410 includes a housing 412 mounted atop a chest 440. The housing 412 includes a first side wall 414, a second side wall 416 (FIG. 19), a rear wall or panel 419, and a top wall 418, and defines a front opening 422. A fascia 486 is adapted to cover the front opening 422 of the housing 412 and may be secured to the housing 412 with a lock 448. The fascia 486 is in operatively supported connection with the housing 412 and is operatively supported by the housing 412 through two horizontally disposed members 483, 484. As will be appreciated by those skilled in the art, the fascia 486 may additionally or alternatively be secured to the chest 440. In an exemplary embodiment, the two horizontally disposed members 483, 484 are slideable members adapted to enable the fascia 486 to be moved away from the front opening 422 of the housing 412. Further, the fascia 486, when moved away from the front opening 422, cooperates with the housing 412 and the two horizontally disposed members 483, 484 to define a space which may be at least partially occupied by a servicer 402 while servicing the machine 410. Various serviceable components, generally identified in FIG. 18 as components 450-455, may be supported by the fascia 486, the housing 412, the chest 440, or combinations thereof.

Figure 19:
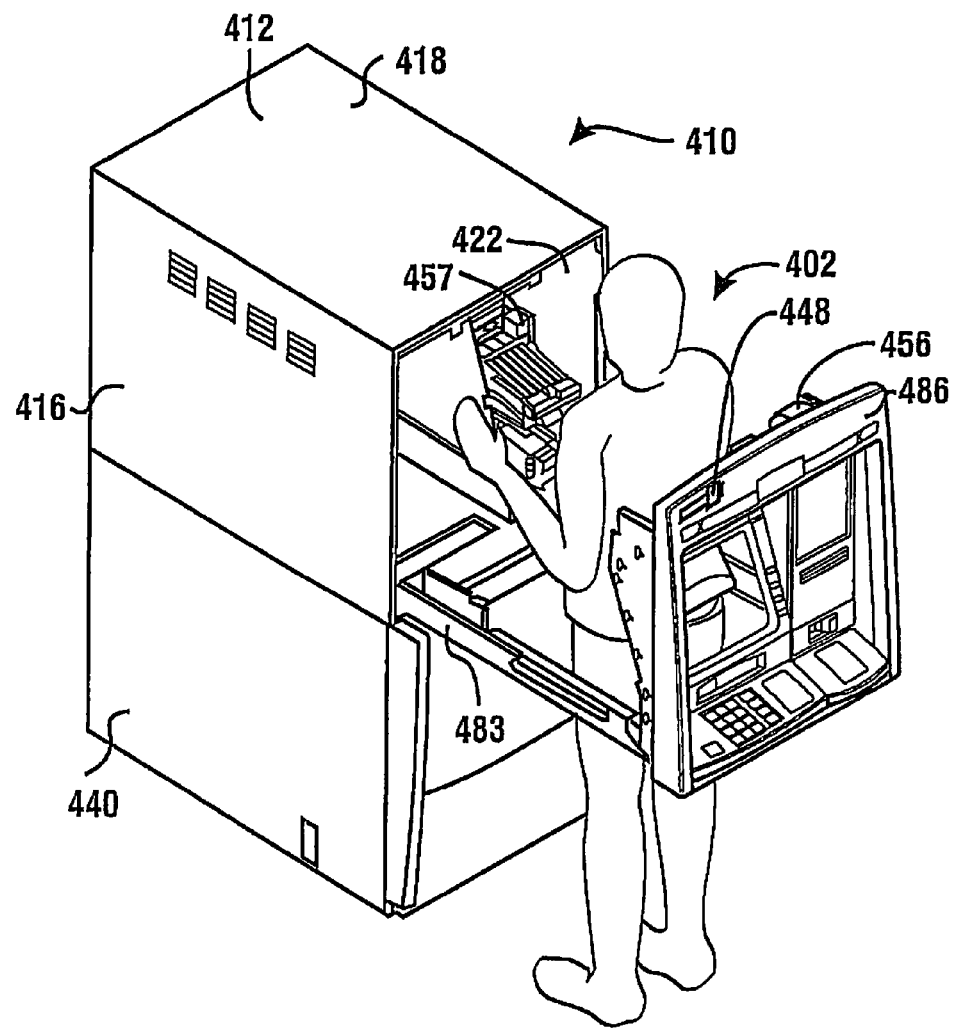
FIG. 19 is a further isometric view of the automated banking machine of the exemplary embodiment shown in FIG. 18.

With reference to FIG. 19, there is shown a further view of the exemplary embodiment of the machine 410 described under FIG. 18. Shown is the servicer 402 at least partially occupying the space defined by the fascia 486, the housing 412, and the two horizontally disposed members 483, 484.

Figure 20:
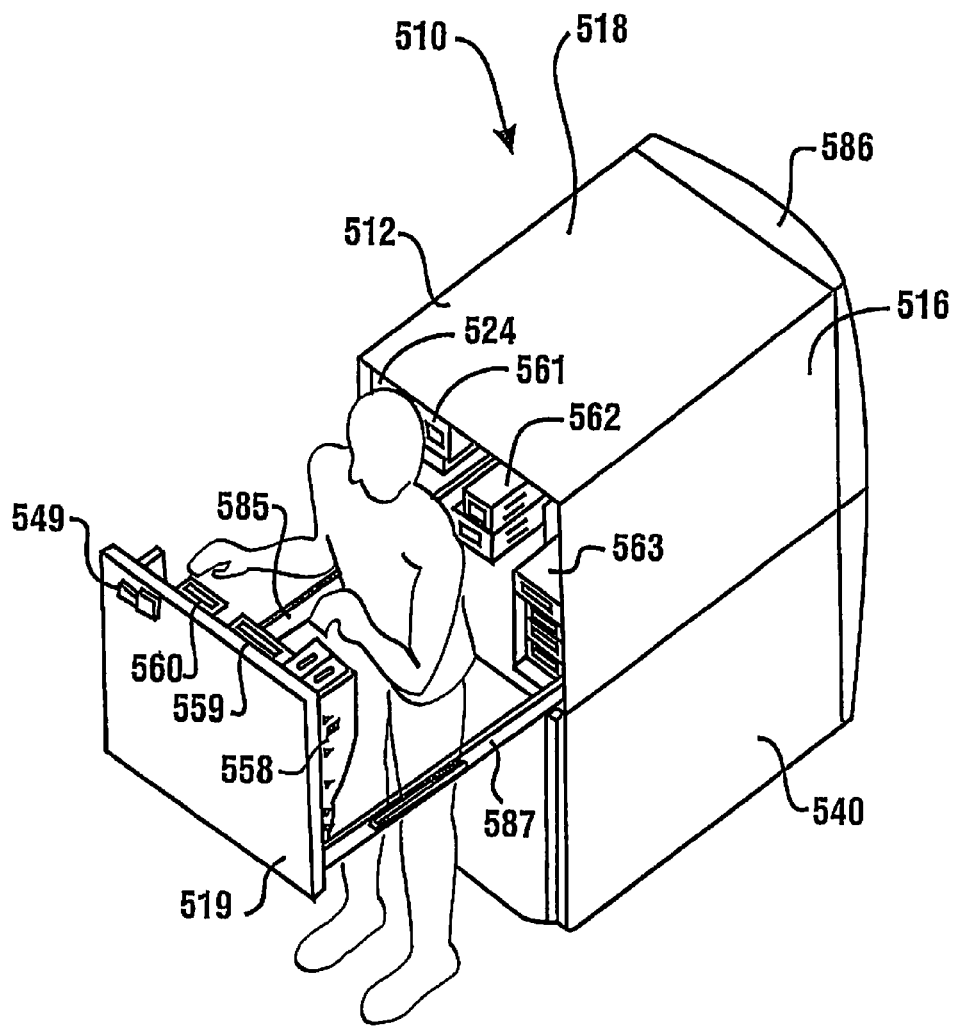
FIG. 20 is an isometric view of an automated banking machine of an exemplary embodiment.

With reference to FIG. 20, in this exemplary embodiment there is shown therein an automated banking machine, generally indicated as 510. The machine 510 includes a housing 512 mounted atop a chest 540. The housing 512 includes a first side wall 514 (not shown), a second side wall 516, and a top wall 518, and defines a rear opening 524. A rear panel 519 is adapted to cover the rear opening 524 of the housing 512 and may be secured to the housing 512 with a lock 549. The rear panel 519 is in operatively supported connection with the housing 512 and is operatively supported by the housing 512 through two-horizontally disposed members 585, 587. In an exemplary embodiment, the two horizontally disposed members 585, 587 are slideable members adapted to enable the rear panel 519 to be moved away from the rear opening 524 of the housing 512. Further, the rear panel 519, when moved away from the rear opening 524, cooperates with the housing 512 and the two horizontally disposed members 585, 587 to define a space which may be at least partially occupied by the servicer 402 while servicing the machine 510. Various serviceable components, generally identified in FIG. 20 as components 558-563, may be supported by the rear panel 519, the housing 512, the chest 540, or combinations thereof.

With reference to FIG. 21, in this exemplary embodiment there is shown therein an automated banking machine, generally indicated as 610. The machine 610 includes a housing 612 mounted atop a chest (not shown). The housing 612 includes a first side wall 614, a second side wall 616, a rear wall 619, and a top wall 618, and defines a front opening 622. A fascia 686 is adapted to cover the front opening 622 of the housing 612 and may be secured to the housing 612 with a lock (not shown). The fascia 686 is in operatively supported connection with the housing 612 and is operatively supported by the housing 612 through two horizontally disposed members 683, 684. In an exemplary embodiment, the two horizontally disposed members 683, 684 are slideable members adapted to enable the fascia 686 to be moved away from the front opening 622 of the housing 612. Further, the fascia 686, when moved away from the front opening, 622, cooperates with the housing 612 and the two horizontally disposed members 683, 684 to define a space which may be at least partially occupied by the servicer 402 while servicing the machine 610. Various serviceable components, generally identified in FIG. 21 as components 664-669, may be supported by the fascia 686, the housing 612, the chest (not shown), or combinations thereof.

Also shown in FIG. 21, is an exemplary embodiment of a moveable component tray 690. The moveable component tray 690 may support one or more components, generally 664-666. The tray 690 is in operatively supported connection with the housing 612 and is operatively supported by the housing 612 through two horizontally disposed members 692, 693. In an exemplary embodiment, the two horizontally disposed members 692, 693 are slideable members adapted to enable the one or more components, generally 664-669, and their support tray 690 to be moved away from the housing 612 for servicing by the servicer 402. Even when the support tray 690 is moved away from the housing 612, the housing 612, the tray 690, one of the horizontally disposed members 684, for example, and the fascia 686 cooperate to define a space which may be at least partially occupied by the servicer 402. As will be appreciated by those skilled in the relevant art, the moveable tray 690 described herein and illustrated in FIG. 21 may also or additionally be included in a rear-access housing as illustrated in exemplary fashion in FIG. 20. As will also be appreciated by those skilled in the art, the support tray 690 may be disposed in a vertical orientation.

With reference to FIG. 22, in this exemplary embodiment there is shown therein an automated banking machine, generally indicated as 710. The machine 710 includes a housing 712 mounted atop a chest (not shown). The housing 712 includes a first side wall 714, a second side wall 716, a rear wall 719, and a top wall 718, and defines a front opening 722. A fascia 786 is adapted to cover the front opening 722 of the housing 712 and may be secured to the housing 712 with a lock (not shown). The fascia 786 is in operatively supported connection with the housing 712 and is operatively supported by the housing 712 through two horizontally disposed members 783, 784. In an exemplary embodiment, the two horizontally disposed members 783, 784 are slideable members adapted to enable the fascia 786 to be moved away from the front opening 722 of the housing 712. Further, the fascia 786, when moved away from the front opening 722, cooperates with the housing 712 and the two horizontally disposed members 783, 784 to define a space which may be at least partially occupied by the servicer 402 while servicing the machine 710. Various serviceable components, generally identified in FIG. 22 as components 770-775, may be supported by the fascia 786, the housing 712, the chest (not shown), or combinations thereof.

Also shown in FIG. 22, is an exemplary embodiment of a moveable component rack 790. The moveable component rack 790 may support one or more serviceable components, generally 773-775. The rack 790 is in operatively supported connection with the housing 712 and is operatively supported by the housing 712 through two horizontally disposed members 794, 795. In an exemplary embodiment, the two horizontally disposed members 794, 795 are slideable members adapted to enable the one or more components, generally 773-775, and their supporting rack 790 to be moved away from the housing 712 for servicing by the servicer 402. Even when the supporting rack 790 is moved away from the housing 712, the housing 712, the rack 790, one of the horizontally disposed members 784, for example, and the fascia 786 cooperate to define a space which may be at least partially occupied by the servicer 402. As will be appreciated by those skilled in the relevant art, the moveable rack 790 described herein and illustrated in FIG. 22 may also or additionally be included in a rear-access housing as illustrated in exemplary fashion in FIG. 20. As will also be appreciated by those skilled in the art, the supporting rack 790 may be disposed in a vertical direction.

With reference to FIG. 23, in this exemplary embodiment there is shown therein a portion of an automated banking machine, generally indicated as 810. The machine 810 includes a housing 812 mounted atop a chest (not shown). The housing includes a first side wall (not shown), a second side wall 816, a rear wall 819, and a top wall 818, and defines a front opening 822. Also shown in FIG. 23, is an exemplary embodiment of a pivotable component rack 890. The pivotable component rack 890 is in operatively supported connection with the housing 812 and is operatively supported by the housing 812 through a pivot 896. The pivotable component rack 890 may support one or more serviceable components, generally 876. The pivot 896 is adapted to enable the one or more components, generally 876, and their pivotable component rack 890 to be moved away from the housing 812 for servicing by the servicer 402. As will be appreciated by those skilled in the art, the pivot 896 may alternatively be disposed in a vertical orientation.

An exemplary embodiment includes a method for accessing and servicing the contents, and particularly the serviceable components, of the housing to, but not limited to, clean, repair, or replace parts, make adjustments, replenish consumables such as paper, print materials, and lubricants, or exchange components. The method includes releasing the lock holding the cover adjacent to the opening of the housing of the automated banking machine and moving the cover away from the housing, wherein the cover remains in operatively supported connection with the housing, and wherein the cover is operatively supported by the housing through two horizontally disposed members. In an exemplary embodiment, the members are slideable horizontally disposed members and the method includes the step of sliding the cover away from the housing. The method further includes standing between the two horizontally disposed members and servicing at least one serviceable component of the automated banking machine. In a further exemplary embodiment, the method includes moving out from between the two horizontally disposed members, moving the cover back toward the housing, whereby the cover is positioned adjacent the housing opening, and securing the lock.

In a further exemplary embodiment, the method further includes moving the at least one component away from the housing for servicing. In a further exemplary embodiment, the step of moving the at least one component away from the housing includes sliding the at least one component away from the housing, pivoting at least a portion of the at least one component away from the housing, sliding a tray supporting the at least one component away from the housing, and sliding a rack supporting the at least one component away from the housing while standing between the two horizontally disposed members.

In a further exemplary embodiment, the method further includes moving the at least one component back into the housing after servicing. In a further exemplary embodiment, the step of moving the at least one component back into the housing includes sliding the at least one component back into the housing, pivoting the at least one portion of the at least one component back into the housing, sliding the tray supporting the at least one component back into the housing, and sliding the rack supporting the at least one component back into the housing while standing between the two horizontally disposed members.

As will be appreciated by those skilled in the art, the at least one component may alternatively be in operatively supported connection with the cover and the method include moving the at least one component moved away from the cover for servicing, servicing the at least one component, and subsequently moving the at least one component back to the cover. As will also be appreciated by those skilled in the art, the cover may comprise a fascia or a rear panel.

Exemplary embodiments may also include features described in U.S. Pat. Nos. 8,091,784; 8,090,663; 8,104,674; 8,104,676; 8,091,778; 8,100,323; 8,083,136; 8,070,055; 8,083,131; 8,079,512; 8,061,591; 8,052,049; 8,052,045; 8,052,044; 8,052,042; 8,061,593; 7,255,266; 7,251,626; 7,249,761; 7,246,082; 7,240,829; 7,240,827; 7,234,636; 7,229,009; 7,229,012; 7,229,008; 7,222,782; 7,216,801; 7,216,800; 7,216,083; 7,207,478; 7,204,411; 7,195,153; and 7,195,237 the disclosures of each of which are incorporated herein by reference in their entirety.

Figure 24:
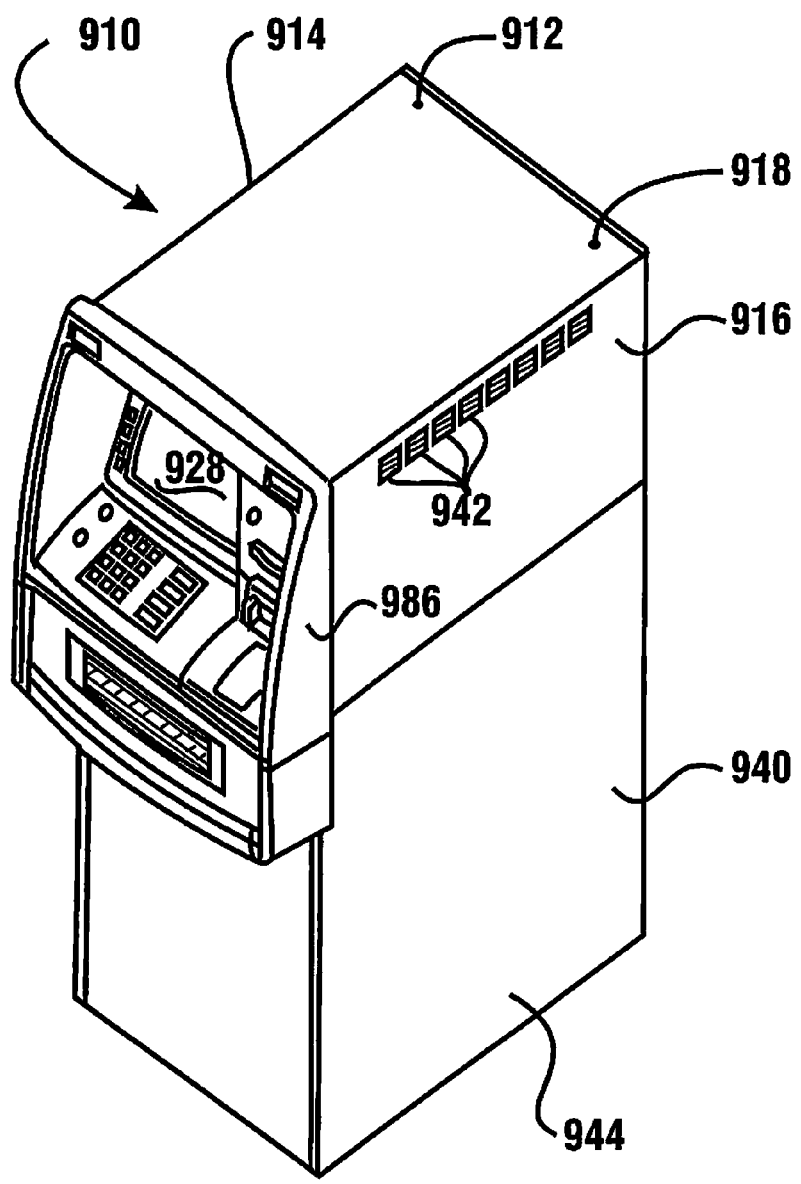
FIG. 24 is an isometric view of an automated banking machine of an exemplary embodiment.

With reference to FIG. 24, in this exemplary embodiment there is shown therein an automated banking machine, generally indicated as 910. The machine 910 includes a housing 912 mounted atop a secure chest 940. The chest 940 may be enclosed in a chest housing 944 or may itself comprise the exterior walls of a portion of the machine. The housing 912 bounds an interior area and includes a first sidewall 914, a second sidewall 916, and a top wall 918. The walls define an opening 22 (shown in exemplary fashion in FIG. 2) to an interior area 20 (shown in exemplary fashion in FIG. 2). The housing 912 further includes housing vents 942 formed in the sidewalls 914, 916 which provide ventilation and enable the movement of air into or out of the housing 912. In the exemplary embodiment air is moved to help cool electronic parts contained, for example, in a component case 924 (FIG. 25).

An upper fascia 986 provides an attractive appearance as well as security. The fascia 986 is in operatively supported connection with the housing 912 and moveable between a secure closed position adjacent to the housing opening 22 and a released away position. (FIGS. 1 and 2.) In the exemplary embodiment, a card reader 24 (shown in exemplary fashion in FIG. 3) is in operatively supported connection with the housing 912 and is operative to read indicia on user cards corresponding to financial accounts. Also in the exemplary embodiment, a display 928 and a cash dispenser 64 (shown in exemplary fashion in FIG. 3) are in operatively supported connection with the housing 912. The component case 924 (FIG. 25), which in the exemplary embodiment comprises a processor case, is in operatively supported connection with the housing 912 and may contain computer processors, circuit cards, memory devices and other electronic components (not shown). As shown in FIG. 26, but best seen in FIG. 27, the component case 924 further includes one or more component case vents 943 which may cooperate with one or more fans or other air movement devices (not shown) to help move air to and from the inside of the case and ventilate the interior of the component case 924.

Figure 25:
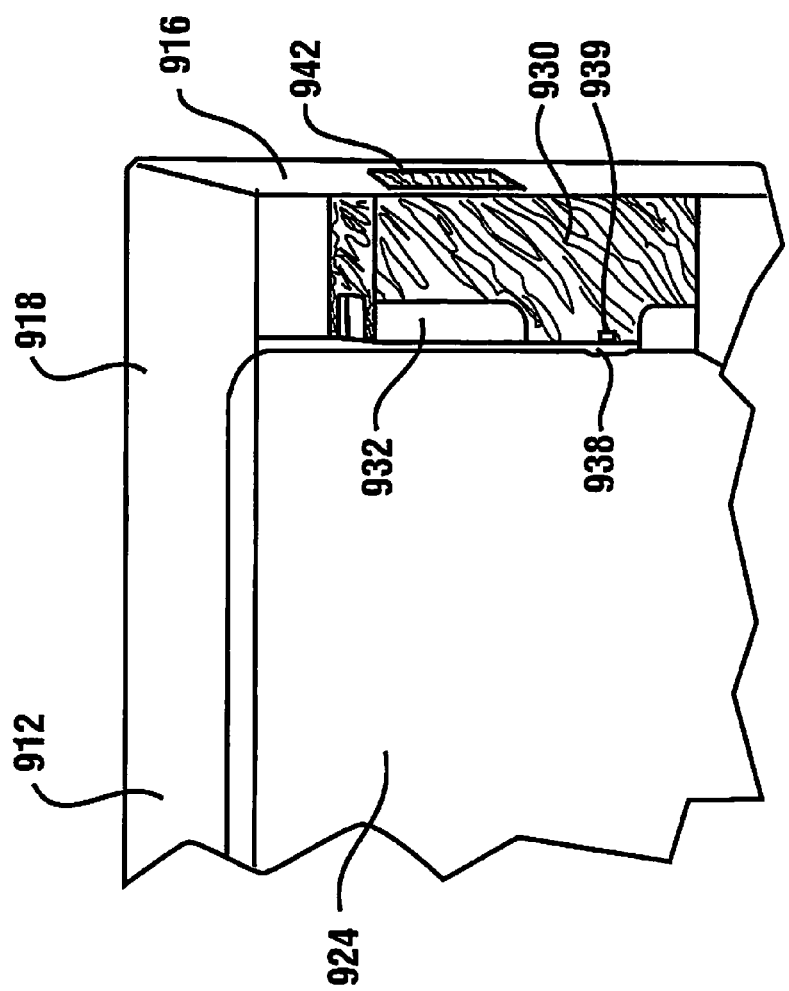
FIG. 25 is a view of a portion of an automated banking machine of an exemplary embodiment illustrating a component case assembled into a top housing.
Figure 26:
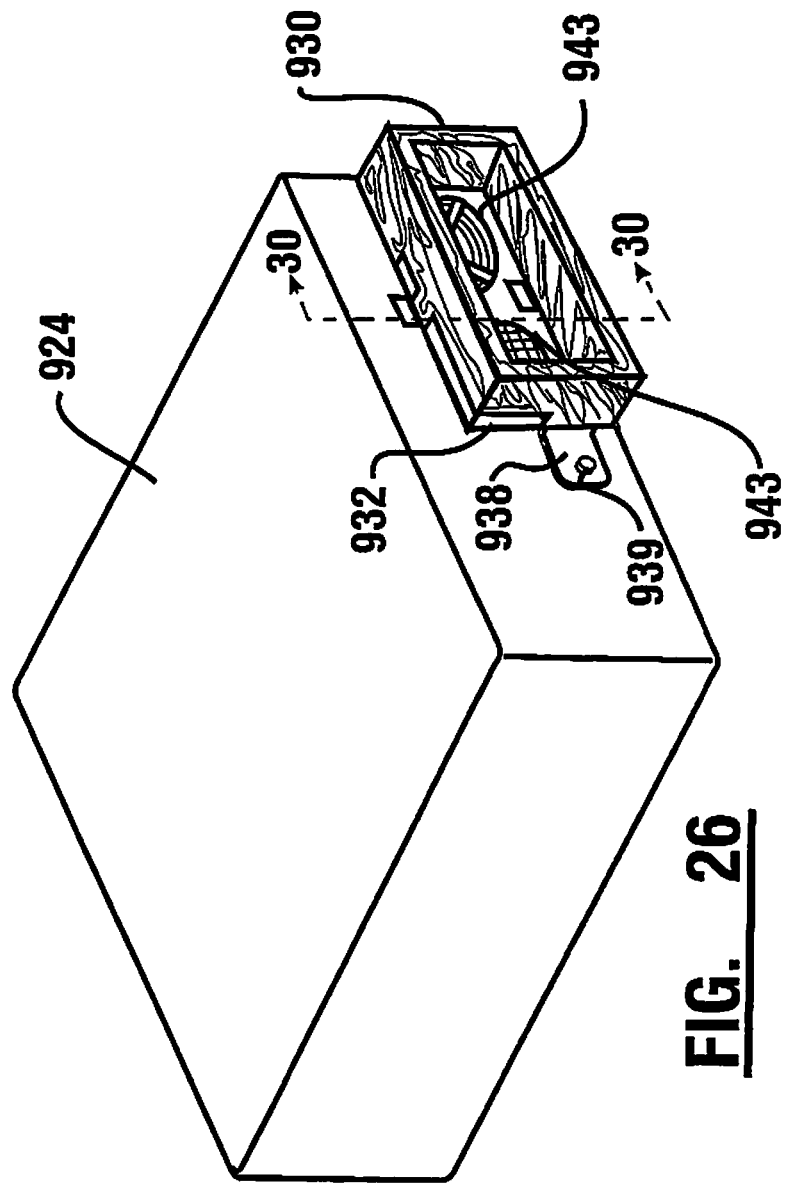
FIG. 26 is an isometric view of a portion of an automated banking machine of an exemplary embodiment illustrating a component case in combination with a duct assembly.

As will be understood from FIGS. 24 and 25, ventilation air from the interior of the component case 924 may not easily reach or be drawn from outside the housing 912 which encloses the case 924 as well as other components of the machine 910. As shown in exemplary fashion in FIG. 25, a duct 930 is operatively disposed between the component case 924 at the component case vents 943 (FIGS. 26 and 27) and the housing sidewall 916 at the at least one housing vent 942 (FIGS. 24 and 25). Air from the interior of the component case 924, by way of example only, warm air heated by the operation of processors or other components within the case 924, may then be guided within the duct to outside the housing 912. Likewise, in some embodiments and depending upon the direction of air flow, cooler air from outside the housing 912 may be guided to the interior of the component case 924. In an exemplary embodiment, the duct 930 is adhered to the component case 924 with an adhesive 936 (shown in exemplary fashion in FIG. 30). In a further exemplary embodiment, the duct 930 may be alternatively and/or in addition adhered to the inside wall of the housing 912. In a further exemplary embodiment, the adhesive 936 is releasable. In a further exemplary embodiment, the adhesive is resealable. Thus, the duct 930 may be released from its position and later resealed. This may be accomplished in exemplary embodiments by sealants which remain flexible and tacky at ambient temperatures.

Figure 27:
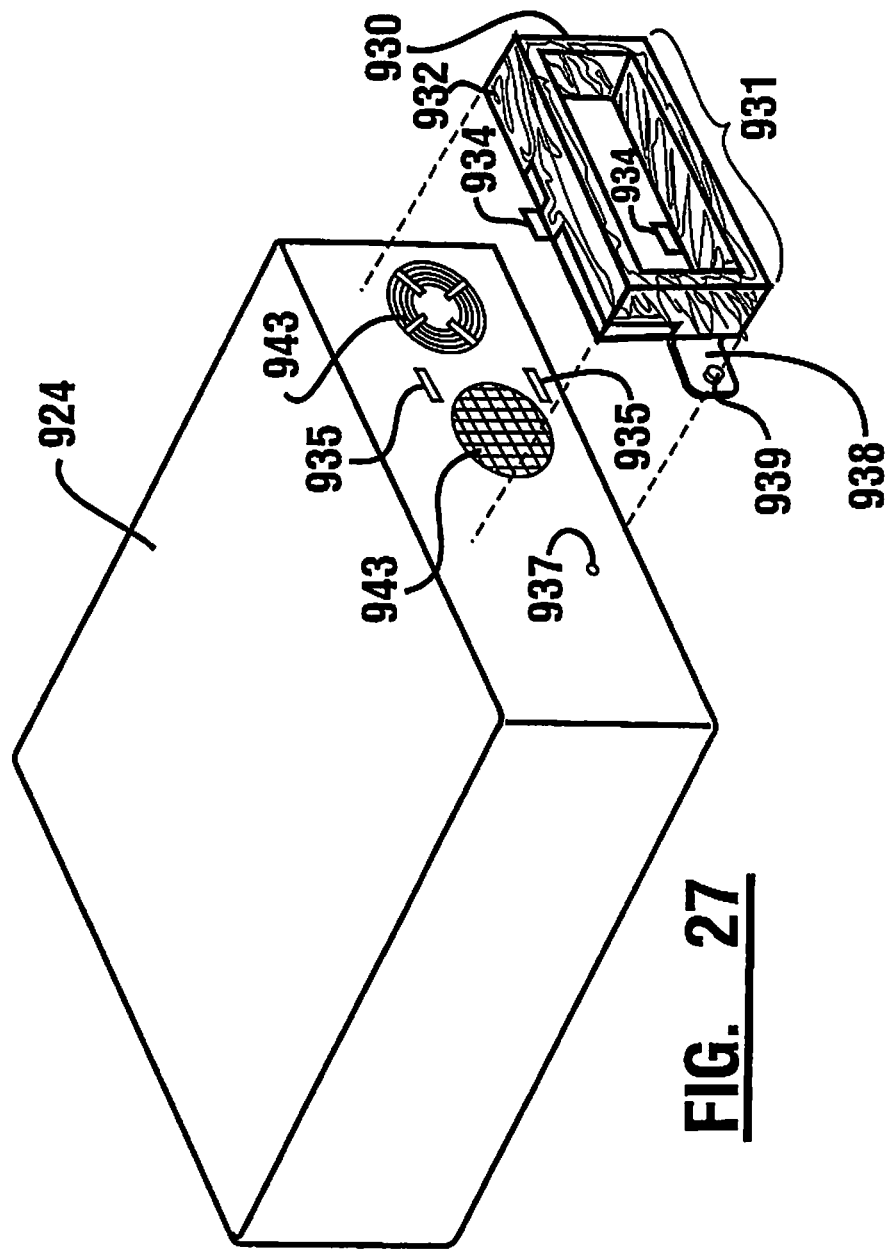
FIG. 27 is an exploded isometric view of the automated banking machine of the exemplary embodiment of FIG. 26.
Figure 28:
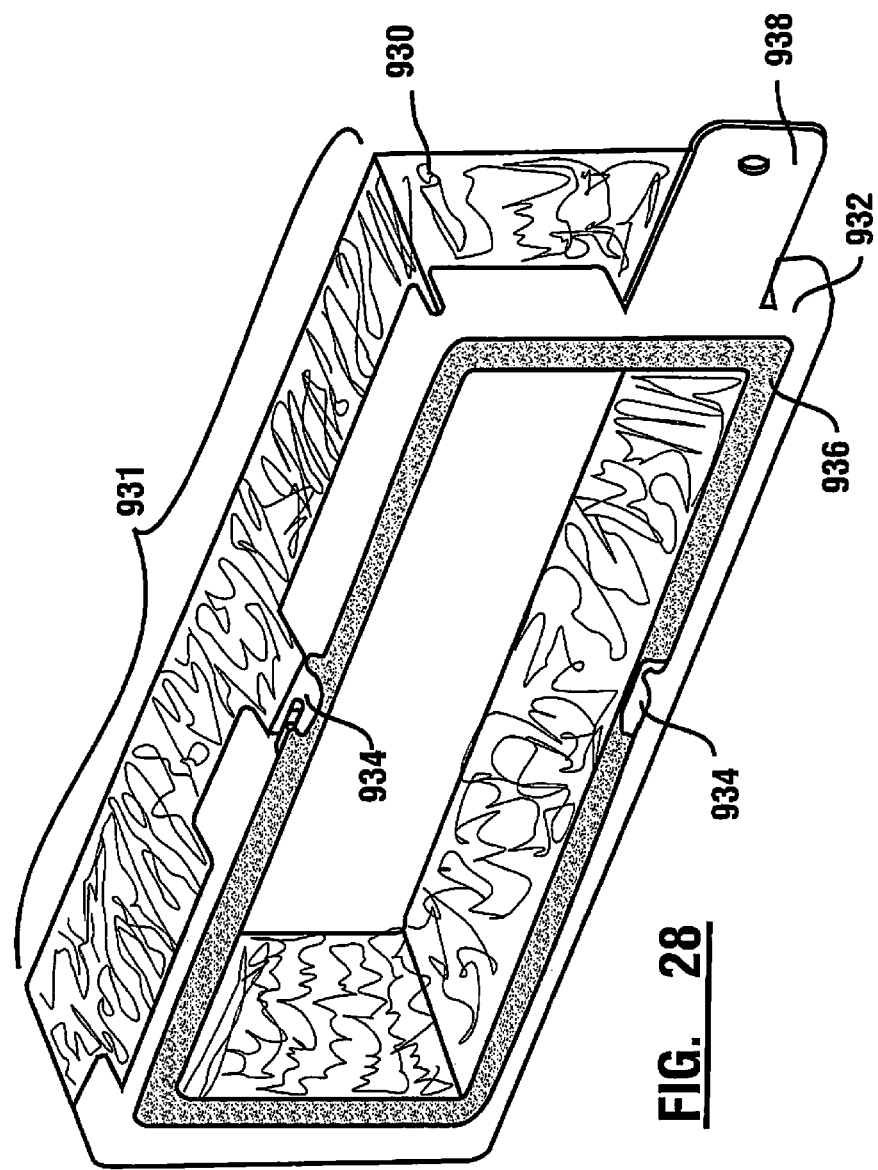
FIG. 28 is an isometric view of a duct assembly portion of an automated banking machine of an exemplary embodiment illustrating the details of the duct assembly.
Figure 29:
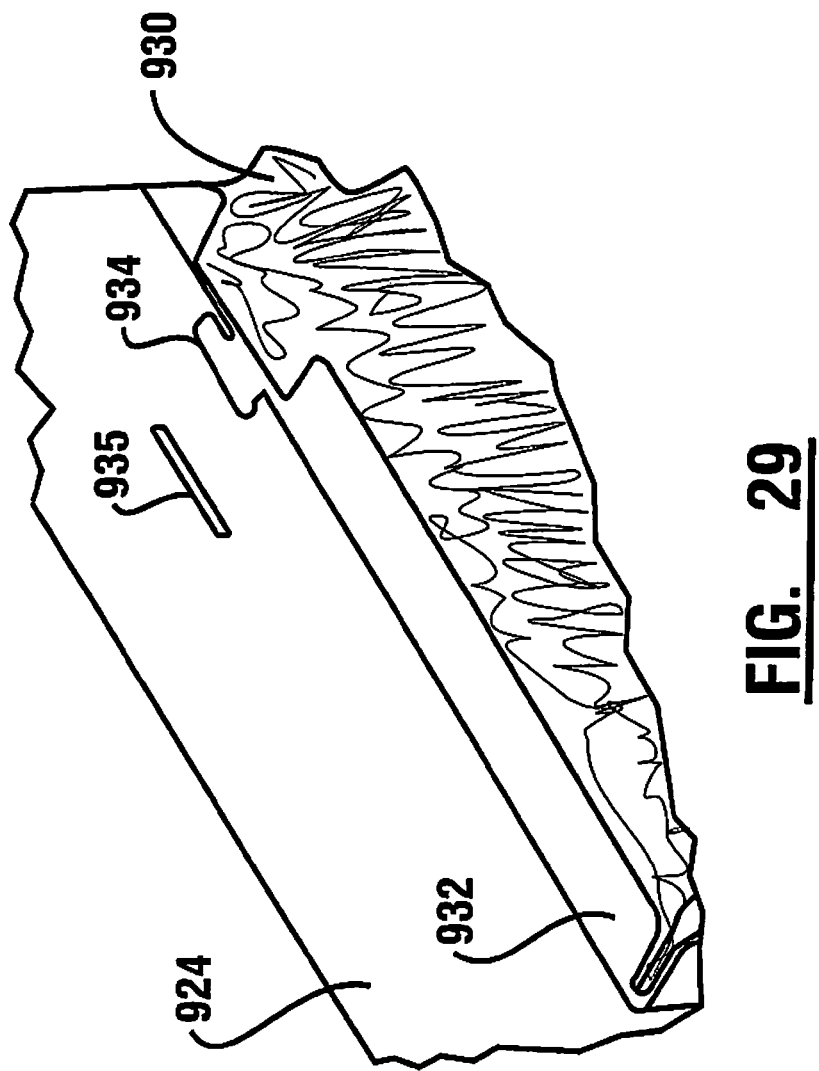
FIG. 29 is an isometric view of a portion of a duct assembly portion and a portion of a component case portion of an automated banking machine of an exemplary embodiment illustrating the details of the duct assembly and component case.
Figure 30:
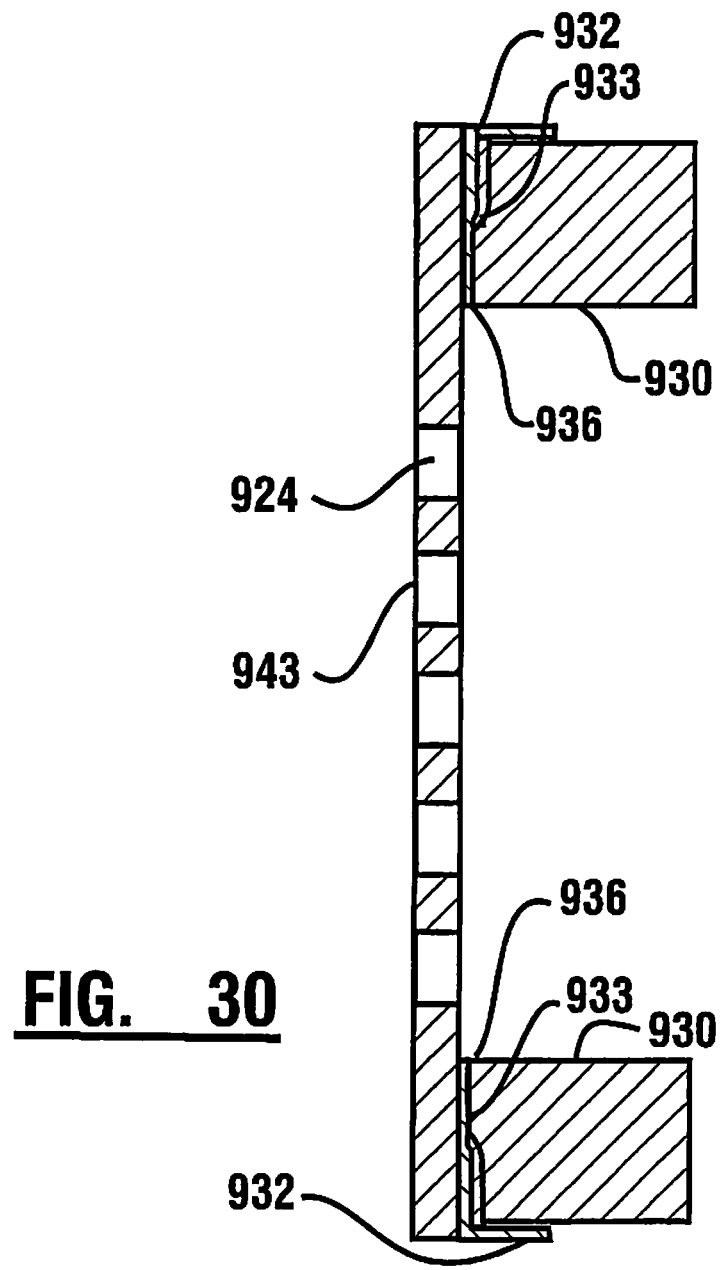
FIG. 30 is a partial section view taken along the line 30-30 of FIG. 26.

A further exemplary embodiment is shown in FIGS. 27 and 28 which generally illustrate an exemplary duct assembly 931. The duct assembly 931 may comprise a resilient deformable duct 930 to which a frame 932 has been secured. In other embodiments ducts may be comprised of other enclosed structures operative to conduct air therethrough. In a further exemplary embodiment, the frame 932 may be comprised of a relatively rigid material and may include one or more tab portions 938, one or more hook portions 934, or combinations of tab portions 938 and hook portions 934. In an exemplary embodiment, the frame 932 is adhered to the duct 930 with an adhesive 936 (FIGS. 28 and 30). In a further exemplary embodiment, the one or more tab portions 938 cooperate with, for example, one or more fasteners 939 (FIGS. 25 and 27) which can extend in and engage one or more apertures 937 in the component case 924 to reliably secure the duct 930 to the component case 924. While the fastener 939 is shown as a screw, it is to be understood that other fasteners may be employed. In an exemplary embodiment, the one or more hook portions 934 are configured to cooperate with and engage one or more component case slots 935 to reasonably secure the duct 930 to the component case 924. In the secured position the duct extends in surrounding relation of one or more processor case vents. While the duct assembly 931 is shown in exemplary fashion as secured to the component case 924, the duct assembly 931 may be secured to the housing 912, for example, the housing sidewall 916, or to other cases or elements of the machine 910.

In a further exemplary embodiment, as shown in FIG. 30, the duct assembly 931 is adhered to the component case 924 with adhesive 936. The adhesive 936 is secured to an edge face 933, proximate the component case 924, and the duct assembly 931 adhered to the component case 924. As shown in FIG. 30, the adhesive 936 may secure the frame 932 to the duct 930 and the adhesive 936 may secure the duct assembly 931 to the component case 924. It is to be understood that the adhesive material used to secure the frame 932 to the duct 930 may not be the same adhesive material used to secure the duct assembly 931 to the component case 924. In a further exemplary embodiment, the frame 932 is secured to the duct 930 by other means. As can be seen from FIG. 30, forming the duct 930 from deformable resilient material, such as foam, enables the duct 930 to deform around the frame 932 thickness and contact the component case 924.

In an exemplary embodiment, a method is performed. The fascia 986 is moved from a position adjacent the opening 22 (FIG. 2) to the interior 20 of the housing 912 of the automated banking machine 910, to a position away from the opening 22. The component case 924 is moved from a position within the interior 20 of the housing 912 to a position at least partially extending through the opening 22. The duct assembly 931, at least partially secured to the component case 924 with the releasable resealable adhesive 936, is released and separated from the component case 924. A component (not shown), at least partially contained within the component case 924 is serviced. This may include replacing or adjusting a circuit card, processor board, a hard drive, a transformer or other component, for example. The duct assembly 931 is adhered to the component case 924, and the component case 924 moved from the position at least partially extending through the opening 22 to the position within the interior 20 of the housing 912. The fascia 986 is moved from the position away from the opening 22 of the housing 912 to the position adjacent the opening. In a further embodiment, the duct assembly 931, comprising the resilient deformable duct 930 with releasable resealable adhesive 936 secured thereto, the duct 930 is deformed to adhere to the component case 924. The duct 930 may also be comprised of combinations or portions of relatively rigid and other portions of resilient material. In a further embodiment, the duct assembly 931, further comprising the duct frame 932 having at least one hook portion 934 and the component case 924, further comprising the at least one slot 935, the at least one hook portion 934 is mated and engaged with the at least one slot 935. In a further embodiment, the duct assembly 931 further comprises the frame 932 having at least one tab portion 938 and an least one fastener 939 in operative connection with the at least one tab 938 and the component case 924 further includes at least one fastener hole 937. The at least one fastener 939 is mated with the at least one fastener hole 937. In some embodiments the duct 930 may be comprised of a relatively rigid material such as rigid plastic or sheet metal, for example.

In a further exemplary embodiment, a method is provided. The housing 912 is mounted in supporting connection with the chest 44 (FIG. 2). The card reader 24 (FIG. 3) is installed in operatively supported connection with the housing 912, the display 928 is installed in operatively supported connection with the housing 912, and a cash dispenser 64 (FIG. 3) is installed in operatively supported connection with the housing 912. The component case 924, having at least one component case vent 943, is installed in operatively supported connection with the housing 912. The duct assembly 931, including a duct 930 is adhered to the component case 924. In a further exemplary embodiment, the duct assembly 931 further includes a frame 932 and the method further includes securing the frame 932 to the duct 930. In a further exemplary embodiment, the frame 932 is adhered to the duct 930. In a further exemplary embodiment, the frame includes at least one hook portion 934 and the component case 924 further includes at least one slot 935, the slot 935 adapted to accept the at least one hook portion 934, the method further comprising mating the at least one hook portion 934 and the at least one slot 935. In a further exemplary embodiment, the frame 932 includes at least one tab portion 938, the duct assembly 931 further includes at least one fastener 939, and the component case 924 further includes at least one fastener hole 937. The method further comprises mating the at least one fastener 939 and the at least one fastener hole 937.

In still other embodiments a resilient duct may be positioned within the interior of the machine. The duct may extend in surrounding relation of one or more housing vents and processor case vents. The duct face at one or more ends may be secured to an adjacent wall surface with a resealable or a single use adhesive. In some embodiments the adhesive may be replenished each time the duct is reengaged.

While the exemplary embodiments include particular structures to achieve the desirable results, those having skill in the art may devise numerous other embodiments with other structures which employ the principles described herein and which are encompassed by the subject matter as claimed.

Figure 31:
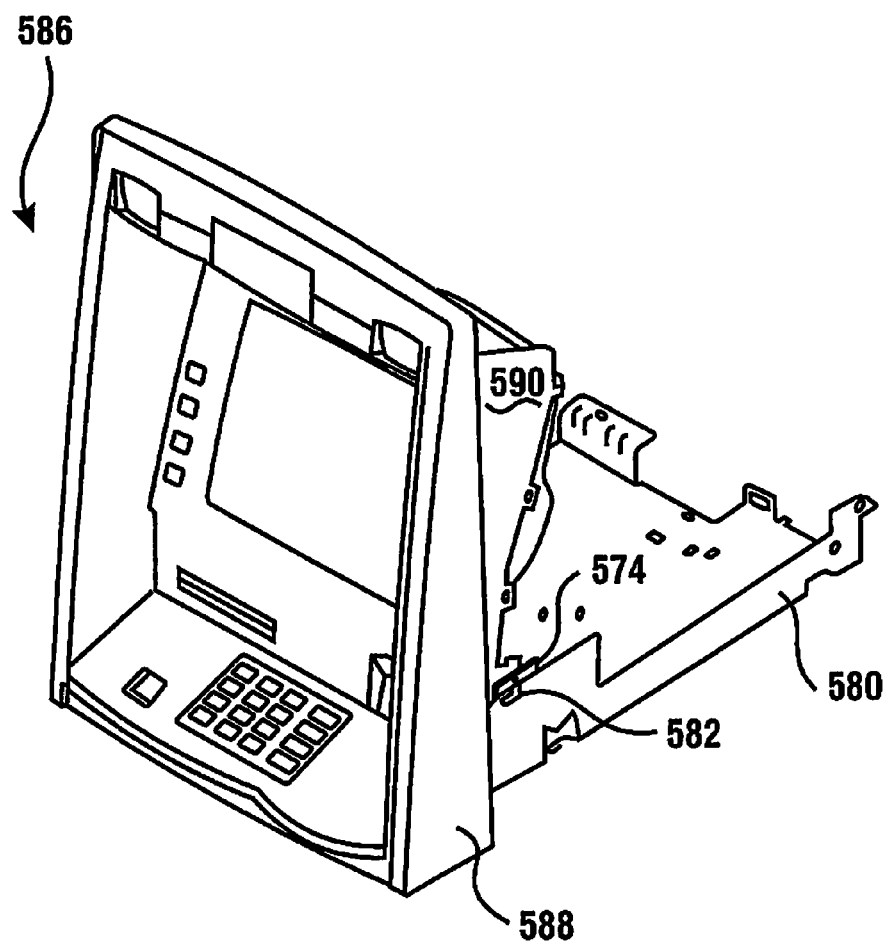
FIG. 31 is an isometric view of a portion of an exemplary automated banking machine illustrating a fascia assembly and a support.

Turning now to FIG. 31, there is shown therein a portion of an automated banking machine of a further exemplary embodiment. (See FIG. 1 for a general exemplary embodiment of an automated banking machine.) In this exemplary embodiment, a fascia assembly 589 comprises a fascia cover 588 operatively connected to a fascia frame 590. While the fascia cover 588 and fascia frame 590 may be described in the exemplary embodiment as separate elements, it is to be understood the fascia cover 588 and the fascia frame 590 may in some embodiments be of a single-piece construction. Also shown in FIG. 31 is a support 580. The support 580 may comprise a tray, which tray may further support automated banking machine components such as, by way of example only, a display 28 (e.g., FIG. 2), a card reader 24 (e.g., FIG. 2) and/or a receipt printer 30 (e.g., FIG. 2). The support 580 may comprise slides 84 (e.g., FIG. 2) either in combination with a tray or separately. The fascia assembly 586 is supported, at least in part, by the support 580. The support 580 is further supportively connected to the housing 12 (e.g., FIG. 2) and/or the chest 40 (e.g., FIG. 2).

Figure 32:
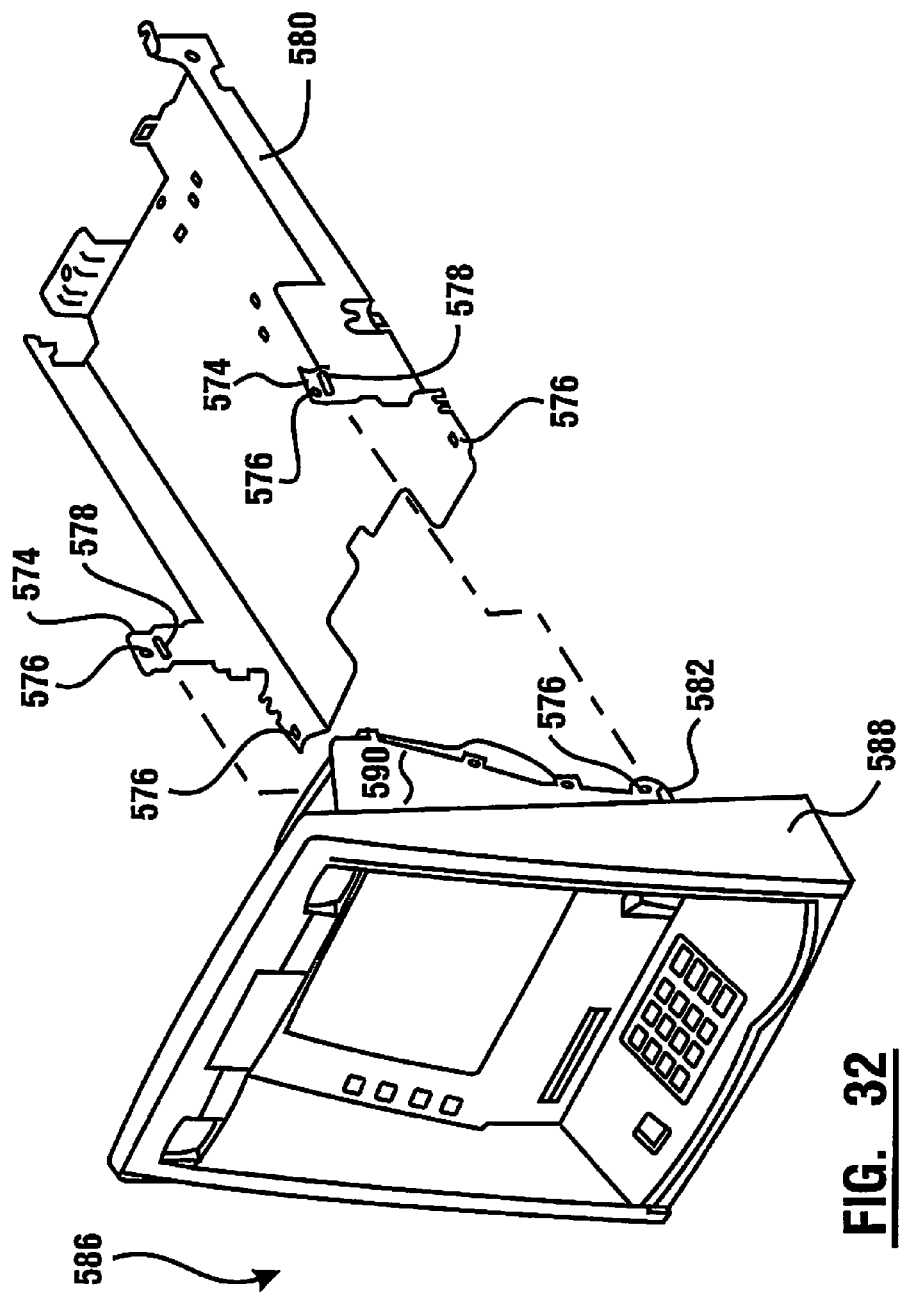
FIG. 32 is an exploded isometric view of a portion of the exemplary automated banking machine of FIG. 31 illustrating the fascia assembly and the support.

Turning now to FIG. 32, there is illustrated an exploded isometric view of the exemplary fascia assembly 586 and exemplary support 580 of FIG. 31 further illustrating the exemplary features. The fascia frame 588 comprises at least one hook 582 and may further comprise two or more hooks 582 (not shown) in spaced-apart relation. The support 580 comprises at least one slot 578 of the exemplary embodiment and may further comprise two or more slots 578. The at least one hook 582 and the at least one slot 578 are formed to enable the at least one hook 582 and the at least one slot 578 to engage and thereby at least partially secure the fascia assembly 586 to the support 580. It is to be understood that either the fascia frame 590 or the support 580 may comprise a hook 582 and the other of the fascia frame 590 or the support 580 comprise a slot 578.

Figure 33:
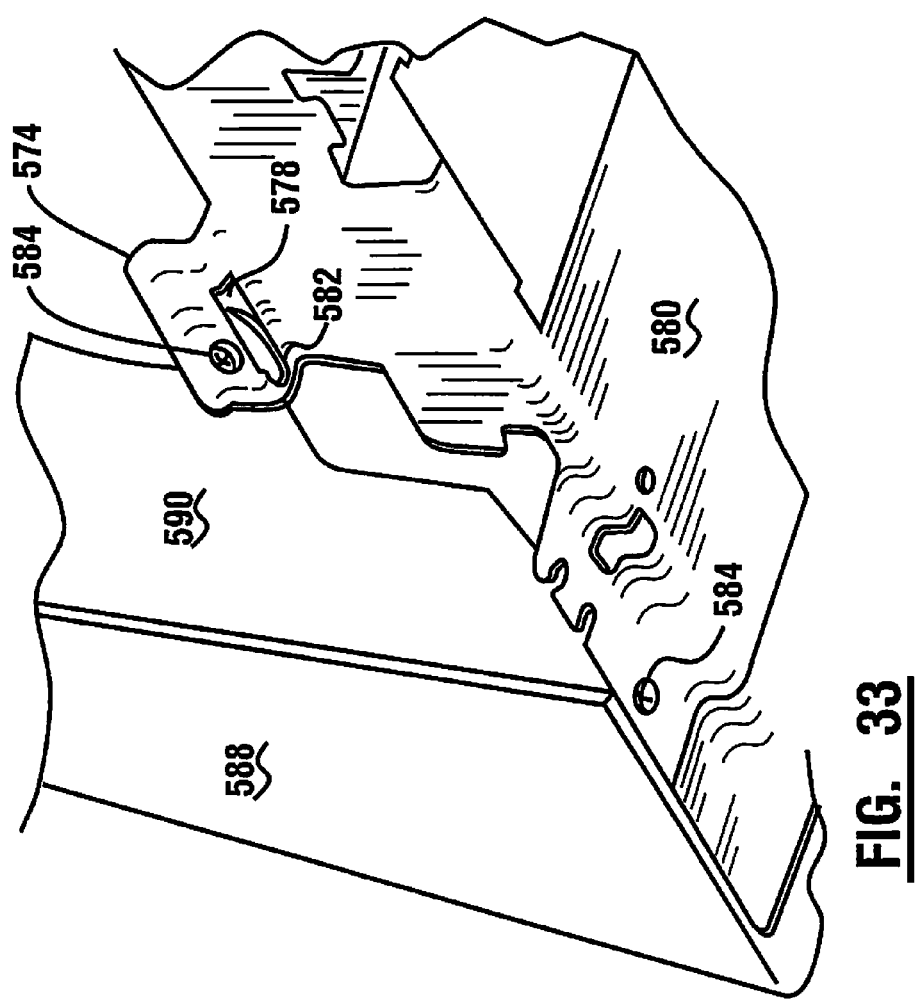
FIG. 33 is an isometric view of a portion of an exemplary automated banking machine illustrating portions of a fascia assembly and a support.
Figure 34:
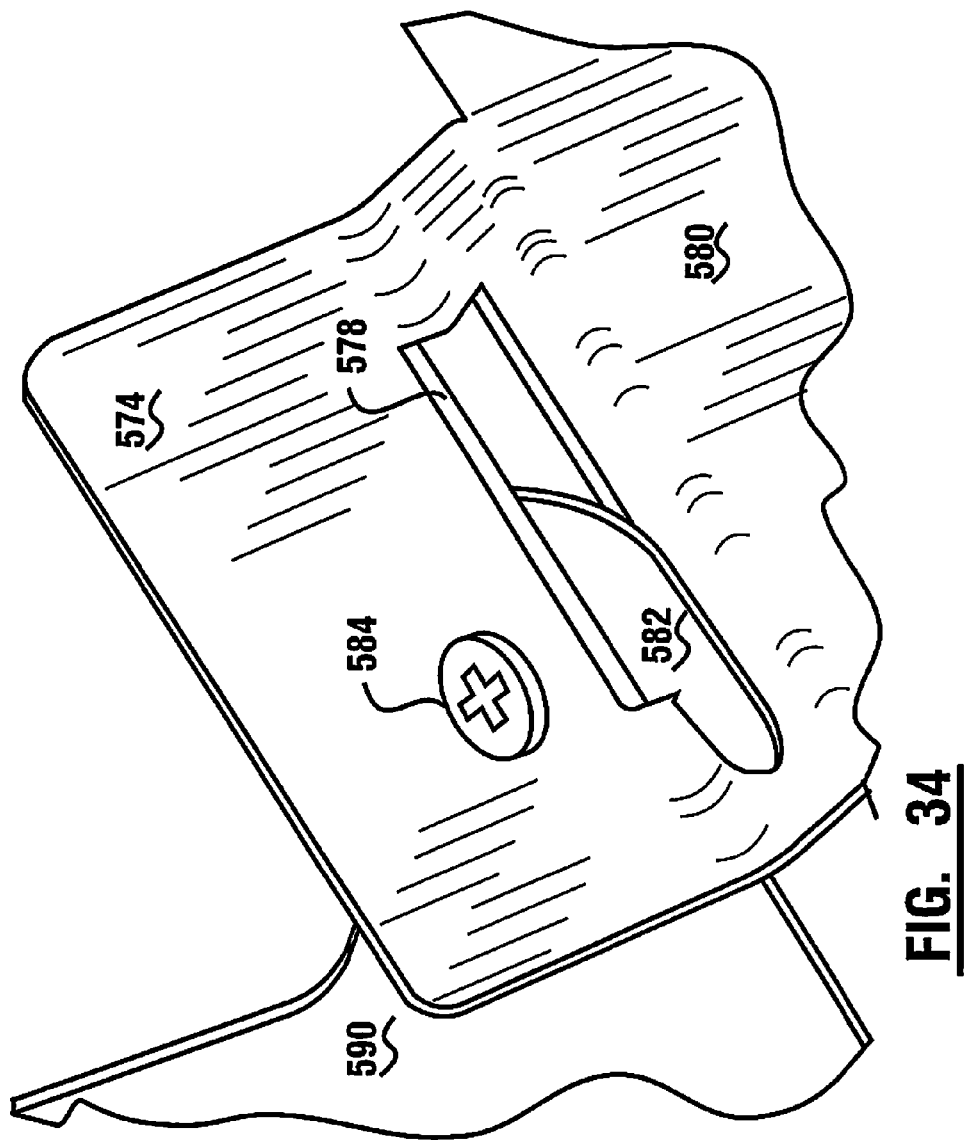
FIG. 34 is an isometric view of a portion of an exemplary automated banking machine illustrating portions of a fascia assembly and a support.

Turning now to FIGS. and 33 and 34, and with reference to FIG. 32, the details of the engagement of the hook 582 and the slot 578 may be further understood. As the hook 582 is engaged with the slot 578, the fascia assembly 589 becomes at least partially supported by the support 580. As such, the fascia assembly 589 may be initially engaged and further secured by a single person. Further, the fascia assembly 589 may be unsecured and disengaged by a single person. As best seen in FIGS. 33 and 34, the hook 582 may be offset from the slot 578 and thus provide a positive engagement between the hook 582 and the slot 578. To further secure the fascia assembly 589 to the support 580, one or more fasteners 584 may be utilized. By way of example only, as shown in FIGS. 33 and 34, a screw 584 may engage screw holes 576 in the fascia frame 590 and in the support 580.

The support 580 may further comprise one or more tabs 574 which may serve to guide the one or more hooks 582 into the one or more slots 578. As with the hooks 582 and the slots 578, it is to be understood that either the fascia frame 590 or the support 580 may comprise one or more tabs 574.

In an exemplary method, referring also to FIGS. 2, 3, and 31-34, the method comprises mounting a housing 12 in supporting connection with a chest 40 adapted for use in an automated banking machine 10, the housing 12 comprising an interior 20 and at least one opening 22 into the interior 20. The method comprises installing a card reader 24 in operatively supported connection with the housing 12, wherein the card reader 24 is operative to read indicia on user cards corresponding to financial accounts. The method comprises installing a display 28 in operatively supported connection with the housing 12. The method comprises installing a cash dispenser 64 in operatively supported connection with the housing 12. The exemplary method comprises installing a printer 30 in operatively supported connection with the housing 12 and operative to print information corresponding to financial accounts and financial transactions. It is understood the card reader 24, the display 28, the cash dispenser 64, and the printer 30 may be mounted onto various elements of the automated banking machine 10, including, but not limited to, a support 580 which may comprise a tray. The method comprises installing the support 580 in operatively supported connection with the housing 12, the support 580 moveable between a position substantially within the interior area 20 of the housing 12 and a position wherein at least a portion of the support 580 is extended through the housing opening 20. (Best understood by reference to FIG. 2.) The method comprises mounting a fascia assembly 589 to the support 580, the fascia assembly 589 comprising a fascia frame 590 and a fascia cover 588 in operatively supported connection with the fascia frame 590. At least one of the fascia frame 590 and the support 580 comprises at least a first hook 582 and the other comprises at least a first slot 578, the at least first hook 582 and the at least first slot 578 formed to engage each other. The method comprises engaging the at least first hook 582 with the at least first slot 578.

The exemplary method further comprises moving the at least first hook 582 to an offset position relative to the at least first slot 578. (Best seen in FIGS. 33 and 34.)

The exemplary method further comprises securing the fascia assembly 589 to the support 580 with, for example, a fastener 584 such as a screw.

The exemplary method further comprises moving the fascia assembly 589 to a secure closed position adjacent the housing opening 22. (Best seen in FIG. 1.)

In a further exemplary method, the method comprises moving a fascia assembly 589 in operatively supported connection with a housing 12 of an automated banking machine 10 from a secure closed position adjacent an opening 22 to an interior 20 of the housing 12 to a released away position away from the opening 22. (Best seen in FIGS. 1 and 2.) The automated banking machine 10 comprises a card reader 24 in operatively supported connection with the housing 12 and operative to read indicia corresponding to financial accounts on user cards, a display 28 in operatively supported connection with the housing 12, a printer 30 in operatively supported connection with the housing 12 and operative to print information corresponding to financial accounts and financial transactions, a cash dispenser 64 in operatively supported connection with the housing 12, and a support 580 in operatively supported connection with the housing 12, the support 580 moveable between a position substantially within the interior 20 of the housing 12 and a position wherein at least a portion of the support 580 is extended through the housing opening 22. (Best seen in FIGS. 1 and 2.) The fascia assembly 589 comprises a fascia frame 590 and a fascia cover 588 in operatively supported connection with the fascia frame 590. At least one of the fascia frame 590 and the support 580 comprises at least a first hook 582 and the other comprises at least a first slot 578, the at least first hook 582 and the at least first slot 578 formed to engage each other. The method comprises disengaging the at least first hook 582 from the at least first slot 578. The method comprises servicing at least one of a serviceable automated banking machine component. Such serviceable automated banking machine components include, for example, the card reader 24, the display 28, the printer 30, and the cash dispenser 64. The method comprises engaging the at least first hook 582 with the at least first slot 578. The method comprises moving the fascia assembly 589 from the released away position from the opening 22 to the secure closed position adjacent the opening 22. (Best seen in FIGS. 1 and 2.)

The fascia assembly 589 may be secured to the support 580 with one or more fasteners 584 and the method further comprise releasing the one or more fasteners 584 securing the fascia assembly 586 to the support 580.

The exemplary method further comprises securing the one or more fasteners 584 securing the fascia assembly 586 to the support 580.

As previously mentioned, the rollout tray 80 is movably mounted in supporting connection with slides 84. The rollout tray provides a device support for various types of transaction function devices. Rollout trays may have numerous different configurations and may vary with the size, type and operation of the device supported. In some embodiments the tray may include a support structure separable from the device. In other arrangements the tray (which is sometimes alternatively referred to as a device support) may include a frame or body of the device itself. The example slides 84 enable the device support to extend out of the housing opening 20 of the machine, such that components may be more readily serviced. Slides 84 may be held in engagement with vertically extending sidewalls 14, 16 of the housing 12 through fasteners. The process of fastening the slides in position to the walls via the fasteners can be time consuming during assembly. Removal and installation of the slides is also time consuming during servicing activities in which the slide needs to be removed for access to portions of the serviceable device. In addition, when assembling the machine, the slide has to be installed properly in that the slide can be extended in the desired direction. Also, slides may break and need to be replaced. Further, if a machine is going to be reconfigured with a device support that is moveable between a position substantially within the interior 20 of the housing 12 and a position wherein at least a portion of the device support is extended through a housing opening in the rear of the machine, the slides may need to be repositioned in the housing to accommodate the device support.

FIGS. 35-52 illustrate an exemplary embodiment that overcomes the above-mentioned problems by providing an apparatus that allows for a quick and easy way to install and remove slides that support device supports. In addition, the apparatus includes first and second slides 1000, 1002 that can be engaged with the housing 12 through a set of slots to extend the device support through the front of the machine, or the same slides can be engaged with the same set of slots to extend the device support through the rear of the machine.

Figure 37:
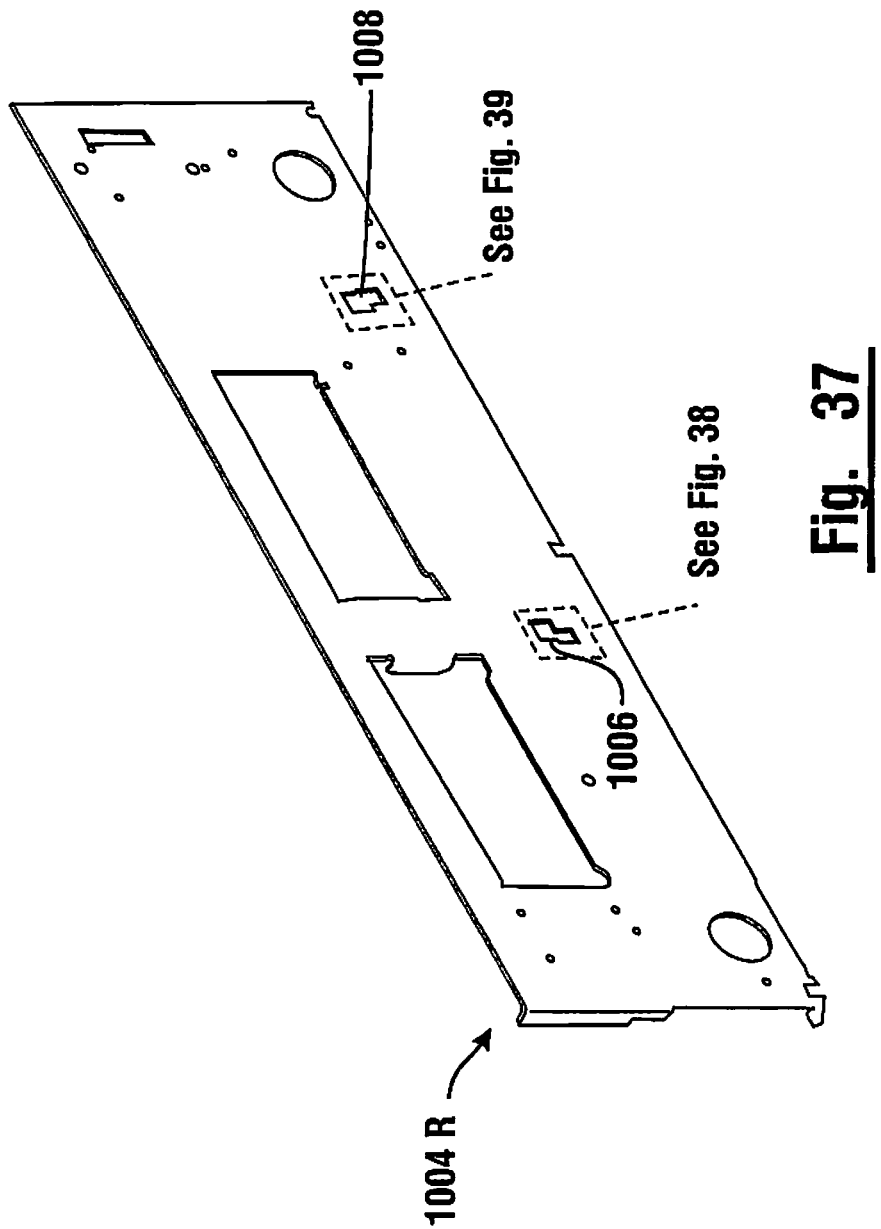
FIG. 37 is a front and right side isometric view of the right bracket of the housing of the exemplary automated banking machine of FIG. 35.

In this embodiment, the first and second slides 1000, 1002 may be configured to support components of the machine 10 such as printers, check acceptors, and recycler modules on the rollout tray 80. However, the slides 1000, 1002 may be configured to support machine components on the other previously mentioned rollout trays and support 580, or any other device support that is moveable between a position substantially within the interior 20 of the housing 12 and a position wherein at least a portion of the device support is extended through a housing opening. The exemplary slides 1000, 1002 may be removably mounted to wall portions 1004R, 1004L of associated walls of the housing 12. Each portion may be a separate piece that is within the housing. Alternatively, each wall portion may be formed in one piece with a sidewall or interior wall associated with the housing. The example right wall portion 1004R (best seen in FIG. 37) of the right sidewall 16, or other wall, is a mirror image of the left wall portion 1004L (best seen in FIGS. 40 and 41) of the left sidewall 14 or other wall. The right wall portion 1004R includes a pair of slots, which are referred to herein as front slot 1006 and rear slot 1008 as depicted in FIG. 37.

Referring to FIG. 38, the example front slot 1006 is generally inverted L-shaped and includes a horizontally extending upper leg portion 1010 and a vertically extending lower leg portion 1012. The upper leg portion 1010 extends a further distance in the rearward direction (relative to the front of the machine housing) than the lower leg portion 1012. The upper leg portion 1010 is bounded by vertically extending front and rear ends 1014, 1016, and horizontally extending top and bottom ends 1018, 1020. The front and rear ends 1014, 1016 are interconnected to each other by the top end 1018. The bottom end 1020 extends forwardly from the rear end 1016 a distance less than the length of the top end 1018. The bottom end 1020 includes a horizontal surface 1022 that in the operative position of the machine faces upwardly. The upper leg portion 1010 is open between the bottom end 1020 and the front end 1014. The lower leg portion 1012 is bounded by vertically extending front and rear ends 1024, 1026 are interconnected by a bottom end 1028. The front end 1024 of the lower leg portion 1012 is positioned forwardly offset from the front end 1014 of the upper leg portion 1010 to define a step 1030. In an operative position the step 1030 includes a step surface 1032 that in the operative position of the machine faces downwardly. The lower leg portion 1012 is open at its top, which is opposite of the lower leg bottom end.

Referring to FIG. 39, the exemplary rear slot 1008 is a mirror image of the front slot and has a generally inverted L-shaped and in the operative position includes a horizontally extending upper leg portion 1034 and a vertically extending lower leg portion 1036. The upper leg portion 1034 extends further in the forward direction (relative to the machine housing) than the lower leg portion 1036. The upper leg portion 1034 is bounded by vertically extending front and rear ends 1038, 1040, and horizontally extending top and bottom ends 1042, 1044. The front and rear ends 1038, 1040 are interconnected to each other by the top end 1042. The bottom end 1044 extends rearwardly from the front end 1038 a distance less than the length of the top end 1042. The bottom end 1044 includes a horizontal surface 1046 that in the operative position faces upwardly. The upper leg portion 1034 is open between the bottom end 1044 and the rear end 1040. The lower leg portion 1036 is bounded by vertically extending front and rear ends 1048, 1050 that are interconnected by a horizontally extending bottom end 1052. The rear end 1050 of the lower leg portion 1036 is positioned rearwardly offset from the rear end 1040 of the upper leg portion 1034 to define a step 1054. The step includes a step surface 1056 that in the operative position faces downwardly. The lower leg portion 1036 is open at its top, which is opposite the lower leg portion bottom end.

FIGS. 40 and 41 show rear and left side isometric views with respect to the machine 10 of portions of the left wall portion 1004L of the left side wall 14 or other wall of the housing 12. As depicted in FIGS. 40 and 41, the left wall portion 1004L includes a front slot 1058 and a rear slot 1060. Referring to the rear and left side isometric view of FIG. 41, the front slot 1058 is a generally inverted L-shape and in the operative position includes a horizontally extending upper leg portion 1062 and a vertically extending lower leg 1064. The upper leg portion 1062 extends a further distance in the rearward direction than the lower leg portion 1064. The upper leg portion 1062 is bounded by vertically extending front and rear ends 1066, 1068, and horizontally extending top and bottom ends 1070, 1072. The front and rear ends 1066, 1068 are interconnected to each other by the top end 1070. The bottom end 1072 extends forwardly from the rear end 1068 a distance less than the length of the top end 1070. The bottom end 1072 includes a horizontal surface 1074 that in the operative position faces upwardly. The upper leg portion 1062 is open between the bottom end 1072 and the front end 1066. The lower leg portion 1064 is bounded in the operative position by vertically extending front and rear ends 1076, 1078 that are interconnected by a horizontally extending a bottom end 1079. The front end 1076 of the lower leg portion 1064 is positioned forwardly offset from the front end 1066 of the upper leg portion 1062 to define a step 1080. The step includes a step surface 1082 that in the operative position faces downwardly. The lower leg portion 1064 is open at its top.

Referring to the rear and left side isometric view of FIG. 40, the rear slot 1060 is a generally inverted L-shape and includes a horizontally extending upper leg portion 1086 and a vertically extending lower leg portion 1088. The upper leg portion 1086 extends further in the forward direction than the lower leg portion 1088. The upper leg portion 1086 is bounded by vertically extending front and rear ends 1090, 1092, and horizontally extending top and bottom ends 1094, 1096. The front and rear ends 1090, 1092 are interconnected to each other by the top end 1094. The bottom end 1096 extends rearwardly from the front end 1090 a distance less than the length of the top end 1094. The bottom end 1096 includes a horizontal surface 1098 that in the operative position faces upwardly. The upper leg portion 1086 is open between the bottom end 1096 and the rear end 1092. The lower leg portion 1088 is bounded in the operative position by vertically extending front and rear ends 1100, 1102 that are interconnected by a horizontally extending bottom end 1104. The rear end 1102 of the lower leg portion 1088 is positioned rearwardly offset from the rear end 1092 of the upper leg portion 1086 to define a step 1106. The step 1106 includes a step surface 1108 that in the operative position faces downwardly. The lower leg portion 1088 is open at its top.

Figure 35:
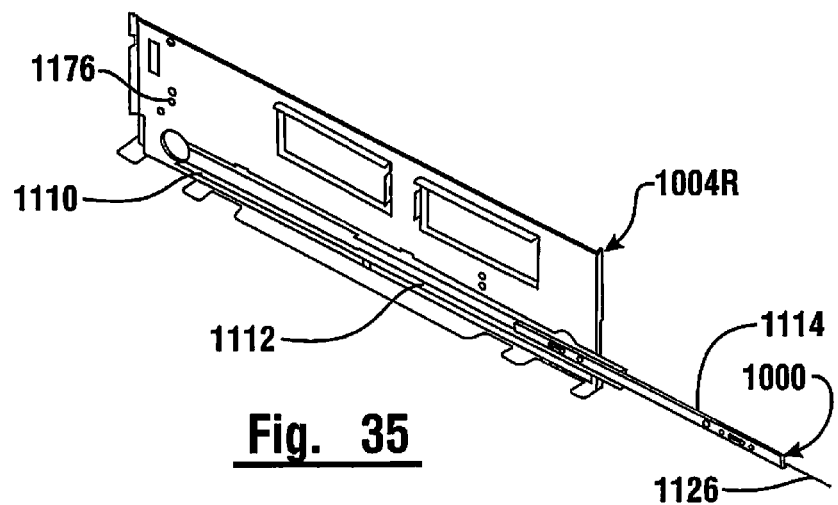
FIG. 35 is a front and left side isometric view of a portion of an exemplary automated banking machine illustrating a first slide mounted to the right bracket of the housing of the machine.
Figure 36:
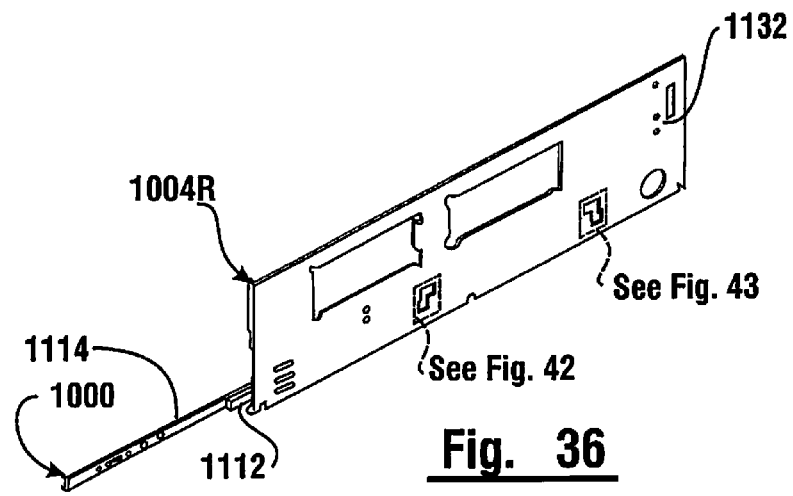
FIG. 36 is a front and right side isometric view of the portion of the exemplary automated banking machine of FIG. 35.

Referring to FIGS. 35 and 36, the exemplary first slide 1000 includes a first channel rail 1110 that slidably receives a second channel rail 1112. The second channel rail 1112 slidably receives a third channel rail 1114. When the rollout tray 80 is in the retracted position as shown in FIG. 1, the channel rails 1110, 1112, and 1114 are retracted in telescoping relation such that all of the channel rails are positioned within interior of the housing 12. When the rollout tray 80 moves toward the extended position as shown in FIG. 2, the second channel rail 1112 first slides relative to the first channel rail 1110 in engagement therewith in the direction toward the extended position of the rollout tray 80 until it is fully extended relative to the first channel rail 1110. Then, the third channel rail 1114 slides along the second channel rail 1112 in the direction toward the extended position of the rollout tray 80. The third channel rail 1114 is fully extended from the second channel rail 1112 when the rollout tray 80 is in the extended position.

Referring to FIGS. 42 and 43, the exemplary first channel rail 1110 has in operative fixed engagement therewith first and second mounting tabs 1116, 1118. The exemplary tabs 1116, 1118 are made of generally rigid but deformable material such as sheet steel. As seen in FIG. 43, the exemplary first tab 1116 in the operative position extends generally vertically. That is, a lateral axis 1120 of the first tab 1116 is vertical. The first tab 1116 includes a proximal portion 1122 that extends outward relative to an outer side 1124 of the first channel rail 1110 in a direction transverse to the longitudinal axis 1126 of the first slide 1000. The exemplary first tab 1116 also includes a distal portion 1128 that extends from the proximal portion 1122 in a first direction. The first direction in the example embodiment is the same direction of movement as the rollout tray 80 moves from the extended position to the retracted position wherein the device is within the interior of the housing 12. The exemplary distal portion 1128 terminates in an end portion 1130. The end portion 1130 flares outwardly or angles away from the outer side 1124 of the first channel rail 1110 with increasing relative displacement in the first direction. The exemplary end portion 1130 allows the first tab 1116 to accommodate for acceptance in the gap bounded by the first tab, wall portions having somewhat different thicknesses.

As seen in FIG. 42, the exemplary second tab 1118 in the operative position is oriented generally horizontally. That is, the lateral axis 1134 of the second tab 1118 is horizontal. The second tab 1118 includes a proximal portion 1136 that extends outward relative to the outer side 1124 of the first channel rail 1110 in a direction transverse to the longitudinal axis 1126 of the first slide 1000. The second tab 1118 also includes a distal portion 1140 that in the operative position extends downwardly from the proximal portion 1136. The distal portion 1140 terminates at an end portion 1142. The exemplary end portion 1142 flares outwardly with increasing relative downward displacement, away from the outer side 1124 of the first channel rail 1110. The end portion 1142 bounds a gap that also allows the second tab 1118 to accommodate wall portions having somewhat different thickness.

Figure 47:
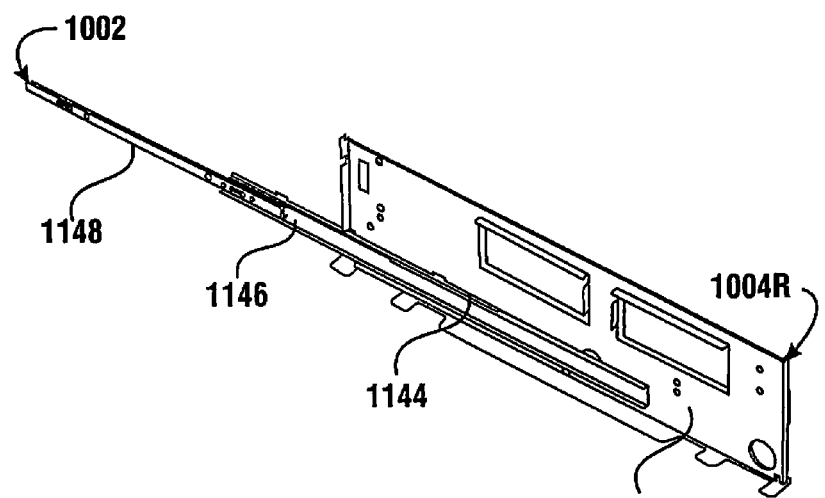
FIG. 47 is a front and left side isometric view of a portion of the exemplary automated banking machine of FIG. 46 illustrating the second slide mounted to the right bracket of the housing of the machine.
Figure 48:
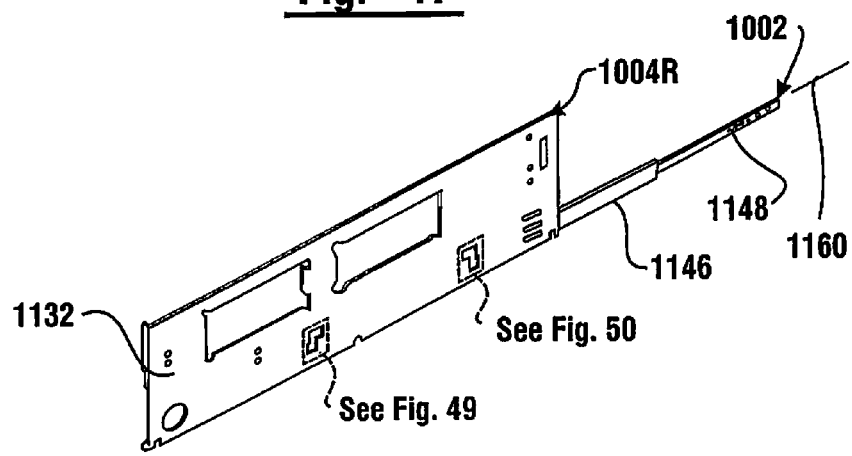
FIG. 48 is a front and right side isometric view of the portion of the exemplary automated banking machine of FIG. 47.

Referring to FIGS. 47 and 48, the exemplary second slide 1002 includes a first channel rail 1144 that slidably receives a second channel rail 1146. The second channel rail 1146 slidably receives a third channel rail 1148. When the rollout tray 80 is in the retracted position as shown in FIG. 2, the channel rails 1144, 1146, and 1148 are retracted in telescoping relation such that all of the rails are positioned within interior of the housing 12. When the rollout tray 80 moves toward the extended position as shown in FIGS. 47 and 48, the second channel rail 1146 first slides along in supported connection with first channel rail 1144 in the direction toward the extended position of the rollout tray 80 until it is fully extended from the third channel rail 1148. Then, the third channel rail 1148 slides along the second channel rail 1146 in the direction toward the extended position of the rollout tray 80. The third channel rail 1148 is fully extended from the second channel rail 1146 when the rollout tray 80 is in the extended position.

Referring to FIGS. 44 and 45, the exemplary first channel rail 1144 of the second slide 1002 is in operatively fixed engagement with first and second mounting tabs 1150, 1152. The tabs 1150, 1152 are made of generally rigid but deformable material such as sheet steel. Referring to the rear and left side isometric view of FIG. 44, the exemplary first tab 1150 is oriented generally vertically in the operative position. That is, the lateral axis 1154 of the first tab 1150 is vertical. The first tab 1150 includes a proximal portion 1156 that extends in a direction away from the outer side 1158 of the first channel rail 1144 in a direction transverse to the longitudinal axis 1160 of the second slide 1002. The exemplary first tab 1150 also includes a distal portion 1162 that extends from the proximal portion 1156 in a first direction and bounds a gap. The first direction is the same direction of movement of the rollout tray 80 from the extended position to the retracted position within the interior of the housing 12. The distal portion 1162 terminates into an end portion 1164. The exemplary end portion 1164 flares outwardly away from the outer side 1158 of the first channel rail 1144 with increasing distance in the first direction. The angled end portion 1164 allows the first tab 1150 to accommodate wall portions having different thicknesses.

Referring to the rear and left side isometric view of FIG. 45, the exemplary second tab 1152 is oriented generally horizontally in the operative position. That is, the lateral axis 1166 of the second tab 1152 is horizontal. The second tab 1152 includes a proximal portion 1168 that extends outwardly away from the outer side 1158 of the first channel rail 1144 in a direction transverse to the longitudinal axis 1160 of the second slide 1002. The second tab 1152 also includes a distal portion 1170 that extends downwardly from the proximal portion 1168 in the operative position. The distal portion 1170 terminates in an end portion 1172. The exemplary end portion 1172 flares outwardly and angles downwardly and away from the outer side 1158 of the first channel rail 1144. The end portion 1172 allows the gap bounded by the second tab to accommodate wall portions having somewhat different thickness.

The exemplary first slide 1000 is removably mounted to the right wall portion 1004R in a front-load configuration of the machine 10 in which the rollout tray 80 and device supported thereby moves forwardly through the front opening 22 of the housing 12 from the retracted position to the extended position. As represented in FIG. 43, when the first slide 1000 is operatively engaged with the right wall portion 1004R, the first tab 1116 extends in and engages the rear slot 1008. The proximal portion 1122 of the first tab 1116 extends in the lower leg 1036 portion of the rear slot 1008 and the distal portion 1128 extends rearwardly beyond the rear end 1050 of the lower leg. The gap bounded by distal portion 1128 engages an outer side surface 1132 of the right wall portion 1004R that underlies inner surface 1174 of the first tab 1116. In this position, an outer side surface 1124 of the first channel rail 1110 engages an inner side surface 1176 of the right wall portion 1004R. This arrangement provides firm yet releasable engagement of the slide and wall, and helps prevent horizontal movement transverse to the longitudinal axis 1126 of the first slide 1000. Also, the rear end 1050 of the slot engages the inner surface 1174 of the first tab 1116 to help prevent the first slide 1000 from moving further rearwardly. Bottom end 1178 of the first tab 1116 engages the bottom end 1052 of the lower leg portion 1036 to help prevent the first slide 1000 from moving downwardly. Also, in this position, the horizontal step surface 1056 (FIG. 39) of the step 1054 of the slot extends above top end 1180 of the first tab 1116. The step 1054 of the slot may be configured to be in close proximity to the top end 1180 or alternatively engage the top end 1180 of the tab to prevent the first tab 1116 from moving upwardly and thus prevent the first slide 1000 when in engaged relation from moving vertically relative to the wall portion. This feature may be especially useful because the extension of the rollout tray 80 out of the machine 10 in some arrangements tends to cause the end of the first slide 1000 furthest away from the opening of the housing 12 through which the tray is extended to move upwardly.

As seen in FIG. 42, in the example arrangement when the first slide 1000 is mounted in engaged relation with the right wall portion 1004R, the second tab 1118 is in engaged relation with the front slot 1006. In particular, the proximal portion 1136 of the second tab 1118 extends in the upper leg portion 1010 of the front slot 1006 and the distal portion 1140 of the second tab 1118 extends downwardly beyond the bottom end 1020 of the upper leg portion 1010. The gap bounded by distal portion 1140 accepts and engages the outer side surface 1132 of the right side wall portion 1004R at the inner surface 1182 of the second tab 1118. The tab may be deformed from its original position so that spring force is applied by the tab to hold the slide in the operative position relative to the wall. An outer side 1124 surface operatively associated with the first channel rail 1110 engages the inner side 1176 of the right wall portion 1004R. This arrangement helps prevent horizontal movement transverse to the longitudinal axis 1126 of the first slide 1000. Also, part of the horizontal surface 1022 of the bottom end 1020 engages the inner surface 1182 of the second tab 1118 to help prevent the first slide 1000 from moving downwardly. The second tab 1118 is also spaced forwardly from the rear end 1016 of the upper leg portion 1010, and spaced rearwardly from the front end 1024 of the lower leg 1012.

To install the exemplary first slide 1000 in engagement with to the right wall portion 1004R, the first tab 1116 is inserted through the rear slot 1008 and the second tab 1118 is inserted through the upper leg portion 1010 of the front slot 1006. The first slide 1000 is then moved downwardly until the second tab 1118 engages the horizontal surface 1022 of the bottom end 1020 of the upper leg portion 1010. Then, the first slide 1000 is moved rearwardly until the first tab 1116 engages the rear end 1050 of the lower leg portion 1036 of the rear slot 1008. This holds the slide in position where it is supported by bottom ends 1020 and 1052. Step 1054 prevents the inner end of the slide from moving vertically when the tray is extended. The configuration of the exemplary spring-like tabs hold the slide firmly engaged with the wall. To remove the first slide 1000 from engagement with the right wall portion 1004R, the first slide 1000 is moved forwardly until the step 1054 is not over the top end 1180 of the first tab 1116. Then, the first slide 1116 is moved upwardly and away from the right bracket 1004R to withdraw the tabs 1116, 1118 from their respective slots 1006, 1008.

The second slide 1002 is removably engaged with the left wall portion 1004L of a front loaded machine (FIG. 2) in which the rollout tray 80 moves forwardly through the front opening 22 of the housing 12 from the retracted position to the extended position. As seen in the rear and left side isometric view of FIG. 44, when the second slide 1002 is engaged with the left wall portion 1004L, the first tab 1150 extends in and engages the rear slot 1060. The proximal portion 1156 of the first tab extends through the lower leg portion 1088 of the rear slot 1060, and the distal portion 1162 extends rearwardly beyond the rear end 1102 (FIG. 40) of the lower leg portion 1088. The distal portion 1162 accepts the wall portion adjacent the slot in the gap bounded thereby and engages the outer side surface 1196 of the left wall portion 1004L at the inner surface 1188 of the first tab 1150. The outer side surface 1196 operatively connected to the first channel rail 1144 engages the inner side 1190 of the left wall portion 1004L. This arrangement helps prevent horizontal movement transverse to the longitudinal axis 1160 of the second slide 1002. Also, the rear end 1102 engages the inner surface 1188 of the first tab 1150 to prevent the second slide 1002 from moving rearwardly. Bottom end 1192 of the first tab 1150 engages the bottom end 1104 of the lower leg portion 1088 to help prevent the second slide 1002 from moving downwardly. Also, in this position, the horizontal surface 1108 of the step 1106 extends over top end 1194 of the first tab 1150. This step 1106 may be in close proximity to the top end 1194 or alternatively engage the top end 1194 to prevent the first tab 1150 from moving upwardly and thus prevent the second slide 1002 from moving upwardly. This feature may be useful because the extension of the rollout tray 80 out of the machine 10 tends to cause the end of the second slide portion 1002 furthest away from the opening to the interior of the housing 12, to move upwardly.

As seen in FIG. 45, when the second slide 1002 is mounted to the left wall portion 1004L, the second tab 1152 extends in the front slot 1058. The proximal portion 1168 of the second tab 1152 extends through the upper leg portion 1062 of the front slot 1058 and the distal portion 1170 of the second tab 1152 extends downwardly beyond the bottom end 1072 of the upper leg portion 1062. The distal portion 1170 accepts a portion of the wall adjacent the slot into the gap and engages the outer side surface 1196 of the left wall portion 1004L at the inner surface 1198 of the second tab 1152. The outer side surface 1158 in operative connection with the first channel rail 1144, engages the inner side surface 1190 of the left wall portion 1004L. This arrangement helps prevent horizontal movement transverse to the longitudinal axis of the second slide 1002. Also, part of the horizontal surface 1074 of the bottom end 1072 engages the second tab 1152 to help prevent the second slide 1002 from moving downwardly. The second tab 1152 is also spaced forwardly from the rear end 1068 of the upper leg 1062, and spaced rearwardly from the front end 1076 of the lower leg 1064.

To install the second slide 1002 in engagement with the left wall portion 1004L, the first tab 1150 is extended in the rear slot 1060 and the second tab 1152 is extended in the upper leg portion 1062 of the front slot 1058. The second slide 1002 is the moved downwardly until the inner surface 1198 of second tab 1152 engages the horizontal surface 1074 of the bottom end 1072 of the upper leg portion 1062. Then, the second slide 1002 is moved rearwardly until the second tab 1152 engages the rear end 1102 of the lower leg portion 1088 of the rear slot 1060. The second slide is held in firm fixed releasable engagement with the wall portion. To remove the second slide 1002 from engagement with the left wall portion 1004L, the second slide 1002 is moved forwardly until the step 1106 is not over the top end 1194 of the first tab 1150. Then, the second slide 1002 is moved upwardly and away from the left wall portion 1004L to withdraw the tabs 1150, 1152 from their respective slots 1060, 1058.

The second slide 1002 is removably mounted to the right wall portion 1004R (as best depicted in FIGS. 47 and 48) in a rear load configuration of the machine or a machine in which the rollout tray 80 moves rearwardly through a rear opening 1195 of the housing 12 from the retracted position to the extended position as represented in FIG. 46. As shown in FIG. 49, when the second slide 1002 is mounted to the right wall portion 1004R, the first tab 1150 engages the front slot 1006. In particular, the proximal portion 1156 of the first tab 1150 extends in the lower leg portion 1012 of the front slot 1006 and the distill portion 1162 extends forwardly beyond the front end 1024 of the lower leg portion 1012 such that the wall portion adjacent the slot extends in the gap bounded by the tab. The distal portion 1162 engages the outer side surface 1133 of the right wall portion 1004R at the inner surface 1188 of the first tab 1150, and the outer side 1158 of the first channel rail 1144 engages the inner side 1176 (FIG. 47) of the right wall portion 1004R. This arrangement helps prevent horizontal movement transverse to the longitudinal axis 1160 of the second slide 1002. Also, the front end 1024 engages the inner surface 1188 of the first tab 1150 to help prevent the second slide 1002 from moving forward relative to the wall portion. The bottom end 1192 of the first tab 1150 engages the bottom end 1028 of the lower leg portion 1012 to help prevent the second slide 1002 from moving downwardly. Also, in this position, the horizontal step surface 1032 of the step 1030 extends over the top end 1194 of the first tab 1150. This step 1030 may be in close proximity to the top end 1194 or alternatively may engage the top end 1194 to prevent the first tab 1150 from moving upwardly and thus prevent the second slide 1002 from moving, vertically. This feature is especially useful because the extension of the rollout tray 80 out of the machine tends to cause the end of the second slide 1002 furthest away from the opening to the interior of the housing 12 through which the tray is extended to move upwardly.

As seen in FIG. 50, when the second slide 1002 is mounted to the right wall pardon 1004R, the second tab 1152 engages the rear slot 1008. In particular, the proximal portion 1168 of the second tab 1152 extends through the upper leg portion 1034 of the rear slot 1008 and the distal portion 1170 of the second tab 1152 extends downwardly beyond the bottom end 1044 of the upper leg portion 1034 such that the wall portion adjacent the slot extends in the gap bounded by the tab. The distal portion 1179 engages the outer side surface 1132 of the right wall portion 1004R at the inner surface 1198 of the second tab 1152, and the outer side surface 1158 in operative connection with the first channel rail 1144 engages the inner side 1176 (FIG. 47) of the right wall portion 1004R. This exemplary arrangement helps prevent horizontal movement transverse to the longitudinal axis 1160 of the second slide 1002. Also, part of the horizontal surface 1046 of the bottom end 1044 engages the inside surface of the second tab 1152 to help prevent the second slide 1002 from moving downwardly. The exemplary second tab 1152 is also spaced forwardly from the front end 1038 of the upper leg portion 1034, and spaced rearwardly from the rear end 1050 of the lower leg portion 1036.

To engage the second slide 1002 to the right wall portion 1004R, the first tab 1150 is extended through the front slot 1006 and the second tab 1152 is extended through the upper leg portion 1034 of the rear slot 1008. The second slide 1002 is then moved downwardly until the second tab 1152 engages the horizontal surface 1046 of the bottom end 1044 of the upper leg portion 1034. Then, in the exemplary method the second slide 1002 is moved forwardly until the first tab 1150 engages the front end 1024 of the lower leg portion 1012 of the front slot 1006. The slide is thus held in engaged relation with the wall portion. To remove the second slide 1002 from engagement with the right wall portion 1004R, the second slide 1002 is moved rearwardly until the step 1030 is not in overlying relation to the top end 1194 of the first tab 1150. Then, the second slide 1002 is moved upwardly and away from the right wall portion 1004R to withdraw the tabs 1150, 1152 from their respective slots 1006, 1008.

The first slide 1000 is removably mounted to the left wall portion 1004L of a rear load machine or in configuration of the machine 10 in which the rollout tray 80 moves outwardly through the rear opening 1195 of the housing 12 from the retracted position to the extended position (FIG. 46). As seen in the rear and left side isometric view of FIG. 52, when the first slide 1000 is mounted on the left wall portion 1004L, the first tab 1116 extends in the front slot 1058. In particular, the proximal portion 1122 of the first tab 1116 extends through the lower leg portion 1064 of the front slot 1058 and the distal portion 1128 extends forwardly beyond the front end 1076 of the lower leg portion 1064 such that the wall adjacent the slot extends in the gap bounded by the tab. The distal portion 1128 engages the outer side surface 1196 of the left wall portion 1004L at the inner surface 1174 of the first tab 1116, and the outer side surface 1124 in operative connection with first channel rail 1110 engages the inner side 1190 of the left wall portion 1004L. This arrangement helps prevent horizontal movement transverse to the longitudinal axis 1126 of the first slide 1000. Also, the front end 1076 engages the inner surface 1174 of the first tab 1116 to help prevent the first slide 1000 from moving forwardly. The bottom end 1178 of the first tab 1116 engages the bottom end 1179 of the lower leg portion 1064 to help prevent the first slide 1000 from moving downwardly. Also, in this position, the horizontal step surface 1082 of the step 1080 extends in overlying relation of the top end 1180 of the first tab 1116. The step 1080 may be in close proximity to the top end 1180 or alternatively may engage the top end 1180 to prevent the first tab 1116 from moving upwardly and thus prevent the first slide 1000 from moving vertically. This feature is useful because the extension of the rollout tray 80 out of the machine tends to cause the end of the first slide 1000 furthest away from the opening of the housing 12 through which the tray is extended to move upwardly.

Figure 51:
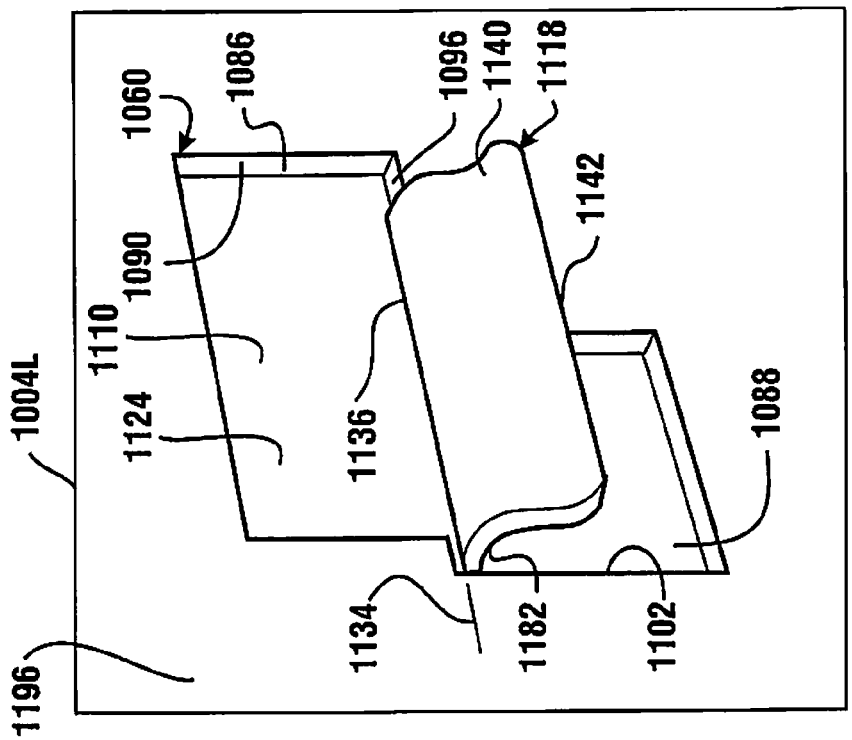
FIGS. 51 and 52 are rear and left side isometric views of portions of the left bracket with the first slide mounted thereto of the exemplary automated banking machine of FIG. 46.
Figure 52:
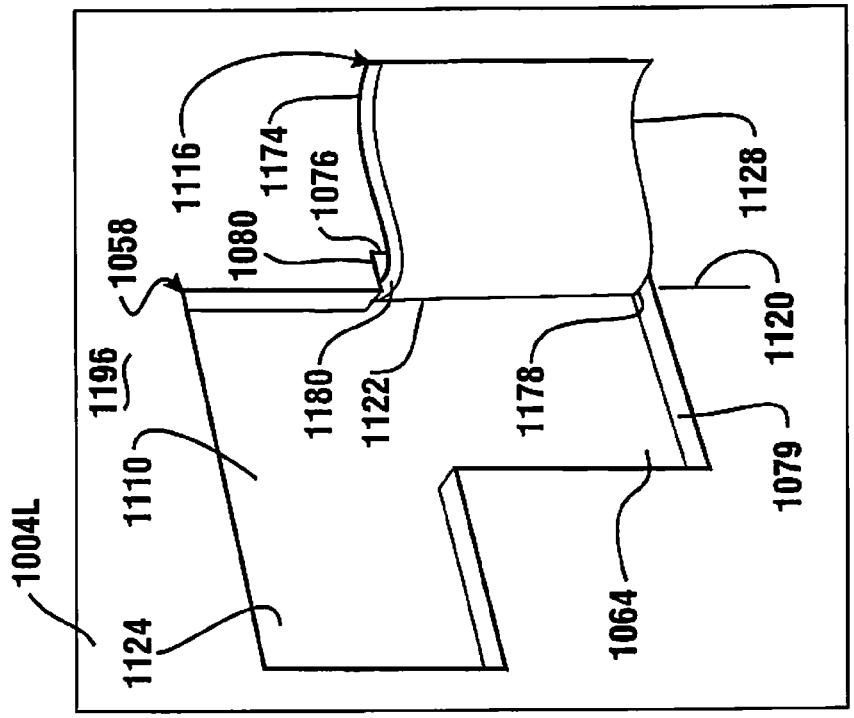

As seen in the rear and left side isometric view of FIG. 51, when the first slide 1000 is engaged with the left wall portion 1004L, the second tab 1118 extends in the rear slot 1060. In particular, the proximal portion 1136 of the second tab 1118 extends through the upper leg portion 1086 of the rear slot 1060 and the distal portion 1140 of the second tab 1118 extends downwardly beyond the bottom end 1096 of the upper leg portion 1086 so as to hold an area of the wall adjacent the slot in the gap bounded by the tab. The distal portion 1140 engages the outer side surface 1196 of the left wall portion 1004L at the inner surface 1182 of the second tab 1118, and the outer side surface 1124 in operative connection with the first channel rail 1110 engages the inner side surface 1190 of the left bracket 1004L. This arrangement helps prevent horizontal movement transverse to the longitudinal axis 1126 of the first slide 1000. Also, part of the horizontal surface 1098 of the bottom end 1096 engages the inner surface 1182 of the second tab 1118 to help prevent the first slide 1000 from moving downwardly. The second tab 1118 is also spaced rearwardly from the front end 1090 of the upper leg portion 1086, and spaced forwardly from the rear end 1102 of the lower leg portion 1088.

To engage the first exemplary slide 1000 and the left wall portion 1004L, the first tab 1116 is extended in the front slot 1058 and the second tab 1118 is extended in the upper leg portion 1086 of the rear slot 1060. In an exemplary method, the first slide 1000 is moved downwardly until the second tab 1118 engages the horizontal surface 1098 of the bottom end 1096 of the upper leg portion 1086. Then, the first slide 1000 is moved forwardly until the first tab 1116 engages the front end 1076 of the lower leg portion 1064 of the front slot 1058. The first slide is thus held in operative engagement with the wall through the action of the tabs. To remove the first slide 1000 from the left wall portion 1004L, the first slide 1000 is moved rearwardly until the step 1080 is not in overlying relation of the top end 1180 of the first tab 1116. Then, the first slide 1000 is moved upwardly and away from the left wall portion 1004L to withdraw the tabs 1116, 1118 from their respective slots 1058, 1060. The exemplary tabs 1116, 1118, 1150, and 1152 are configured such that the gaps bounded thereby are in close tolerance with the thickness of their associated wall portions, and once engaged the exemplary tabs utilize the resilient properties of the exemplary material to provide a spring type clamping force on the area of the wall in the gap which tends to hold the associated slide in engagement with the bracket.

Alternatively, the first slide may be configured to be removably mounted to the right wall portion and the second slide may be removably mounted to the left wall portion in both the front load and rear load configurations. In this arrangement, the first slide may include first and second tabs that engage rear and front slots, respectively, of the right wall portion in the front load configuration. In the rear load configuration, the first and second tabs of the first slide engage the front and rear slots, respectively, of the right wall portion. In this arrangement, the second slide may include first and second tabs that engage rear and front slots, respectively, of the left wall portion in the front load configuration. In the rear loaded configuration, the first and second tabs of the second slide engage the front and rear slots, respectively, of the left wall portion.

In the exemplary embodiment, the slots are configured to be generally mirror images of one another. This facilitates the configuration of the automated banking machine such that the slides and the device supporting rollout tray which is attached thereto can be readily configured such that the tray can be extended from an opening at the front of the housing or alternatively from the rear of the housing. However, it should be understood that in other example embodiments the principles discussed herein may be applied to slots that are not mirror image or symmetric configurations. In addition, in the exemplary embodiment the slots are formed in the wall portions, while the tabs are in operatively fixed connection with the slides. In other exemplary embodiments, this configuration may be changed. For example, in some example embodiments the slots may in operatively fixed connection with the slides, and the tabs may be in operatively fixed connection with the wall portions. Alternatively in other embodiments, a tab and slot may be associated with a single slide, while an engagingly configured slot and tab may be in operatively fixed connection with the adjacent wall portion. Further, it should be understood that while in the exemplary embodiment each slide includes two contact points, including interengaging tabs and slots which hold the respective slide in engagement with a wall portion, in other embodiments other arrangements may be used. This may include for example a single interengaging tab and slot for each slide. This might be used for example where the tray or slide structure is supported within the machine by other structures. This might include for example a bracket which supports the slides in an area away from the interengaging tab and slots. Similarly in other alternative embodiments, each slide may include more than two interengaging tab and slot arrangements. As can be appreciated, numerous configurations may be achieved using the principles described herein.

Further, while the exemplary embodiment has discussed the use of two slides disposed from one another that support a tray that can be extended from the machine, other embodiments may use other configurations. This might include for example a single slide which is sufficient to hold a tray which can be extended out of the machine. Further in other embodiments, trays may include two or more vertically disposed slides engaged with a wall portion. A tray operative to hold a transaction function device may be engaged with both of the vertically disposed slides which are attached to generally the same wall. This will enable the tray and the associated device to be extended out of an opening from the machine.

In the exemplary embodiment described, the configuration of the tabs and slots are such that the slides may be attached to the wall portions by engaging the tabs in the slots and moving the slide so as to position the tabs in the desired position relative to the slots. Because of the engaging force of the exemplary tabs holding the wall portion adjacent to the slots in the gap formed by the tabs, there may be no need to have any additional fasteners or other devices for holding the tabs in engagement with the wall portion. However, in some embodiments it may be desirable to have such fasteners. Such fasteners may have various forms. For example in some embodiments a surface associated with a slide may include an aperture which can accept a fastener so as to engage the respective slide in engagement with the side wall. One or more such fasteners may prevent the slide from moving relative to the side wall, so as to prevent disengagement of the slide and tray therefrom. Alternatively in some embodiments, a spring loaded plunger type structure may be used to engage an aperture either in the slide or the side wall. Engagement of a plunger in the aperture may likewise prevent relative movement of the slide unless the plunger has been retracted from engagement with the aperture. Alternatively and/or in addition, projections in operative connection with either the slide or side wall may engage corresponding openings or apertures in the opposite structure in a manner that prevents relative movement of the slide so as to cause the slide to disengage. Again in this case, the projection may be movable so as to disengage and allow the slide to be move. Numerous different releasable fastening arrangements may be applied, holding the slides in engagement with the walls in various embodiments.

Of course it should be understood that while in the exemplary embodiments the slide and tray structures discussed have been used in connection with supporting devices from vertically extending side walls, the principles described herein may also be utilized in connection with supporting structures from horizontally or other types of walls within an automated banking machine. For example, one or more slides may be utilized to support a tray structure associated with a device in operatively supported connection with a horizontally extending top wall of the chest. This might include for example a processor or other device which is positioned within an upper portion of the housing. Alternatively and/or in addition, one or more such structures may be utilized in connection with supporting a device in movably mounted connection with a horizontal structure at the top, bottom or intermediate portion of the housing. In addition it should be understood that while exemplary structures have a generally fixed base of a slide structure in connection with a wall of a machine, other arrangements may associate the base of the slide structure with the tray or device housing so that the base of the slide is movable with the tray and the device. Further it should be understood that while movable tray structures and supporting devices may be often used in an upper housing portion of an automated banking machine, such structures may also be utilized within the chest portion of a machine.

As can be appreciated, an advantage of exemplary embodiments may include the ability to use a common housing structure for both front load and rear load automated banking machines. This may facilitate assembly in a factory environment, such that assembly line workers may engage the slides in connection with the slots and position the slides appropriately so as to firmly hold the slides in engagement with the walls or other supporting structures. The trays supporting the devices can then be engaged with the slides so as to facilitate extending the devices outward through an opening from the housing as is appropriate from the machine. For example, in the front load machine the slides individually or as part of a tray assembly may be moved to extend tabs into the slots in the manner previously described, with the tabs positioned relative to the slots so as to achieve a firm engagement between the tabs, the slides, and the walls of the enclosure. In exemplary embodiments the symmetrical configuration will enable construction of the machine so as to allow the tray to be extended from either an opening on the front of the housing or an opening on the back of the housing, as may be appropriate for the particular machine. In some situations, housing might have openings at both the front and the back. As can be appreciated for example, a similar housing may be used for a front load machine where a fascia associated with the user interface is movably mounted relative to the machine. One or more trays to support devices within the machine may be movably mounted so as to extend through the front opening of the housing. Likewise, a rear load machine may include a fascia that is in fixed relation to the front of the housing. The housing may include a door controlled by a lock. The door may be opened from the rear of the housing. In such a rear load configuration, trays can be extended through the rear opening of the housing when the access door is open. In still other embodiments, the fascia may be movable away from the housing, for example supported on tray structures like those described in the exemplary embodiment. The rear of the housing may also have a door which can be opened. In such configurations, trays may be configured to be extendable from either the front opening or the rear opening. Of course these approaches are exemplary, and in other embodiments other approaches may be used.

Also, sometimes after a machine has been deployed, it may be desirable to change devices that are utilized in the machine. This may include for example adding devices to the machine that were not originally included at the time of manufacture. This might include for example adding a device that can accept and image checks. It may alternatively include for example adding a device that can both accept and dispense currency bills. Alternatively, a change in devices may include adding a coin dispenser, a passbook printer, or other devices not originally present in the machine. Alternatively, such modifications may involve removing a device that was installed at the time of manufacture, and replacing it with a different device.

The principles described may be applied in such circumstances to facilitate the reconfiguration of such machines in the field. This may be done by including slot structures in the wall portions at appropriate positions for many different types of configurations of devices that might be possible for a given housing structure. For example, although the machine may not be originally manufactured to include a check acceptor, slots may be included in the wall portions to support slides which support a check acceptor should one need to be installed in the future. By anticipating the range of different devices that may be installed within the machine, a field service technician may readily move existing slide and tray structures which support different types of devices, and relocate and install different ones as appropriate. Thus the time and effort associated with installing new devices and/or reconfiguring the machine to remove and include different devices may be reduced. Numerous different approaches and benefits may be achieved using the principles described herein.

Thus the automated banking machines and systems of the exemplary embodiments may achieve one or more of the above stated objectives, eliminate difficulties encountered in the use of prior devices and systems, solve problems and attain the desirable results described herein.

In the foregoing description certain terms have been used for brevity, clarity and understanding, however no unnecessary limitations are to be implied therefrom because such terms are for descriptive purposes and are intended to be broadly construed. Moreover, the descriptions and illustrations herein are by way of examples and the invention is not limited to the details shown and described.

In the following claims any feature described as a means for performing a function shall be construed as encompassing any means capable of performing the recited function, and shall not be deemed limited to the particular means shown in the foregoing description or mere equivalents thereof.

Having described the features, discoveries and principles of the invention, the manner in which it is constructed and operated, and the advantages and useful results attained; the new and useful structures, devices, elements, arrangements, parts, combinations, systems, equipment, operations, methods, processes and relationships are set forth in the appended claims.

We claim:

1. An automated banking machine comprising:
   a transaction function device located in the housing;
   a rollout tray connected to the housing and located in a first position in the housing, the rollout tray at least partially supporting the transaction function device;
   at least one slide connected to the housing and connected to the rollout tray, the at least one slide releasably connected to the housing by engagement of at least one tab and at least one slot, the at least one slide moveable relative to the housing and through the at least one opening in the housing between the first position wherein the rollout tray is located in the housing and a second position wherein the rollout tray is located at least partially outside of the housing wherein the rollout try is movable along a longitudinal direction between the first position and the second position, and wherein the at least one tab and at least one slot are engageable and disengageable responsive to relative movement of the tab and slot generally along the longitudinal direction:

wherein one of the housing and a slide is in operatively fixed connection with a first tab and the other of the housing and a slide is in operatively fixed connection with a first slot, wherein the first tab and the first slot are releasably engageable, and wherein the slide is mountable in releasable engagement with the housing in a first configuration and in a second configuration, wherein in the first configuration the rollout tray is movable between the first and second positions such that the device extends through a first opening at a first side of the housing, and wherein in the second configuration the rollout tray is movable between the first and second positions such that the device extends through a second opening at a second side of the housing opposed of the first side.

2. The apparatus according to claim 1
wherein one of the housing and the slide is in operatively fixed connection with the second tab and the other housing and the slide is operatively fixed connection with the second slot,
wherein the second tab and the second slot are releasably engageable, and wherein the first tab in the first slot and the second tab in the second slot are respectively engageably configured to hold the slide in operative engagement with the housing in the first configuration, and
wherein the first tab in the second slot and the second tab in the first slot are selectively engageably configured to hold the slide in operative engagement with the housing in the second configuration.

3. The apparatus according to claim 2, wherein the slide is configured to be engaged with the housing and disengaged from the housing without the use of tools.

4. The apparatus according to claim 2
wherein the first slot includes an end bounding the first slot, wherein the end hounding the first slot extends generally transverse to a first direction, wherein the first direction generally corresponds to the directions of movement of the rollout tray between the first and second positions,
wherein with the slide mounted in the first configuration, the first tab is engaged with the end bounding the first slot, and wherein the end bounding the first slot is operative to prevent movement of the slide in a second direction, wherein the second direction generally corresponds to movement of the rollout tray in the first configuration of the slide from the first position toward the second position.

5. The apparatus according to claim 4, wherein the first slot includes a step portion hounding the first slot, wherein with the slide mounted in the first configuration, the step portion bounding the first slot is engageable with the first tab to prevent the first tab from moving transverse of the first direction in the first slot.

6. The apparatus according to claim 5, wherein with the slide mounted in the first configuration, the step portion is operative to prevent the first tab from moving upwardly relative to the first slot.

7. The apparatus according to claim 5
wherein the second slot includes an end bounding the second slot, wherein the end bounding the second slot extends generally transverse to the first direction,
wherein with the slide mounted in the second configuration, the first tab is engaged with the end bounding the second slot, wherein the end bounding the second slot is operative to prevent movement of the slide in a third direction, wherein the third direction corresponds to movement of the rollout tray in the second configuration of the slide, from the second position toward the first position.

8. The apparatus according to claim 7, wherein the second slot includes a step portion bounding the second slot, wherein with the slide mounted in the second configuration, the step portion bounding the second slot is engaged with the first tab to prevent the first tab from moving transverse of the first direction.

9. The apparatus according to claim 8, wherein with the slide mounted in the second configuration, the step portion of the second slot is operative to prevent the first tab from moving upwardly relative to the second slot.

10. The apparatus according to claim 4
wherein the housing includes a wall portion, and wherein the wall portion includes the first slot,
wherein the first tab includes a proximal portion and a distal portion, wherein in the engaged condition of the slide and the housing, the proximal portion extends in the first slot and the distal portion is operative to extend in the second direction beyond the first slot and engages the wall portion.

11. The apparatus according to claim 10
wherein one of the housing and the slide is in operatively fixed connection with a second tab, and the other of the housing and the slide is in operatively fixed connection with a second slot,
wherein the second tab includes a proximal portion and a distal portion, wherein in the engaged condition of the slide and the housing, the proximal portion of the second tab extends in the second slot in generally the fist direction and the distal portion of the second tab extends in a third direction transverse to the first direction.

12. The apparatus according to claim 11, wherein the second tab is in operatively fixed connection with the slide and the second slot extends in the first wall portion,
and wherein the distal portion of the second tab engages the wall portion.

13. The apparatus according to claim 12, wherein the distal portion of the first tab bounds a first gap, and wherein in the engaged position of the housing and the slide, the wall portion extends in the first gap.

14. The apparatus according to claim 13, wherein the distal portion of the second tab bounds a second gap, wherein in the engaged position of the slide and the housing, the first wall portion extends in the second gap.

15. The apparatus according to claim 14, wherein the slide and the housing are changeable between a mounted engaged position and a disengaged position responsive at least in part to relative movement in the first direction of the slide and the housing.

16. The apparatus according to claim 12
wherein the housing includes a second wall portion, wherein the second wall portion is disposed from and generally parallel to the wall portion,
and further including another slide, wherein the another slide is in operative connection with the rollout tray, and wherein the another slide is in operatively fixed connection with a third tab and a fourth tab,
wherein the second wall portion includes a third slot and a fourth slot, and wherein the third tab and the third slot and the fourth tab and the fourth slot are configured to respectively engage each other to releasably mount the another slide in operative engagement with the housing when the first slide is in the first configuration, and wherein the third tab and the fourth slot and the fourth tab and the third slot are configured to engage each other to mount the another slide in operative engagement with the housing when the first slide is in the second configuration.

17. The apparatus according to claim 16, wherein the housing includes a chest portion and wherein the wall portion and the second wall portion extend above the chest portion, and wherein the chest portion includes at least a portion of a cash dispenser positioned therein.

* * * * *